US010752449B2

(12) United States Patent
Aoki et al.

(10) Patent No.: US 10,752,449 B2
(45) Date of Patent: Aug. 25, 2020

(54) OBJECT CARRIER DEVICE, EXPOSURE APPARATUS, MANUFACTURING METHOD OF FLAT-PANEL DISPLAY, DEVICE MANUFACTURING METHOD, OBJECT CARRYING METHOD, AND EXPOSURE METHOD

(71) Applicant: NIKON CORPORATION, Tokyo (JP)

(72) Inventors: Yasuo Aoki, Zushi (JP); Masayuki Nagashima, Yokohama (JP); Takahiro Yamanaka, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/563,310

(22) PCT Filed: Mar. 30, 2016

(86) PCT No.: PCT/JP2016/060358
§ 371 (c)(1),
(2) Date: Sep. 29, 2017

(87) PCT Pub. No.: WO2016/159062
PCT Pub. Date: Oct. 6, 2016

(65) Prior Publication Data
US 2018/0065816 A1 Mar. 8, 2018

(30) Foreign Application Priority Data
Mar. 30, 2015 (JP) ................. 2015-069015

(51) Int. Cl.
H01L 21/687 (2006.01)
G03F 7/20 (2006.01)
(Continued)

(52) U.S. Cl.
CPC .......... B65G 49/06 (2013.01); B65G 49/061 (2013.01); B65G 49/064 (2013.01);
(Continued)

(58) Field of Classification Search
CPC . G03F 7/20; G03F 7/0005; G03F 7/70; B65G 2249/045; B65G 49/06;
(Continued)

(56) References Cited

U.S. PATENT DOCUMENTS 5,439,341 A * 8/1995 Yamazaki ................ B23Q 1/38
414/676
5,729,331 A 3/1998 Tanaka et al.
(Continued)

FOREIGN PATENT DOCUMENTS

JP 2011-014784 A 1/2011

OTHER PUBLICATIONS

Jun. 21, 2016 International Search Report issued in International Patent Application No. PCT/JP2016/060358.
(Continued)

Primary Examiner — Deoram Persaud
(74) Attorney, Agent, or Firm — Oliff PLC

(57) ABSTRACT

A carrying method of carrying a substrate with a substrate holder, including: holding a part of the substrate located above the substrate holder using holding pads; controlling and driving downward the holding pads holding the substrate so that the substrate is supported on the support surface of the substrate holder, when releasing the hold of an other part of the substrate by a substrate carry-in hand that holds the other part of the substrate located above the substrate holder. Accordingly, the substrate carriage to the substrate holder can be swiftly performed.

50 Claims, 28 Drawing Sheets

(51) Int. Cl.
*B65G 49/06* (2006.01)
*G03F 7/00* (2006.01)
*G02F 1/13* (2006.01)
*H01L 21/64* (2006.01)
*H01L 21/677* (2006.01)

(52) U.S. Cl.
CPC ......... *B65G 49/065* (2013.01); *B65G 49/067* (2013.01); *G02F 1/13* (2013.01); *G03F 7/0005* (2013.01); *G03F 7/20* (2013.01); *G03F 7/70* (2013.01); *H01L 21/64* (2013.01); *H01L 21/67703* (2013.01); *H01L 21/68707* (2013.01); *H01L 21/68728* (2013.01); *H01L 21/68742* (2013.01); *B65G 2249/045* (2013.01)

(58) Field of Classification Search
CPC .. B65G 49/061; B65G 49/064; B65G 49/065; B65G 49/067; G02F 1/13; H01L 21/64; H01L 21/67703; H01L 21/68707; H01L 21/68728; H01L 21/68742
See application file for complete search history.

(56) References Cited

U.S. PATENT DOCUMENTS

| | | | |
|---|---|---|---|
| 6,552,775 B1 | 4/2003 | Yanagihara et al. | |
| 6,559,928 B1* | 5/2003 | Aoki | G03F 7/20 355/72 |
| 6,746,198 B2* | 6/2004 | White | C03B 29/08 414/222.13 |
| 7,656,506 B2* | 2/2010 | Jacobs | G03F 7/70691 355/53 |
| 7,878,213 B2* | 2/2011 | Mitsuyoshi | B65G 49/061 134/133 |
| 7,905,195 B2* | 3/2011 | Yamasaki | H01L 21/67784 118/300 |
| 7,918,939 B2* | 4/2011 | Fukuoka | B65G 49/061 118/719 |
| 7,976,261 B2* | 7/2011 | Snodgrass | B65G 49/061 198/604 |
| 8,550,765 B2* | 10/2013 | Cottone | B65G 49/061 414/744.3 |
| 8,699,001 B2* | 4/2014 | Aoki | G03F 1/82 355/72 |
| 9,051,128 B2* | 6/2015 | Guo | B65G 49/064 |
| 9,087,865 B2* | 7/2015 | Liu | H01L 21/67736 |
| 9,087,866 B2* | 7/2015 | Jheong | B65G 65/00 |
| 10,529,610 B2* | 1/2020 | Liang | B65G 49/065 |
| 2005/0040338 A1* | 2/2005 | Weiss | B65G 49/061 250/358.1 |
| 2006/0284434 A1* | 12/2006 | Yang | B65G 49/061 294/119.1 |
| 2010/0034624 A1* | 2/2010 | Kishimoto | H01L 21/67748 414/225.01 |
| 2011/0042874 A1* | 2/2011 | Aoki | H01L 21/6838 269/20 |
| 2011/0053092 A1* | 3/2011 | Aoki | B65G 49/065 430/319 |
| 2012/0056105 A1* | 3/2012 | Aoki | G03F 7/70716 250/491.1 |
| 2012/0064460 A1* | 3/2012 | Aoki | G03F 7/709 430/320 |
| 2012/0064461 A1* | 3/2012 | Aoki | G03F 7/7075 430/320 |
| 2018/0067397 A1* | 3/2018 | Aoki | G03F 7/2037 |
| 2019/0049856 A1* | 2/2019 | Aoki | G03F 7/70716 |
| 2019/0377271 A1* | 12/2019 | Aoki | G03F 7/22 |
| 2020/0019071 A1* | 1/2020 | Aoki | H01L 21/68 |

OTHER PUBLICATIONS

Jun. 21, 2016 Written Opinion issued in International Patent Application No. PCT/JP2016/060358.

* cited by examiner

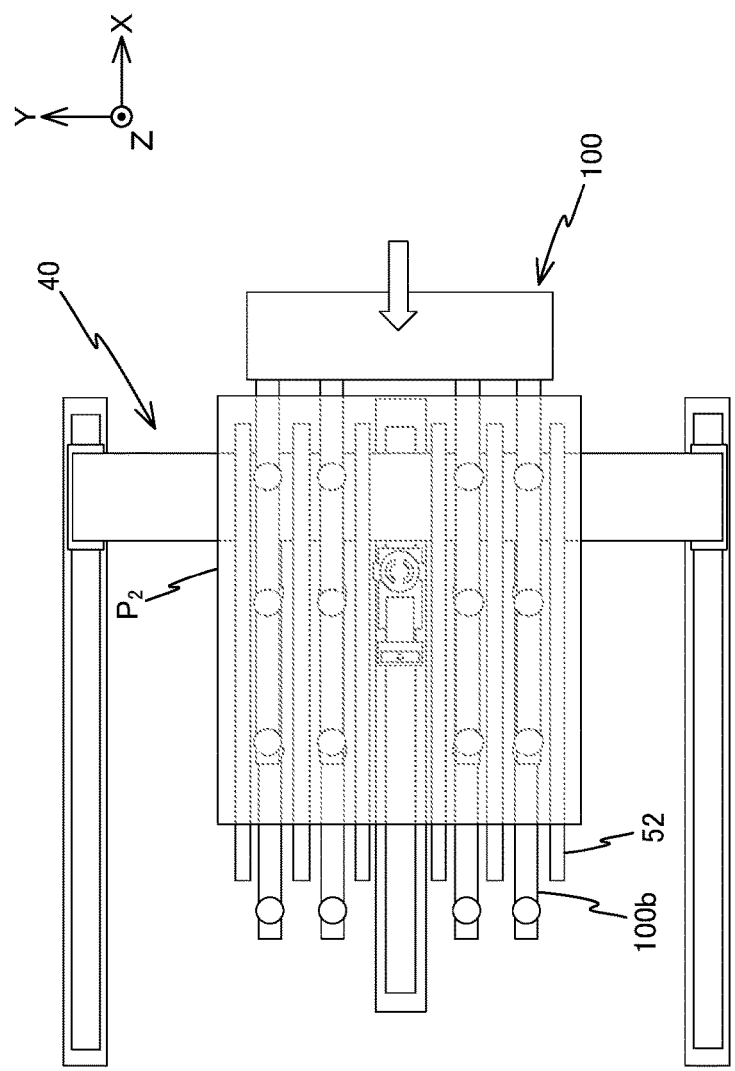
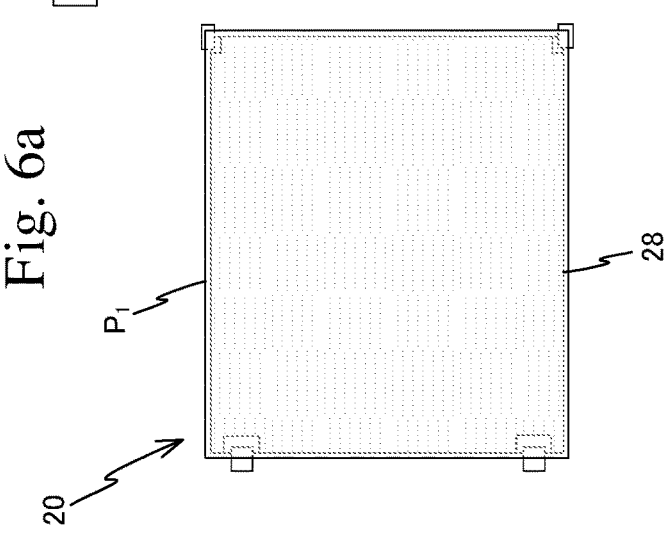
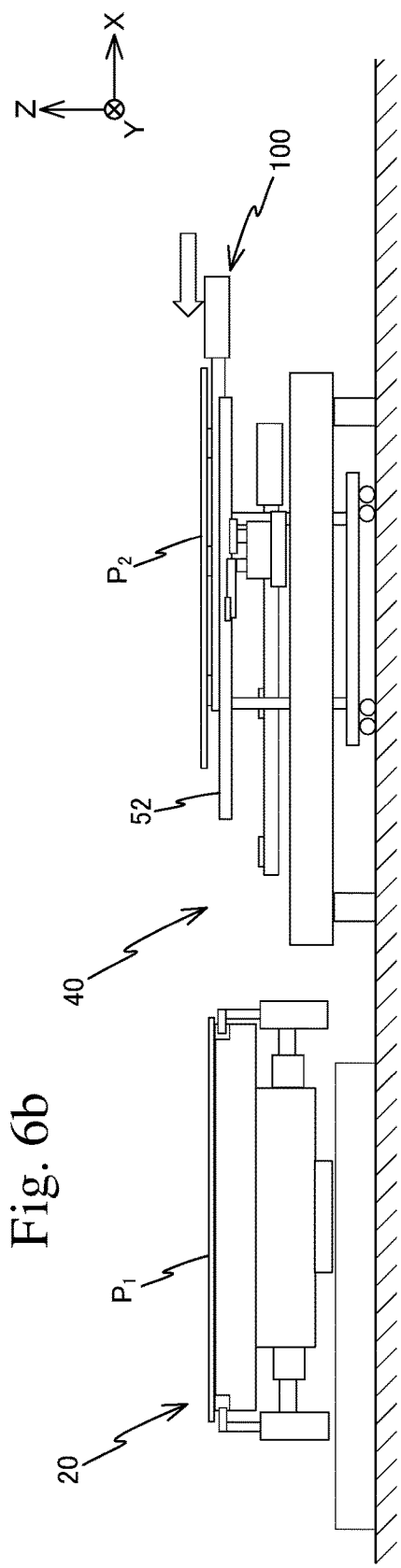
Fig. 6a
Fig. 6b

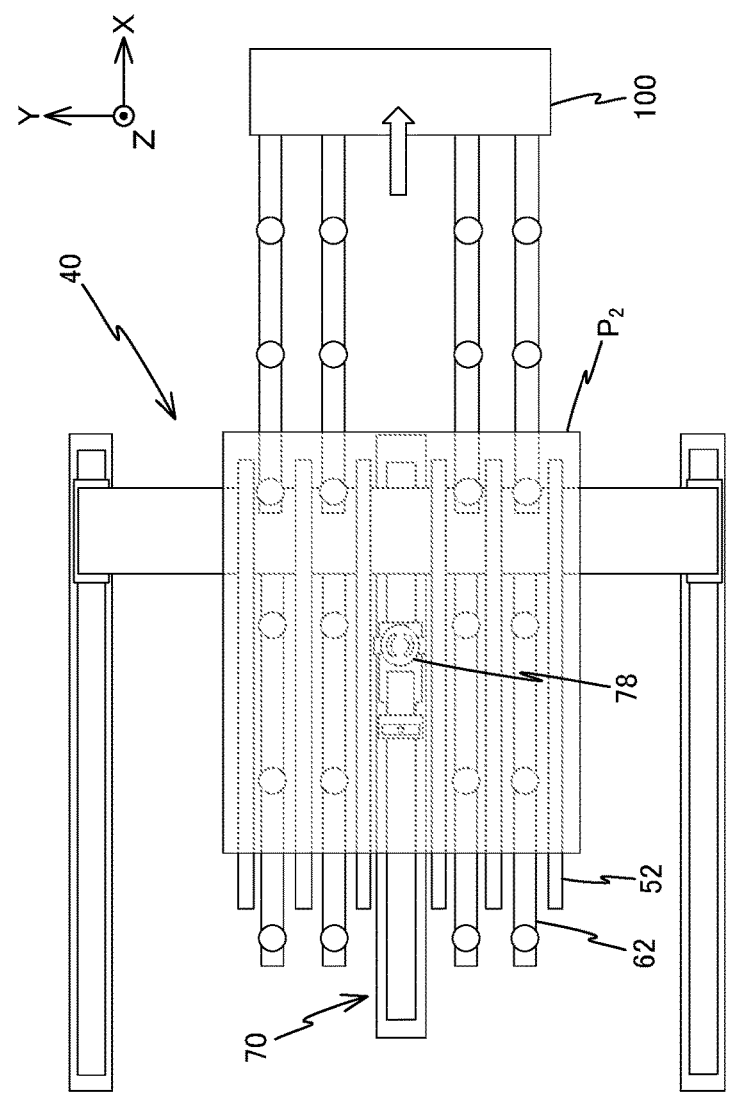
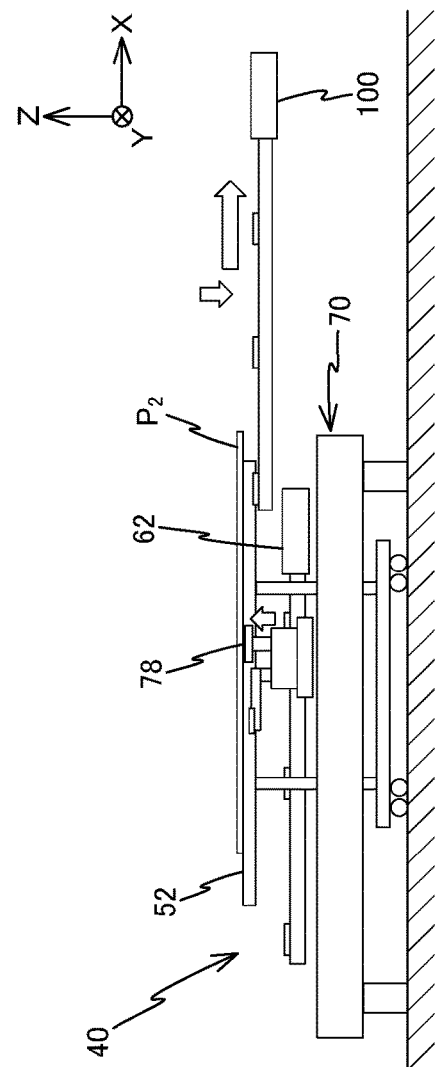
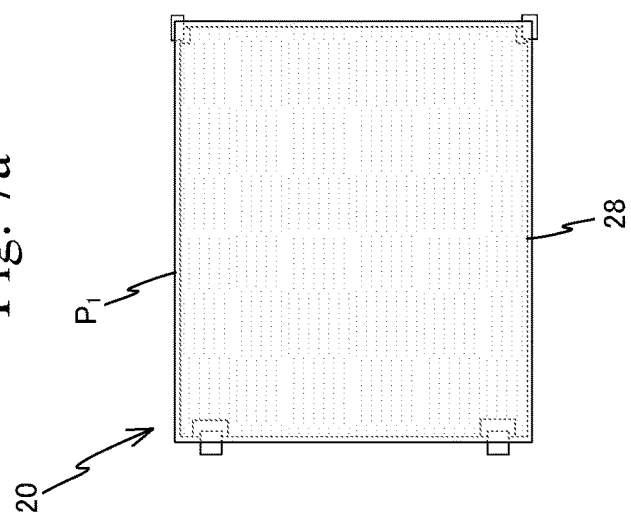
Fig. 7a
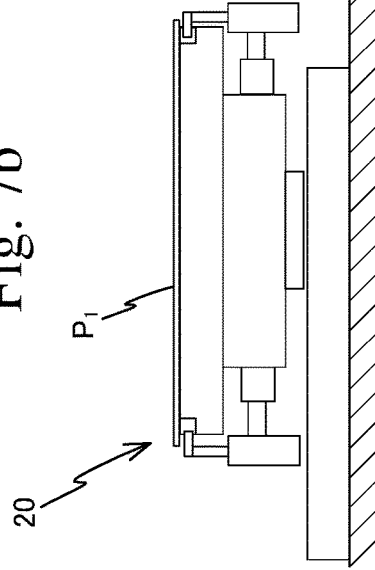
Fig. 7b

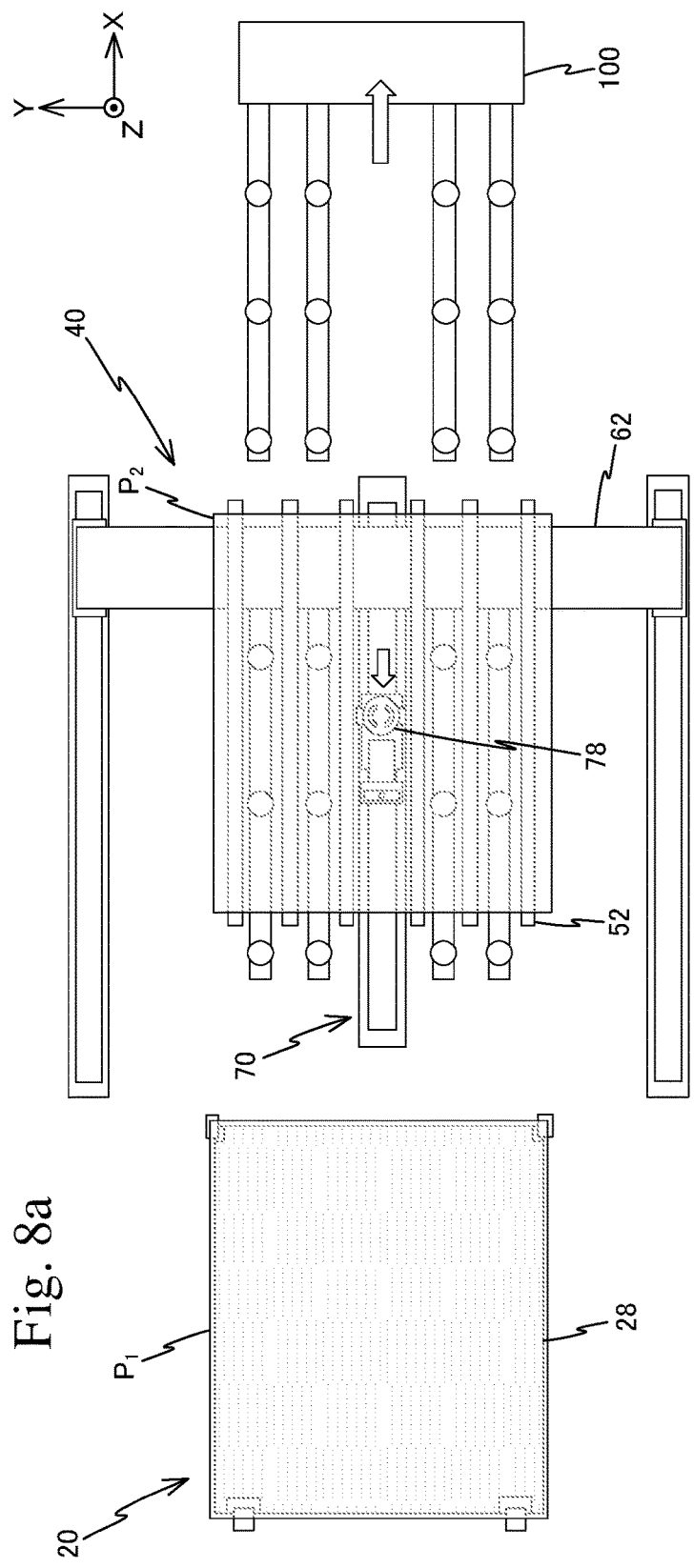
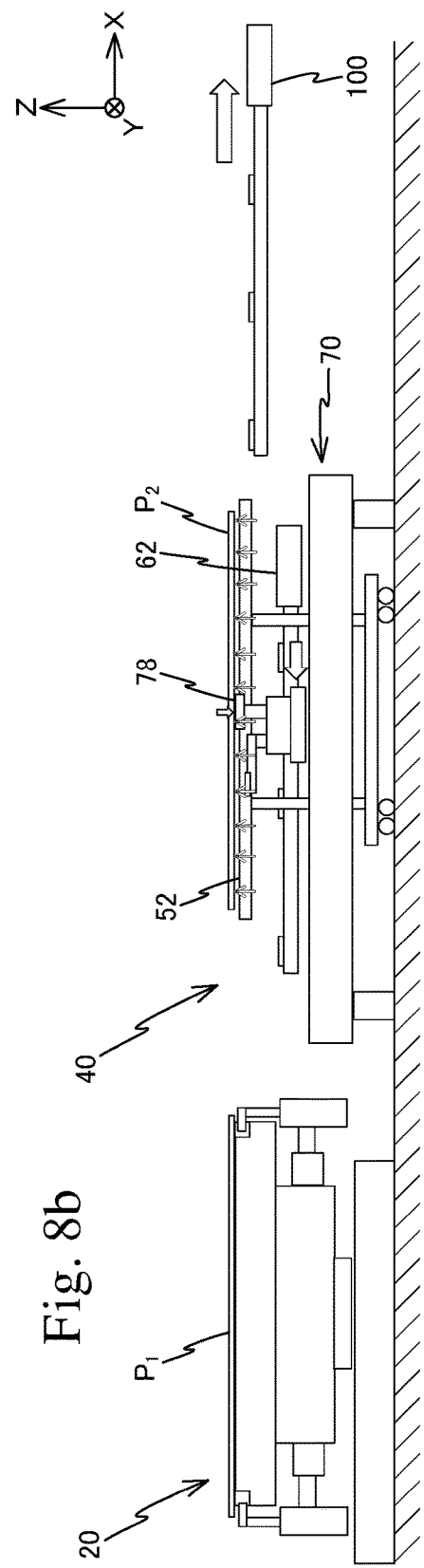
Fig. 8a
Fig. 8b

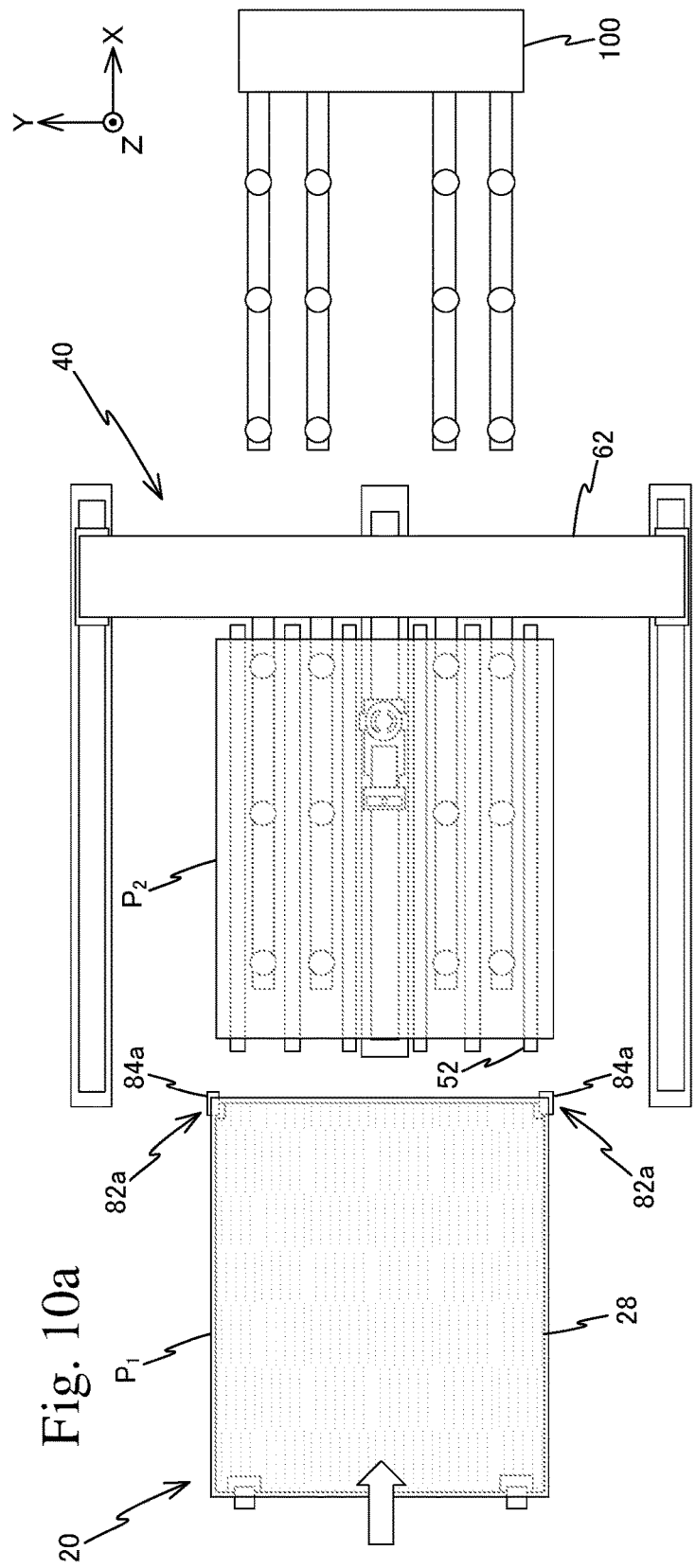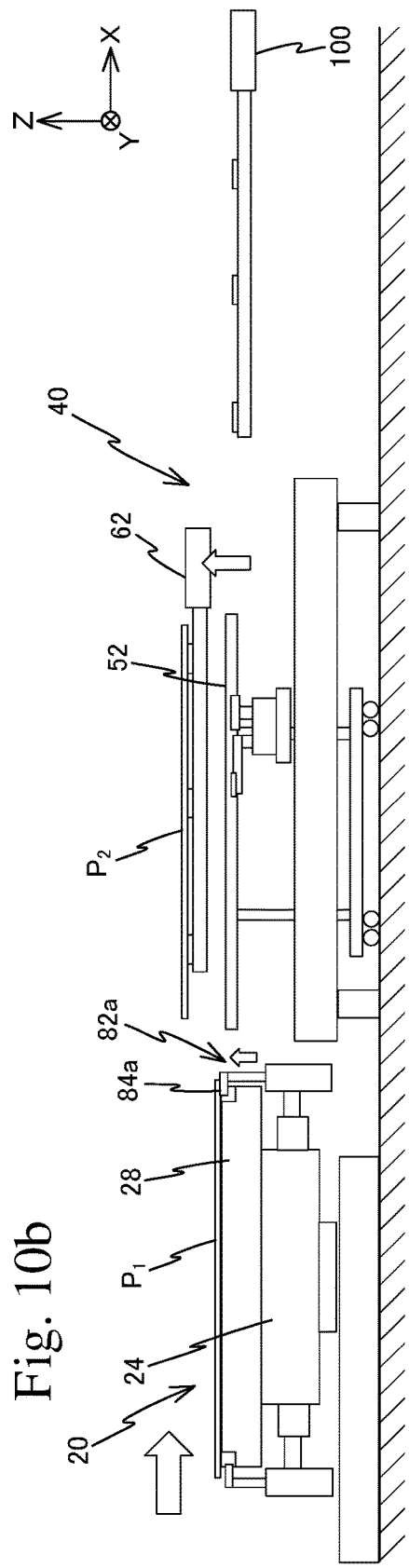
Fig. 10a
Fig. 10b

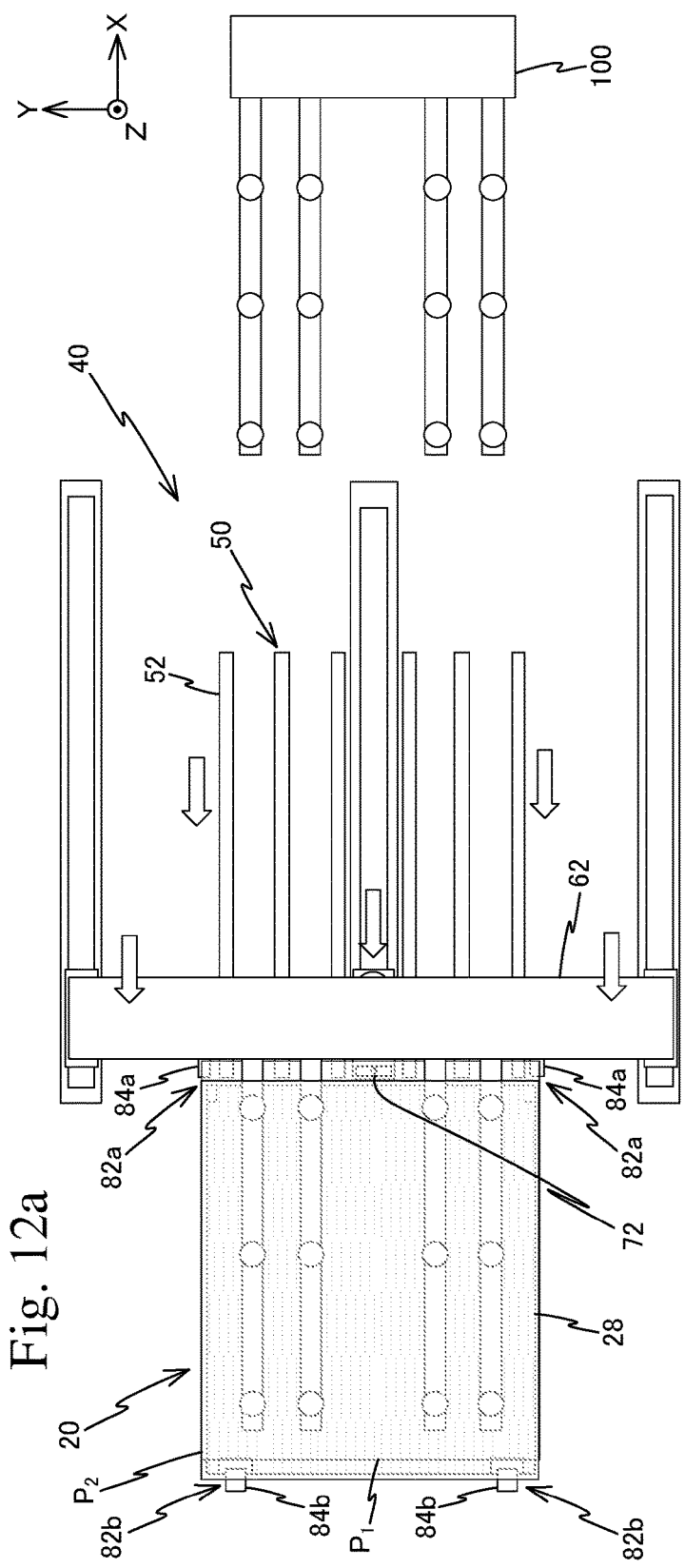
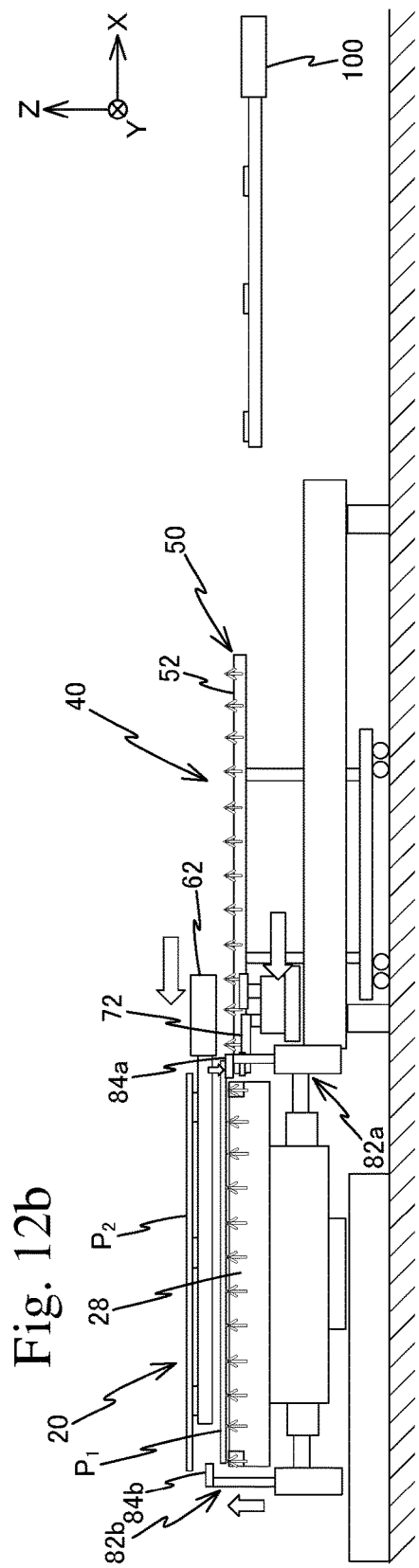

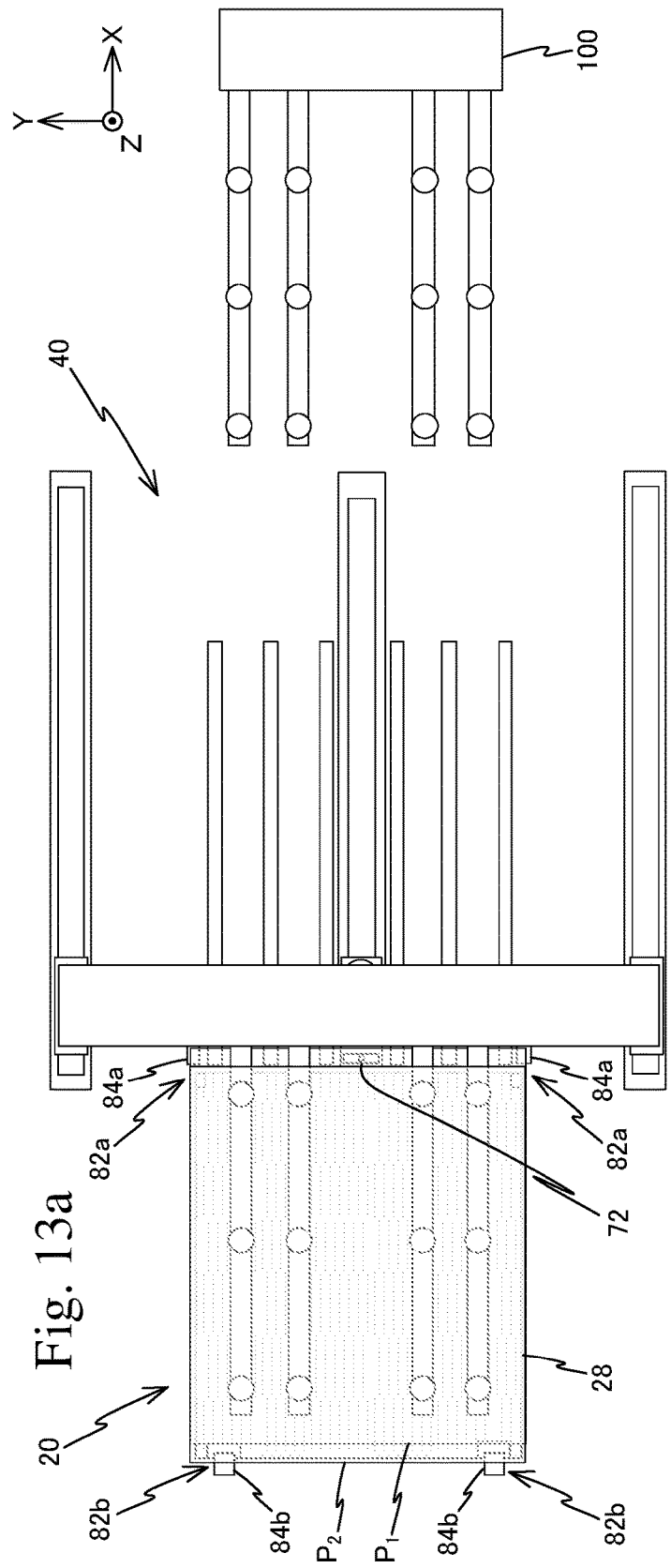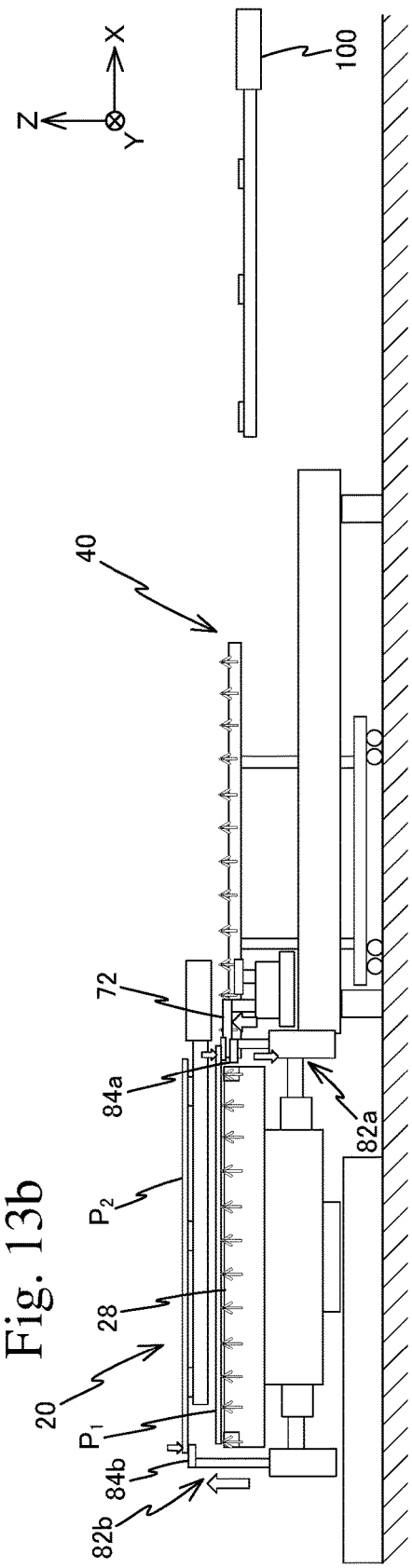

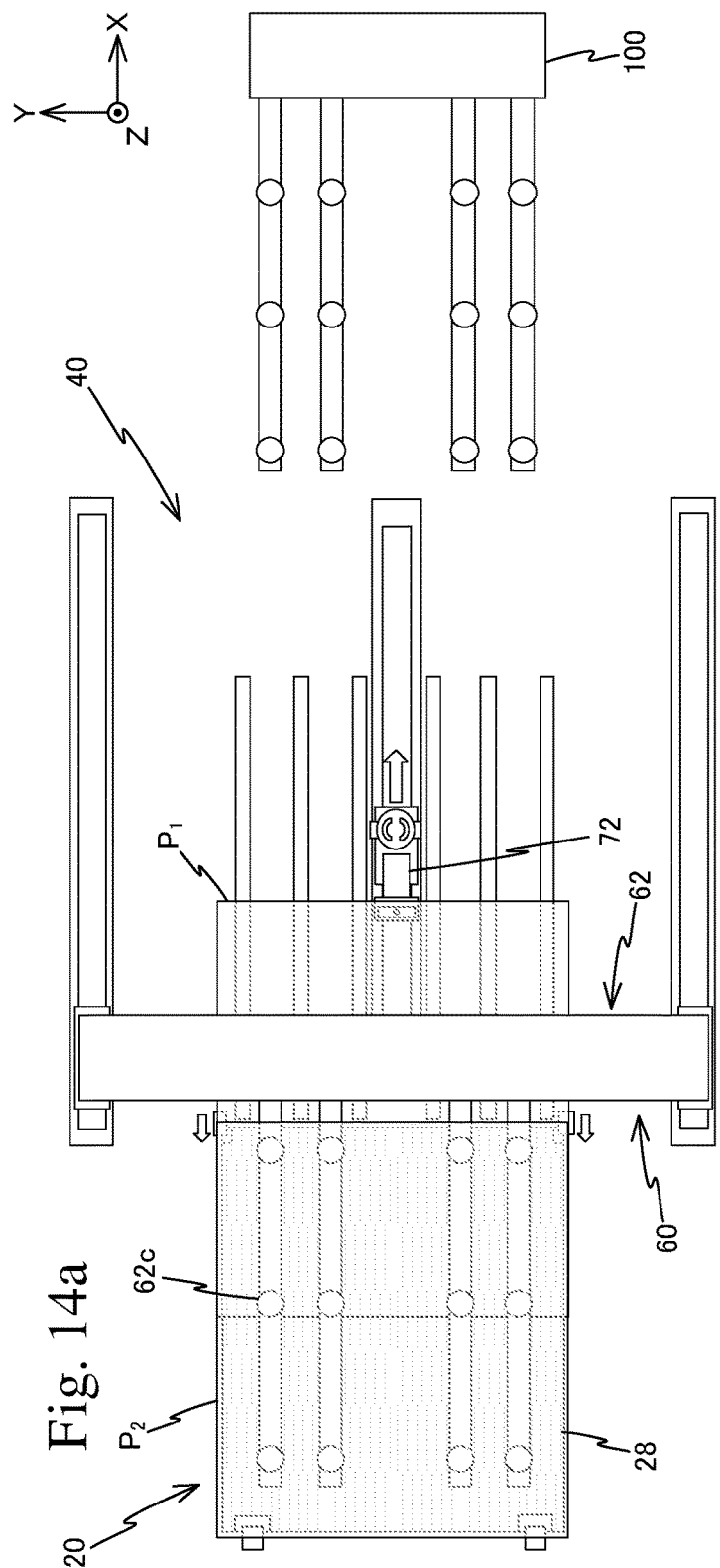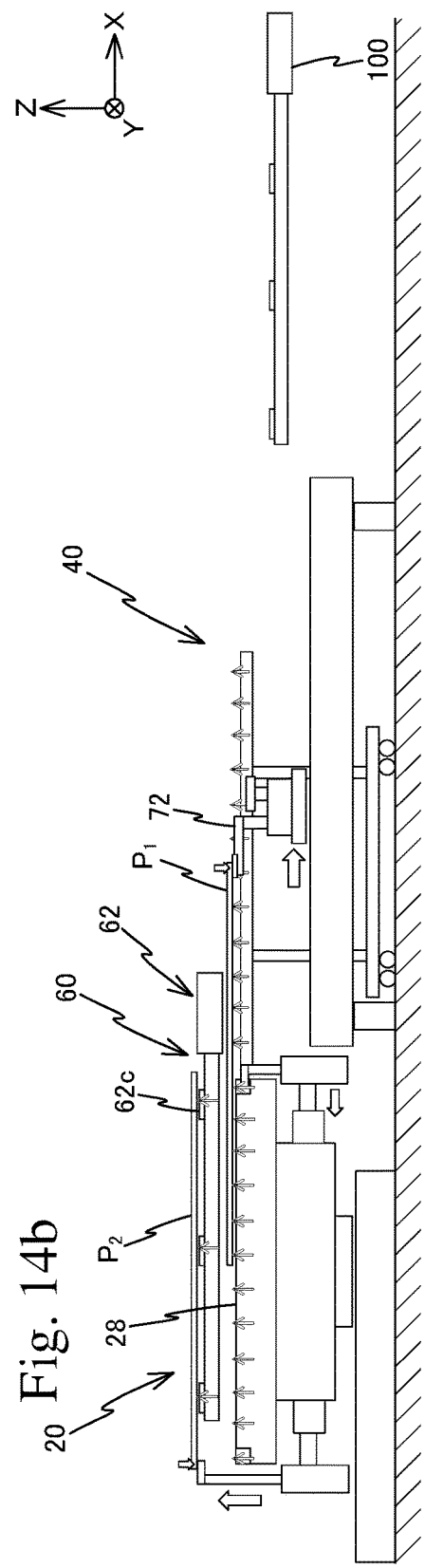

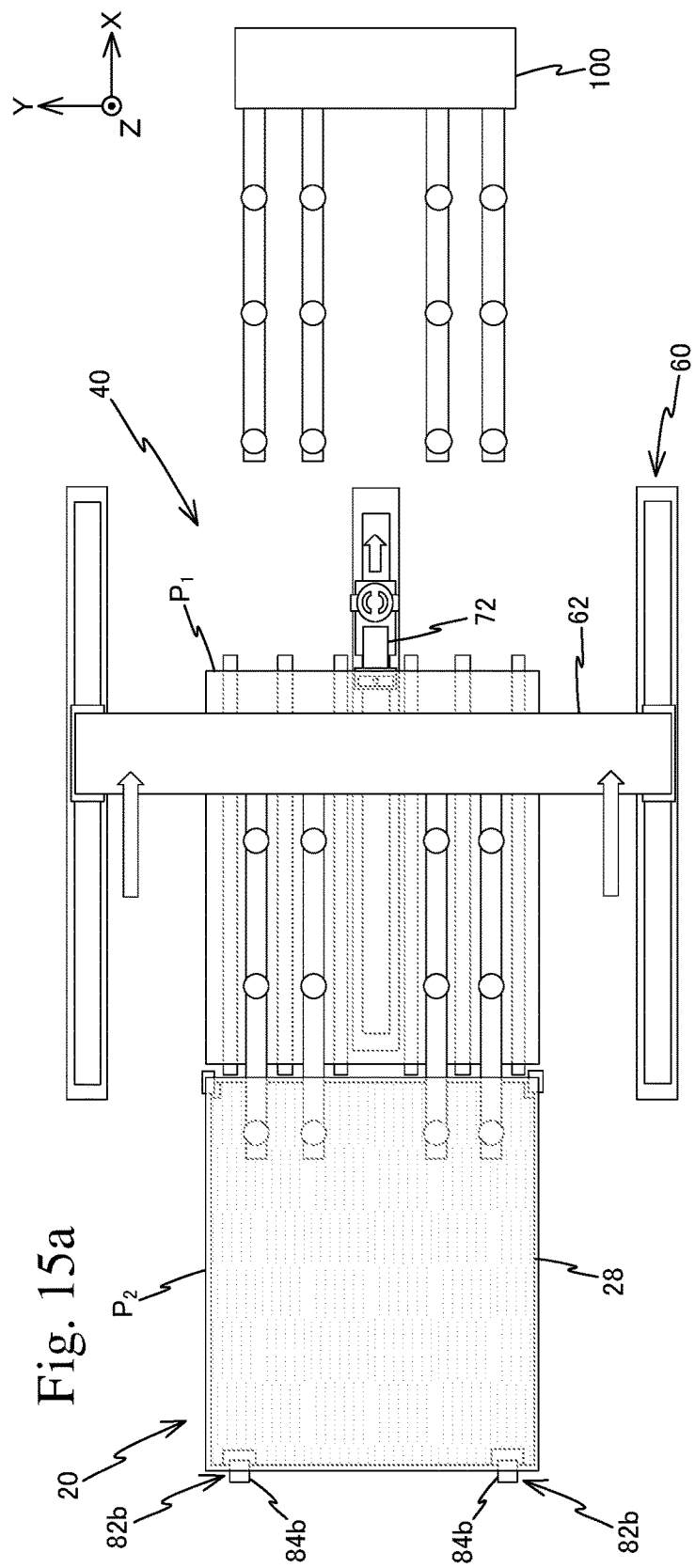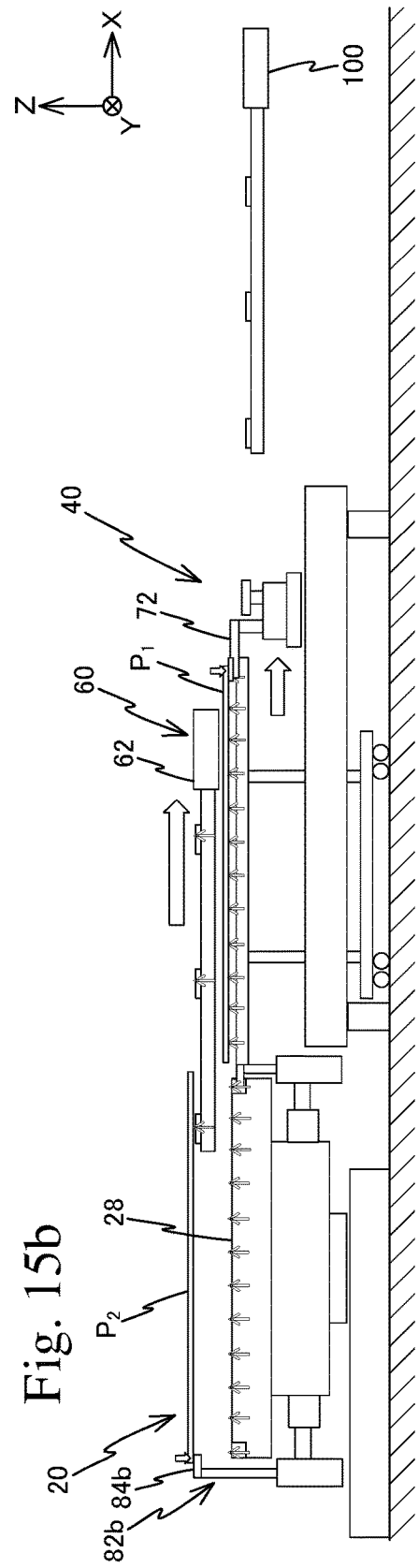

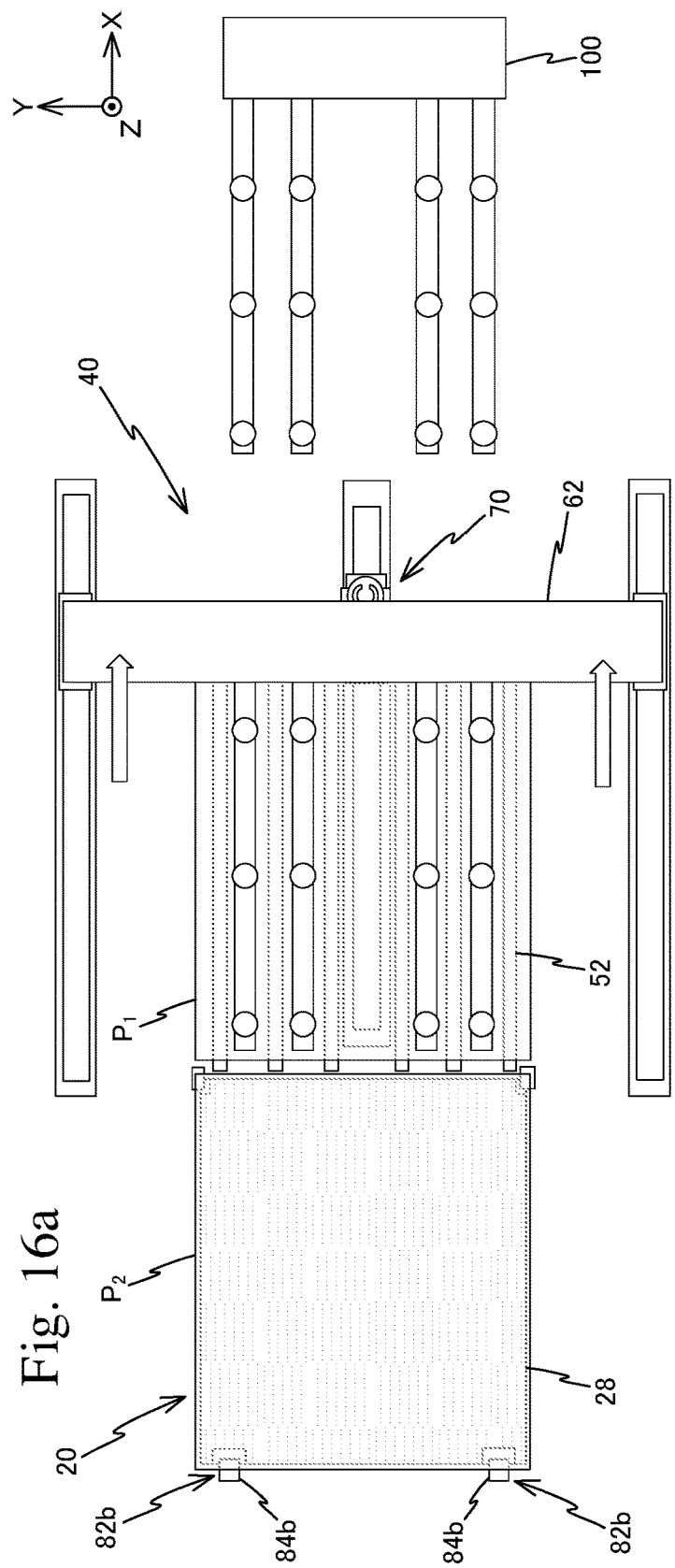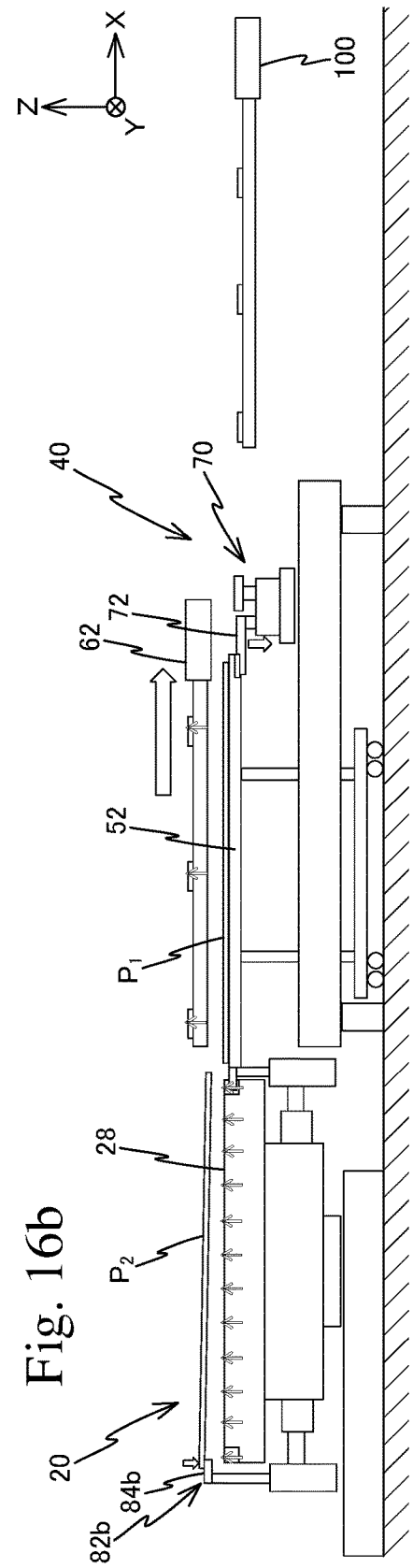

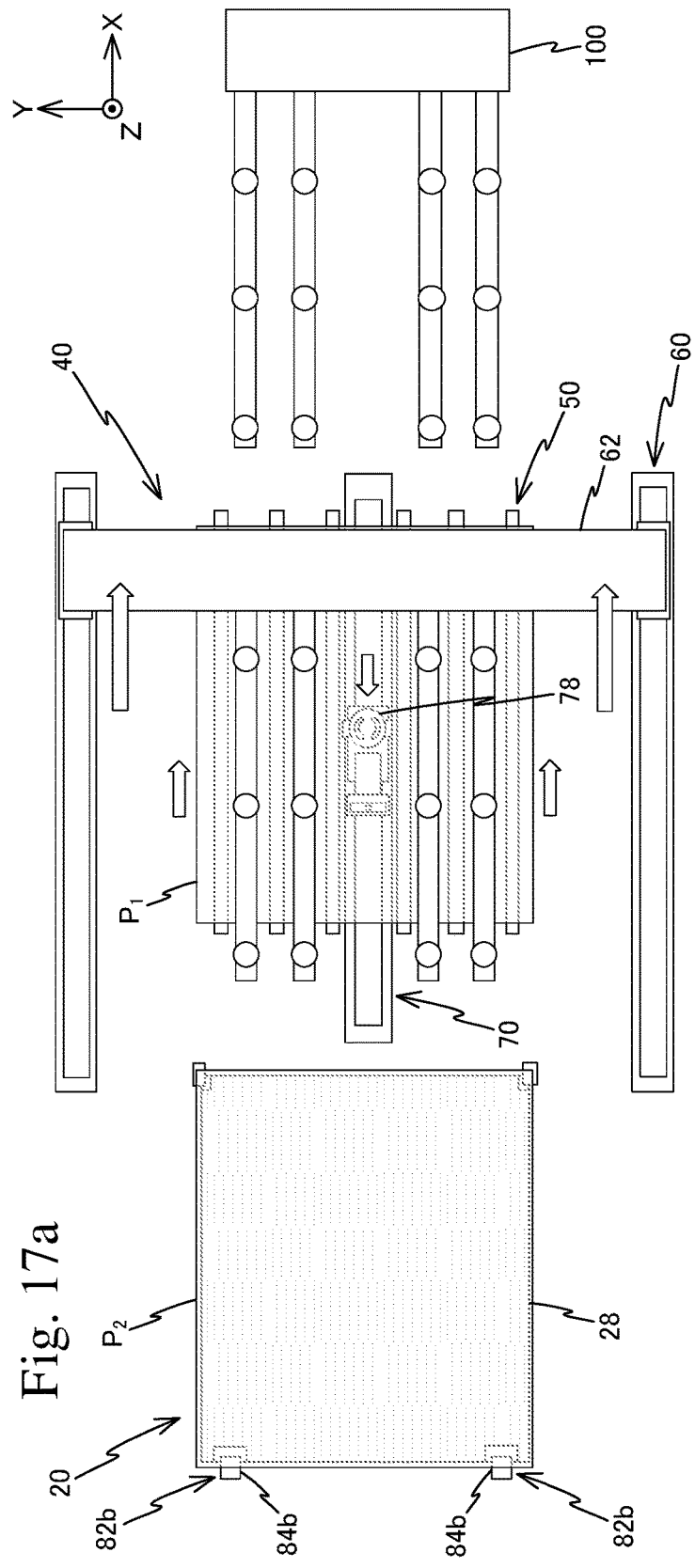
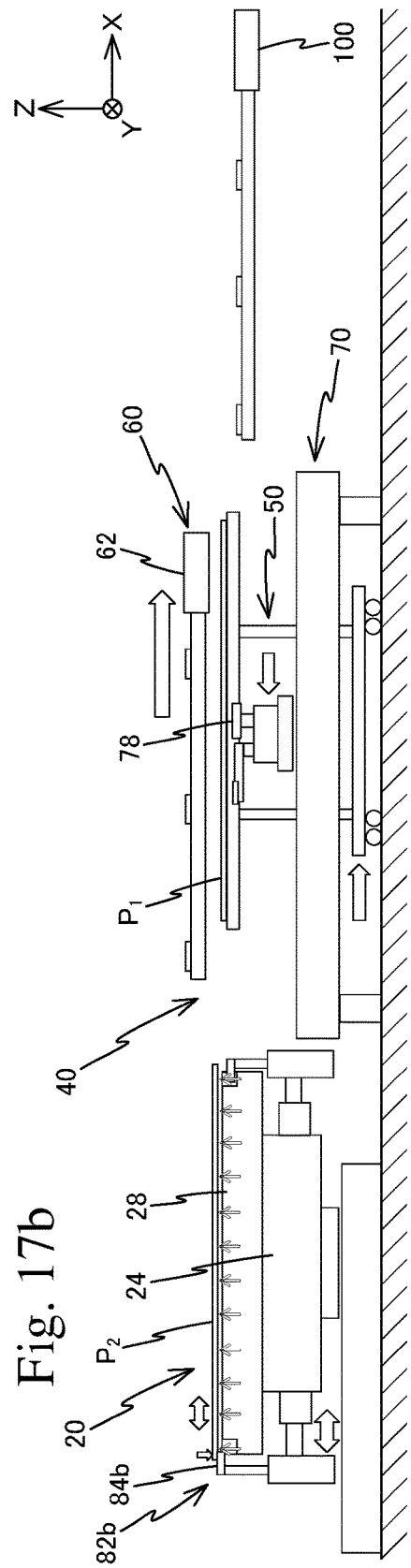
Fig. 17a
Fig. 17b

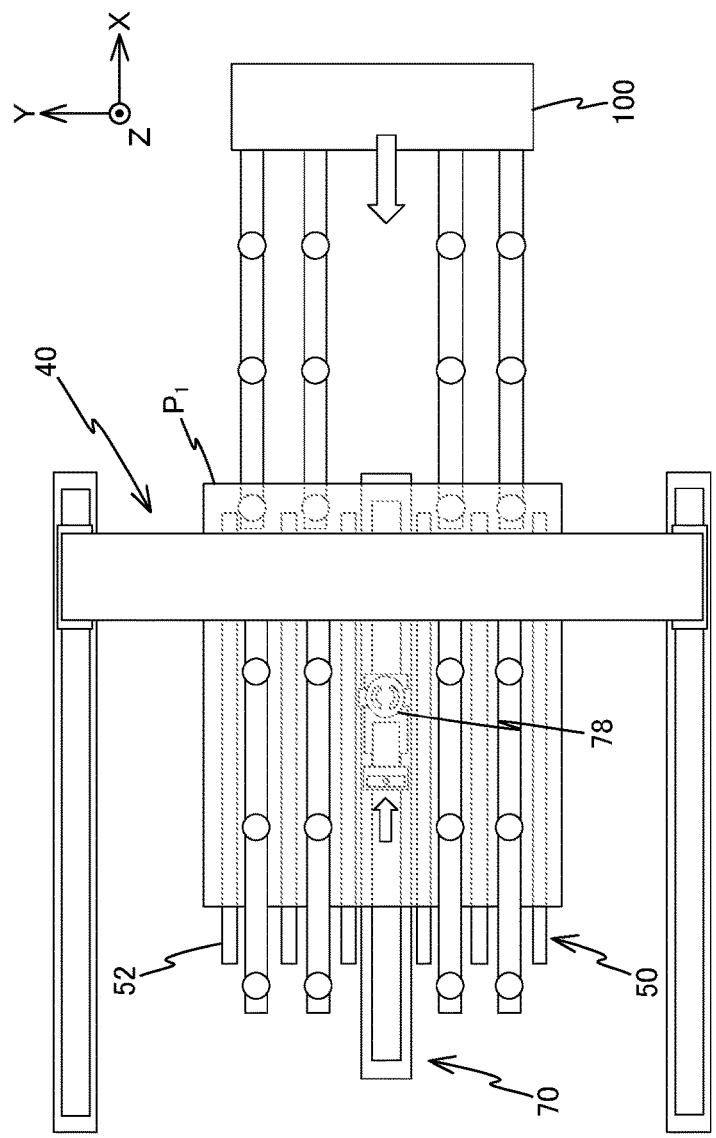
Fig. 18a
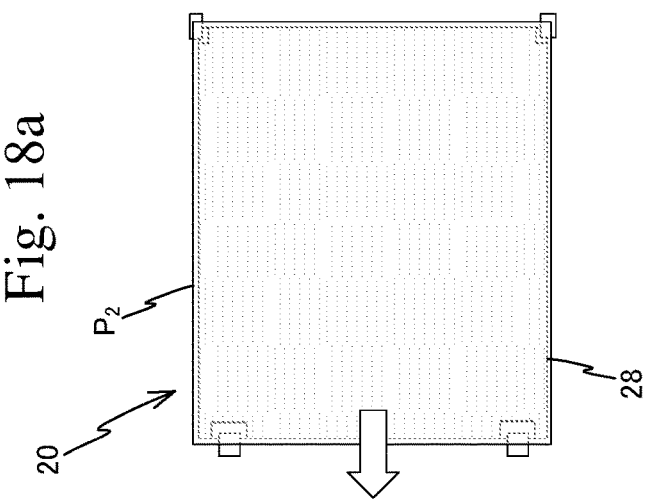
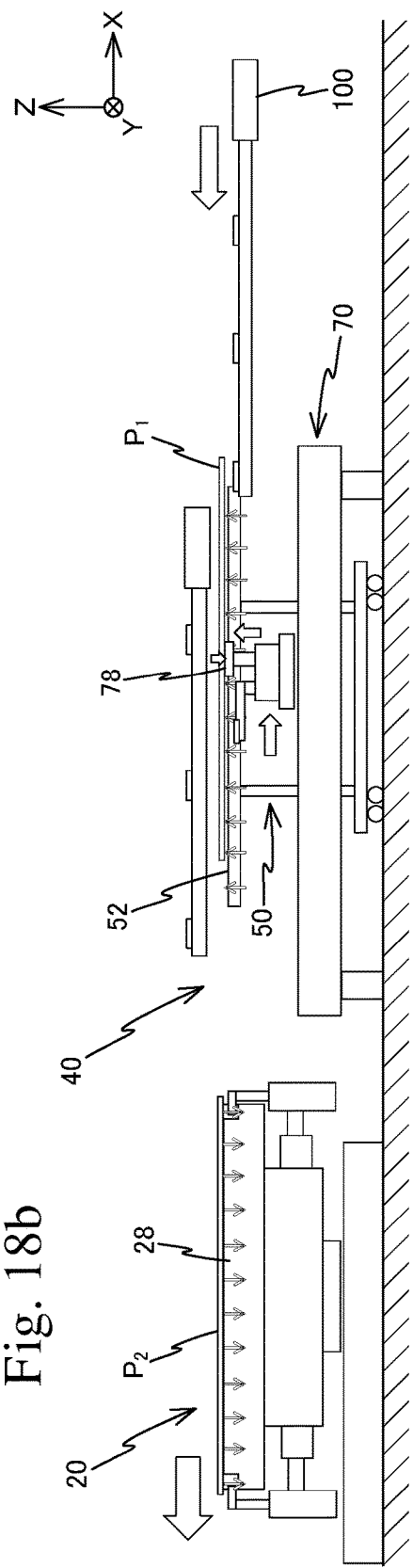
Fig. 18b

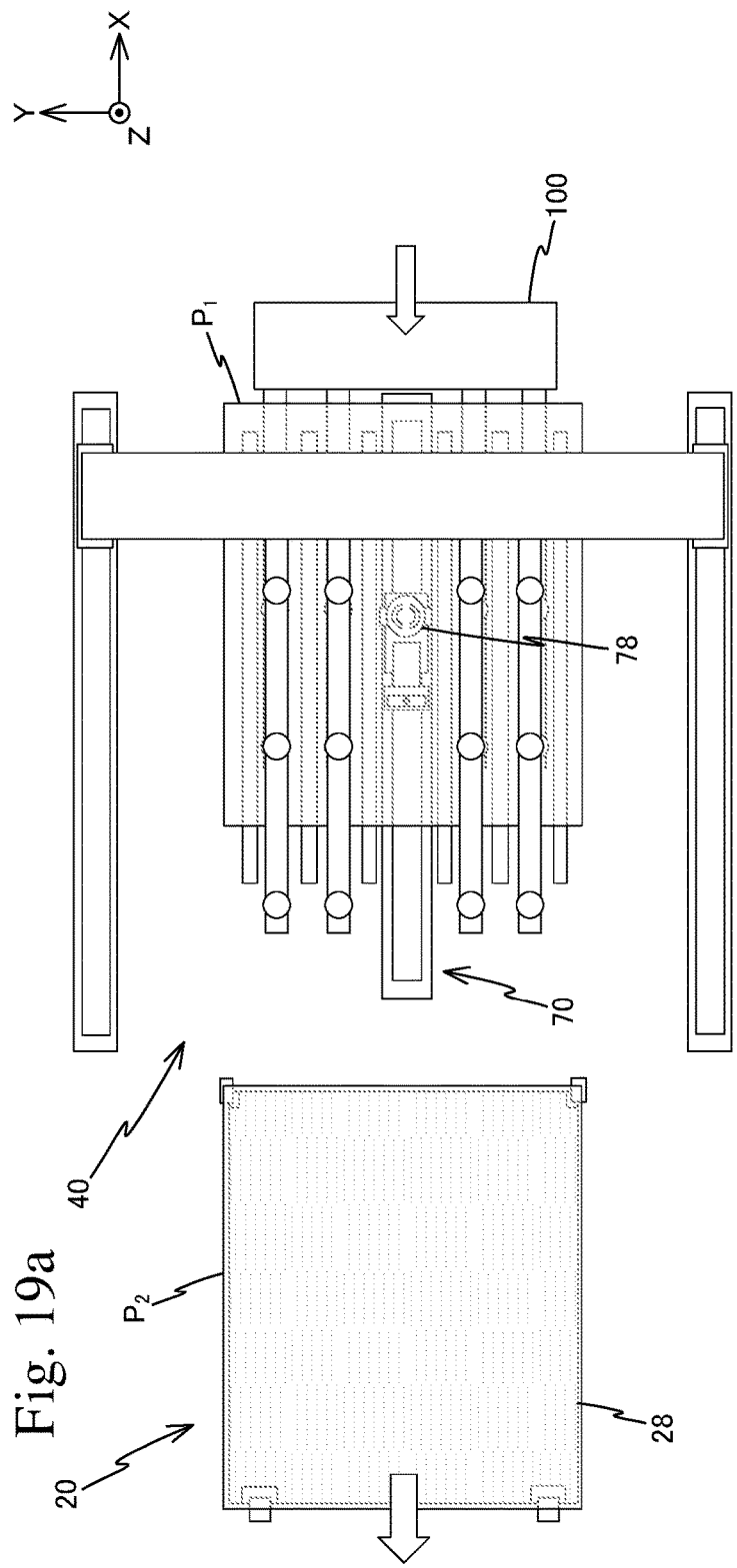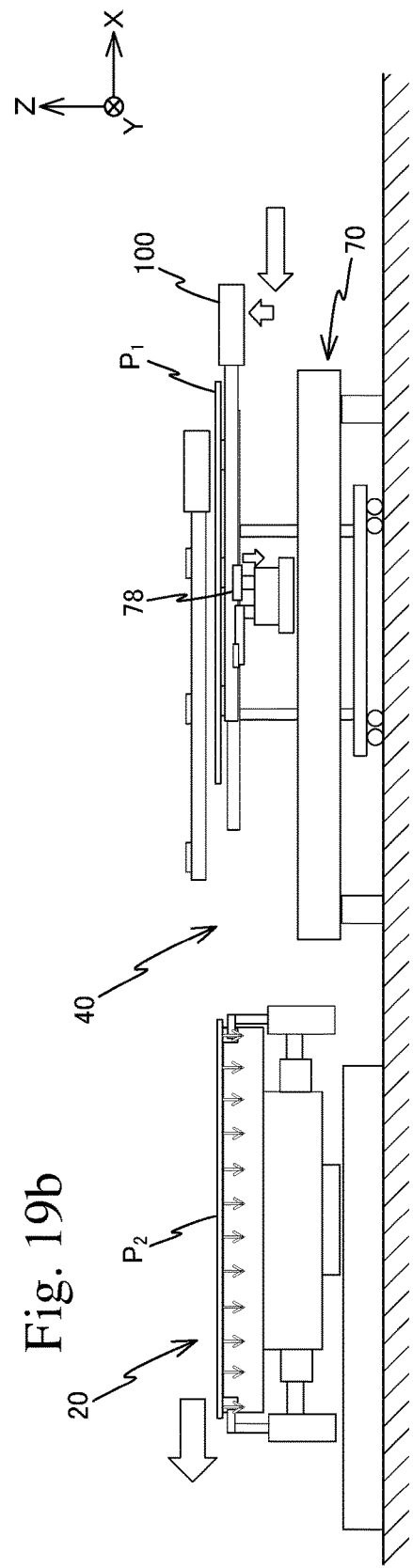
Fig. 19a
Fig. 19b

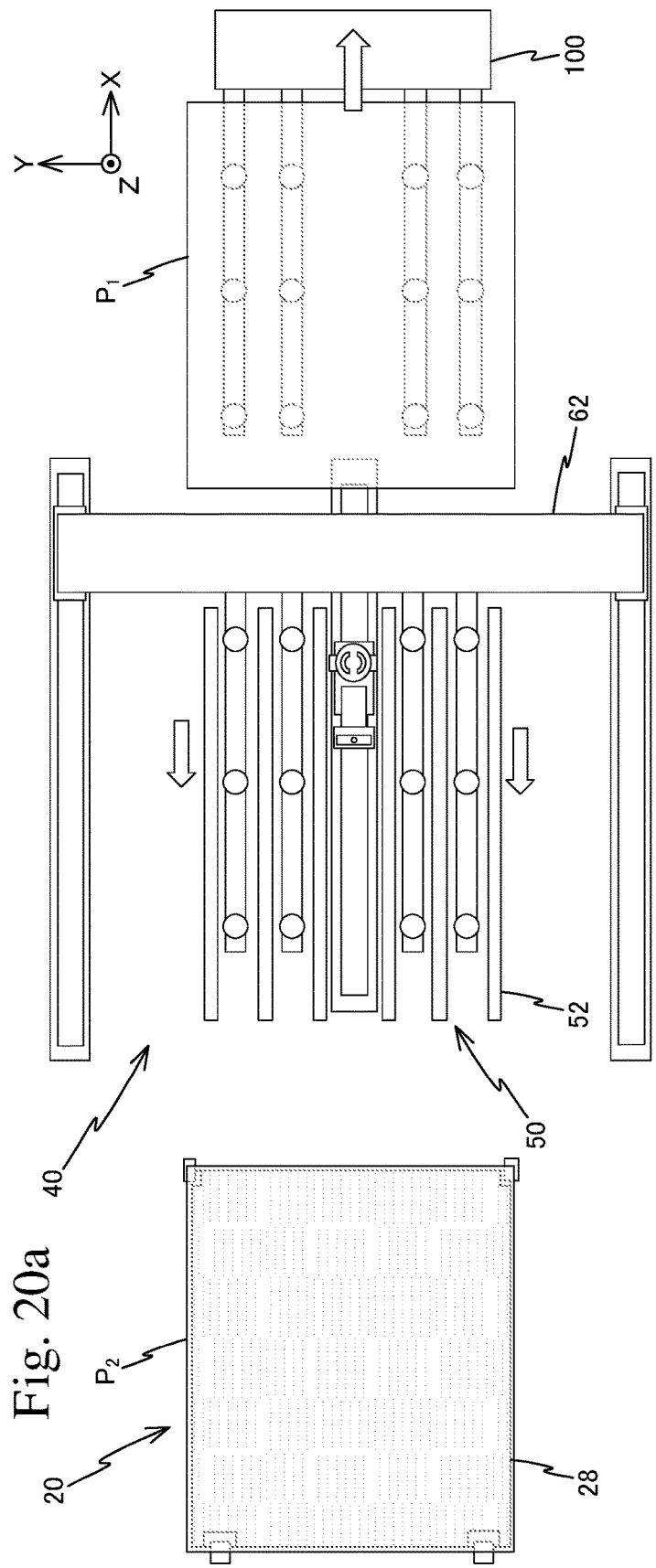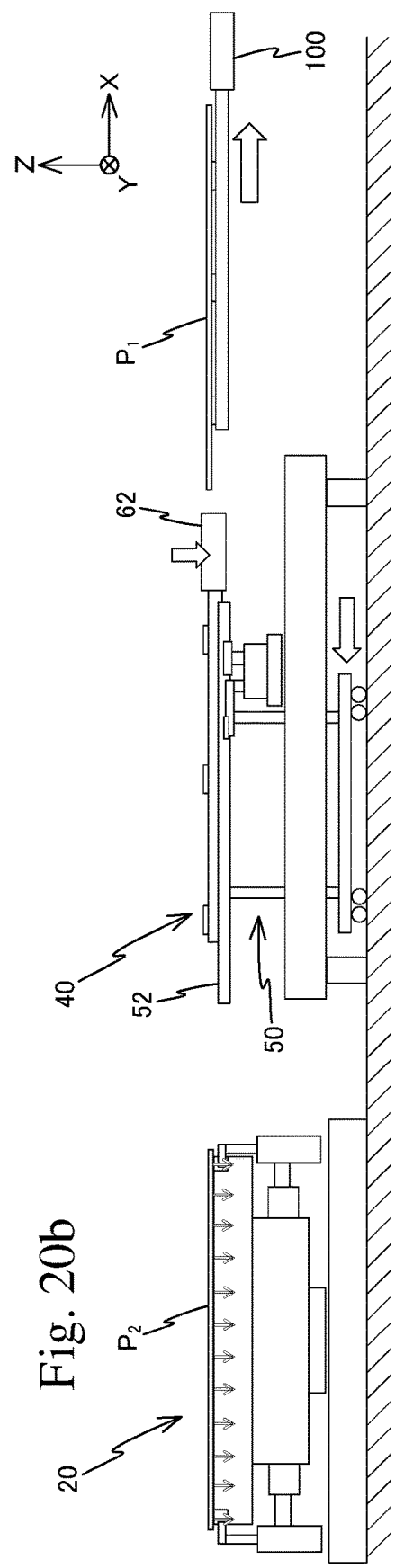

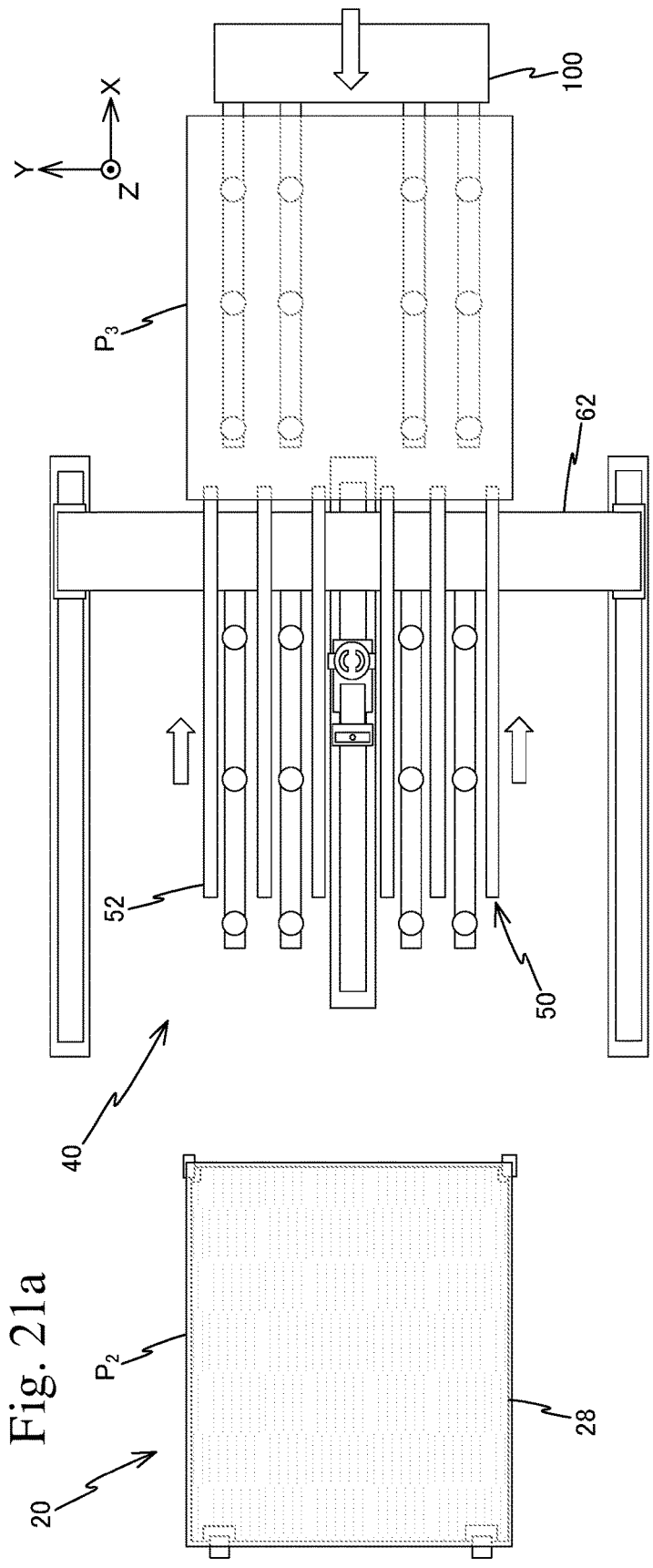
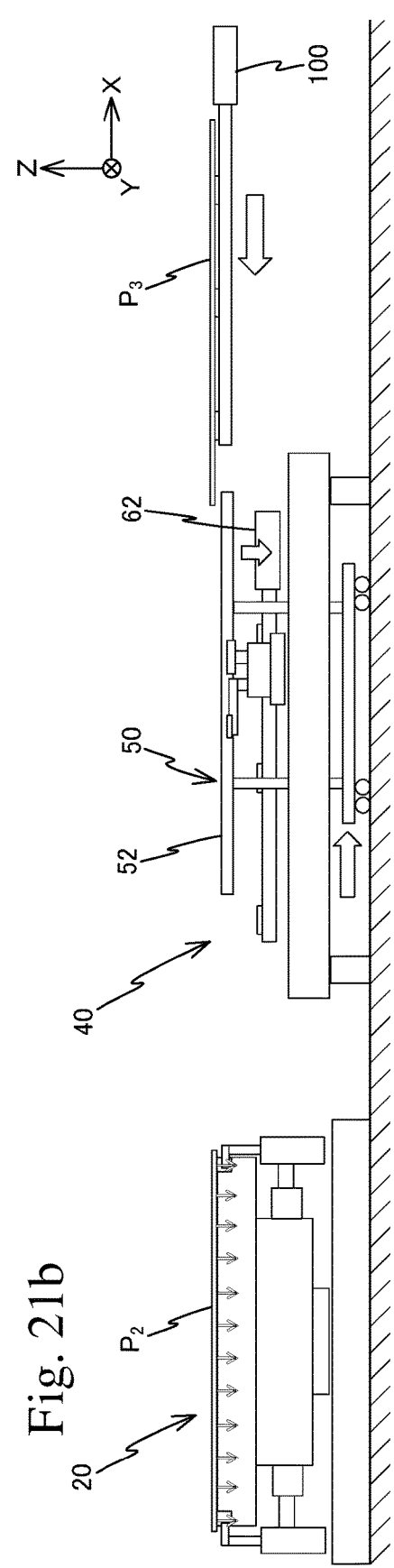
Fig. 21a
Fig. 21b

OBJECT CARRIER DEVICE, EXPOSURE APPARATUS, MANUFACTURING METHOD OF FLAT-PANEL DISPLAY, DEVICE MANUFACTURING METHOD, OBJECT CARRYING METHOD, AND EXPOSURE METHOD

TECHNICAL FIELD

The present invention relates to object carrier devices, exposure apparatuses, manufacturing methods of flat-panel displays, device manufacturing methods, object carrying methods, and exposure methods, and more particularly to an object carrier device and an object carrying method for carrying an object onto a support surface, an exposure apparatus including the object carrier device, an exposure method including the object carrying method, a manufacturing method of flat-panel displays or devices using the exposure apparatus or the exposure method.

BACKGROUND ART

Conventionally, in a lithography process for manufacturing electronic devices (micro devices) such as liquid crystal display devices and semiconductor devices (integrated circuits and the like), exposure apparatuses such as an exposure apparatus of a step-and-scan method (a so-called scanning stepper (which is also called a scanner)) that, while synchronously moving a mask or a reticle (hereinafter, generically referred to as a "mask") and a glass plate or a wafer (hereinafter, generically referred to as a "substrate") in a predetermined scanning direction, transfers a pattern formed on the mask onto the substrate using an energy beam, are used.

As this type of exposure apparatuses, the exposure apparatus is known, in which a glass substrate that has been exposed on a substrate stage device is carried out using a substrate exchange device, and then another glass substrate is carried onto the substrate stage device using the substrate exchange device, and thereby the glass substrate held by the substrate stage device is sequentially exchanged and exposure processing is performed with respect to a plurality of glass substrates in order (e.g., refer to PTL 1).

Here, in the case of exposing a plurality of glass substrates, it is preferable to exchange swiftly the glass substrate on the substrate stage device also for improvement in overall throughput.

CITATION LIST

Patent Literature

[PTL 1] U.S. Pat. No. 6,559,928

SUMMARY OF INVENTION

Solution to Problem

The present invention has been made under the circumstance described above, and according to a first aspect, there is provided a first object carrier device, comprising: a support section having a support surface to support an object; a first holding section that holds a part of the object located above the support surface; a second holding section that holds an other part of the object located above the support surface; and a controller that controls and drives downward the first holding section holding the object so that the object is supported on the support surface, when releasing the hold of the other part of the object by the second holding section.

According to a second aspect, there is provided a second object carrier device, comprising: a support section having a support surface to support an object; a first holding section that holds a part of the object; and a controller that controls and drives downward the first holding section holding the object located above the support surface, on the basis of a fall of an other part of the object, so that the object is supported on the support surface.

According to a third aspect, there is provided a third object carrier device, comprising: a first holding section that holds a part of the object located above the support surface; a second holding section that holds an other part of the object located above the support surface; and a controller that controls and drives the second holding section so that the second holding section is withdrawn from the other part of the object in a state where the other part of the object is held by levitation, while the first holding section holds the part of the object.

According to a fourth aspect, there is provided an exposure apparatus, comprising: the object carrier device of any one of the first to the third object carrier devices of the present invention; and a pattern forming device that forms a predetermined pattern on the object supported on the support surface, using an energy beam.

According to a fifth aspect, there is provided a manufacturing method of a flat-panel display, comprising: exposing the substrate using the exposure apparatus of the present invention; and developing the substrate that has been exposed.

According to a sixth aspect, there is provided a device manufacturing method, comprising: exposing the object using the exposure apparatus of the present invention; and developing the object that has been exposed.

According to a seventh aspect, there is provided a first object carrying method, comprising: holding a part of an object located above a support surface of a support section, using a first holding section, the support section having the support surface to support the object; and controlling and driving downward the first holding section holding the object so that the object is supported on the support surface, when releasing a hold of an other part of the object by a second holding section that holds the other part of the object located above the support surface.

According to an eighth aspect, there is provided a second object carrying method, comprising: holding a part of an object located above a support surface of a support section, using a first holding section, the support section having the support surface to support the object; and controlling and driving downward the first holding section holding the object on the basis of a fall of an other part of the object, so that the object is supported on the support surface.

According to a ninth aspect, there is provided a third object carrying method, comprising: holding a part of an object located above a support surface of a support section, using a first holding section, the support section having the support surface to support the object; and controlling and driving a second holding section that holds an other part of the object located above the support surface so that the second holding section is withdrawn from the other part of the object in a state where the other part of the object is held by levitation, while the first holding section holds the part of the object.

According to a tenth aspect, there is provided an exposure method, comprising: the object carrying method of any one of the first to the third object carrying methods of the present invention; and forming a predetermined pattern on the object supported on the support surface, using an energy beam.

According to an eleventh aspect, there is provided a manufacturing method of a flat-panel display, comprising: exposing the substrate using the exposure method of the present invention; and developing the substrate that has been exposed.

According to a twelfth aspect, there is provided a device manufacturing method, comprising: exposing the object using the exposure method of the present invention; and developing the object that has been exposed.

BRIEF DESCRIPTION OF DRAWINGS

FIG. 3b is a cross-sectional view taken along the line 3b-3b in FIG. 3a.

FIG. 4b is a cross-sectional view taken along the line 4b-4b in FIG. 4a.

FIGS. 6a and 6b are a plan view and a side view of the liquid crystal exposure apparatus, respectively, for explaining a substrate exchange operation (No. 2).

FIGS. 7a and 7b are a plan view and a side view of the liquid crystal exposure apparatus, respectively, for explaining a substrate exchange operation (No. 3).

FIGS. 8a and 8b are a plan view and a side view of the liquid crystal exposure apparatus, respectively, for explaining a substrate exchange operation (No. 4).

FIGS. 10a and 10b are a plan view and a side view of the liquid crystal exposure apparatus, respectively, for explaining a substrate exchange operation (No. 6).

FIGS. 12a and 12b are a plan view and a side view of the liquid crystal exposure apparatus, respectively, for explaining a substrate exchange operation (No. 8).

FIGS. 13a and 13b are a plan view and a side view of the liquid crystal exposure apparatus, respectively, for explaining a substrate exchange operation (No. 9).

FIGS. 14a and 14b are a plan view and a side view of the liquid crystal exposure apparatus, respectively, for explaining a substrate exchange operation (No. 10).

FIGS. 15a and 15b are a plan view and a side view of the liquid crystal exposure apparatus, respectively, for explaining a substrate exchange operation (No. 11).

FIGS. 16a and 16b are a plan view and a side view of the liquid crystal exposure apparatus, respectively, for explaining a substrate exchange operation (No. 12).

FIGS. 17a and 17b are a plan view and a side view of the liquid crystal exposure apparatus, respectively, for explaining a substrate exchange operation (No. 13).

FIGS. 18a and 18b are a plan view and a side view of the liquid crystal exposure apparatus, respectively, for explaining a substrate exchange operation (No. 14).

FIGS. 19a and 19b are a plan view and a side view of the liquid crystal exposure apparatus, respectively, for explaining a substrate exchange operation (No. 15).

FIGS. 20a and 20b are a plan view and a side view of the liquid crystal exposure apparatus, respectively, for explaining a substrate exchange operation (No. 16).

FIGS. 21a and 21b are a plan view and a side view of the liquid crystal exposure apparatus, respectively, for explaining a substrate exchange operation (No. 17).

DESCRIPTION OF EMBODIMENTS

First Embodiment

A first embodiment will be described below, using FIGS. 1 to 21b.

Figure 1:
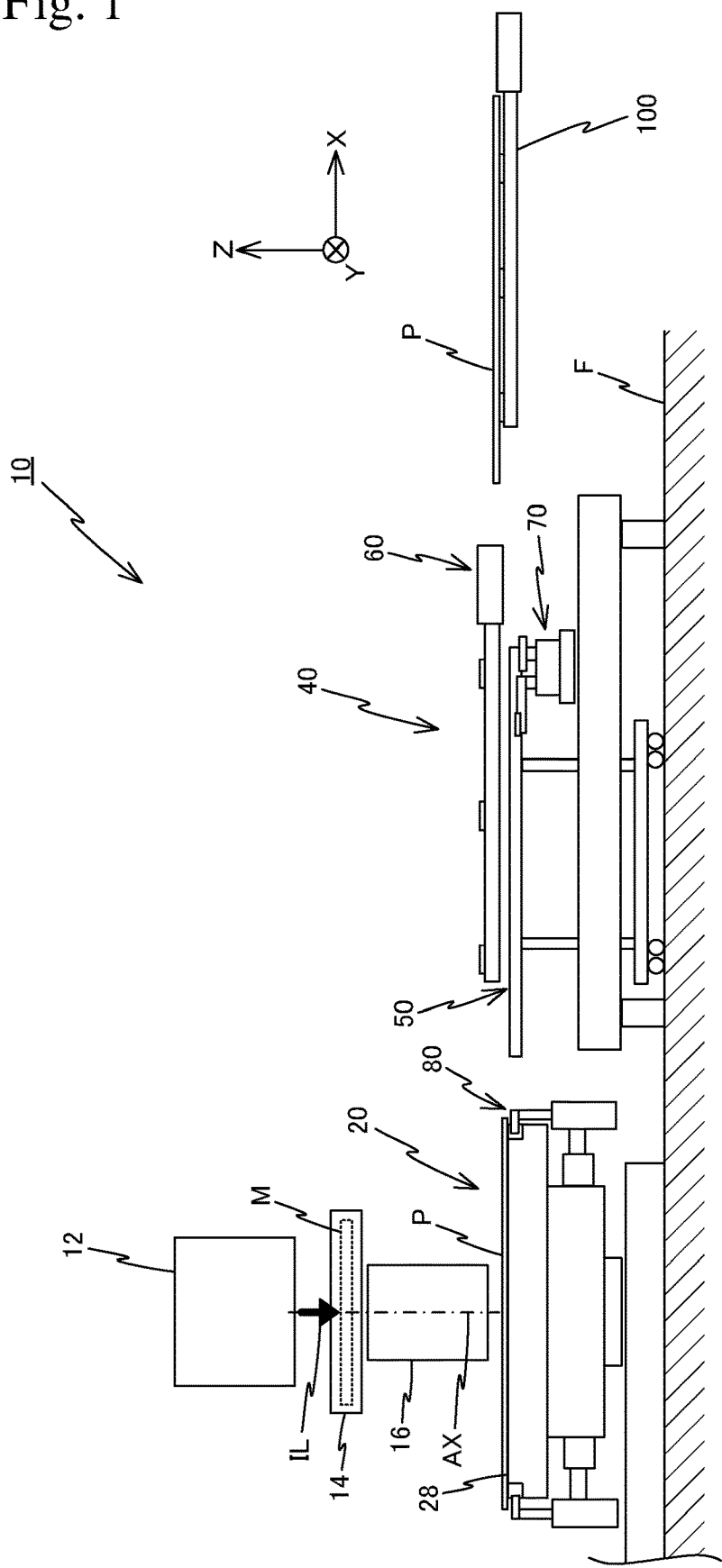
FIG. 1 is a view schematically showing a configuration of a liquid crystal exposure apparatus related a first embodiment.

FIG. 1 schematically shows a configuration of a liquid crystal exposure apparatus 10 related to the first embodiment. Liquid crystal exposure apparatus 10 is a projection exposure apparatus of a step-and-scan method using, as an exposure object, a rectangular (square) glass substrate P (hereinafter, simply referred to as a substrate P) used in, for example, a liquid crystal display device (a flat-panel display) or the like, which is a so-called scanner.

Liquid crystal exposure apparatus 10 has: an illumination system 12; a mask stage device 14 to hold a mask M; a projection optical system 16; a substrate stage device 20 to hold substrate P whose surface (a surface facing the +Z side in FIG. 1) is coated with resist (sensitive agent); a substrate exchange device 40; a control system thereof; and the like. Hereinafter, the explanation is given assuming that a direction in which mask M and substrate P are each scanned relative to projection optical system 16 on exposure is an X-axis direction, a direction orthogonal to the X-axis within a horizontal plane is a Y-axis direction, and a direction orthogonal to the X-axis and the Y-axis is a Z-axis direction.

Illumination system 12 is configured similar to an illumination system disclosed in, for example, U.S. Pat. No. 5,729,331 and the like. Illumination system 12 irradiates maskM with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, for example, light such as an i-line (with wavelength of 365 nm), a g-line (with wavelength of 436 nm), and an h-line (with wavelength of 405 nm) (or synthetic light of the i-line, the g-line and the h-line described above) is used.

Mask stage device 14 holds mask M with, for example, vacuum adsorption. Mask stage device 14 is driven with a predetermined long stroke at least in a scanning direction (the X-axis direction), by a mask stage drive system (not illustrated) inducing, for example, a linear motor. Positional information of mask stage device 14 is obtained by a mask stage measurement system (not illustrate) including, for example, a linear encoder system.

Projection optical system 16 is disposed below mask stage device 14. Projection optical system 16 is a so-called multi-lens projection optical system having a configuration similar to a projection optical system disclosed in, for example, U.S. Pat. No. 6,552,775 and the like, and projection optical system 16 is equipped with a plurality of projection optical systems that are, for example, both-side telecentric unmagnification systems and form erected normal images.

In liquid crystal exposure apparatus 10, when an illumination area on mask M is illuminated with illumination light IL from illumination system 12, by the illumination light that has passed through mask M, a projection image (a partially erected image) of a circuit pattern of mask M within the illumination area is formed on an irradiation area (an exposure area) of the illumination light, conjugate with the illumination area, on substrate P via projection optical system 16. Then, mask M is moved in the scanning direction relative to the illumination area (illumination light IL) and also substrate P is moved in the scanning direction relative to the exposure area (illumination light IL), and thereby the scanning exposure of one shot area on substrate P is performed and the pattern formed on mask M is transferred onto the shot area.

Figure 3A:
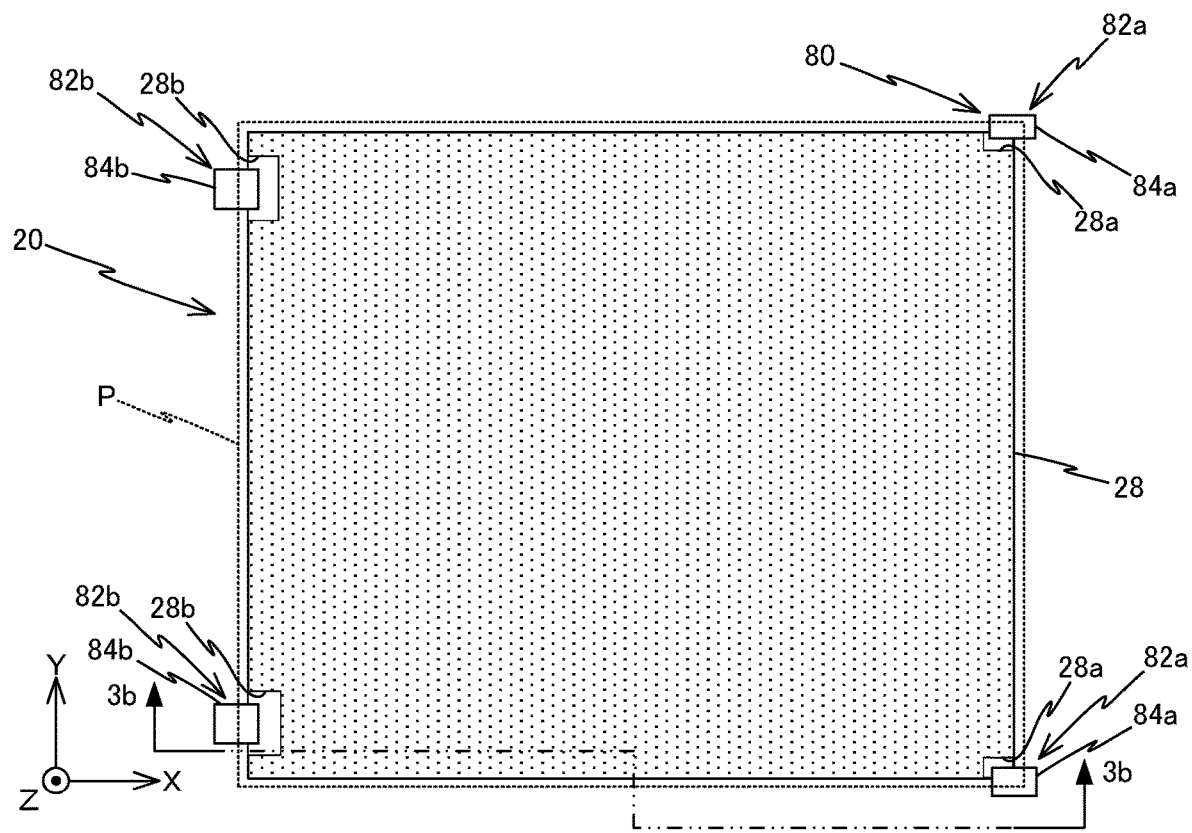
FIG. 3a is a plan view of the substrate stage device.
Figure 3B:
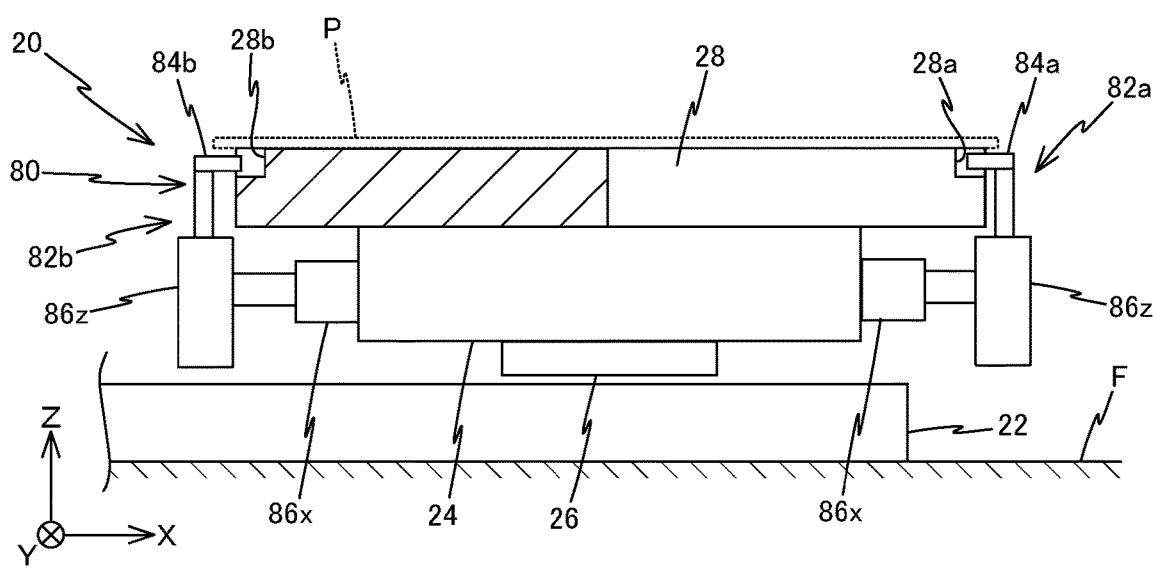

As illustrated in FIG. 3b, substrate stage device 20 is equipped with a surface plate 22, a substrate table 24, a self-weight support device 26 and a substrate holder 28.

Surface plate 22 is made up of a plate-like member having a rectangular shape in a planar view (when viewed from the +Z side) that is disposed so that the upper surface (the +Z surface) of the plate-like member is parallel to an XY plane, and surface plate 22 is installed on a floor F via a vibration isolating device (not illustrated). Substrate table 24 is made up of a thin box-like member having a rectangular shape in a planar view. Self-weight support device 26 is placed in a noncontact state on surface plate 22, and supports the self-weight of substrate table 24 from below. Further, although not illustrated, substrate stage device 20 is equipped with: a substrate stage drive system that includes, for example, a linear motor and the like, and drives substrate table 24 in the X-axis direction and the Y-axis direction (along the XY plane) with a predetermined long stroke, and also finely drives substrate table 24 in directions of six degrees of freedom (the X-axis, Y-axis, Z-axis, θx, θy and θz); a substrate stage measurement system that includes, for example, an optical interferometer system and the like, and is used to obtain positional information of substrate table 24 in the directions of six degrees of freedom; and the like.

Substrate holder 28 is made up of a plate-like member having a rectangular shape in a planar view, and substrate P is placed on the upper surface (the surface on the +Z side) of substrate holder 28. As illustrated in FIG. 3a, the upper surface of substrate holder 28 is formed into a rectangular shape with the X-axis direction serving as a longitudinal direction, and its aspect ratio is almost the same as that of substrate P. However, the long side and the short side of the upper surface of substrate holder 28 are set slightly shorter than the long side and the short side of substrate P, respectively, and the end vicinity parts of the four sides of substrate P stick outwardly from substrate holder 28, in a state where substrate P is placed on the upper surface of substrate holder 28. This is because the resist coated on the surface of substrate P might adhere also to the back surface sides of the end vicinity parts of substrate P, and therefore the resist should be prevented from adhering to substrate holder 28.

The upper surface of substrate holder 28 is finished extremely flat over the entire surface. Further, on the upper surface of substrate holder 28, a plurality of minute hole parts (not illustrated) for blowing out air and/or performing vacuum suction are formed. Substrate holder 28 can correct almost the entire surface of substrate P to be flat, along (according to) the upper surface of substrate holder 28, by suctioning air between the upper surface of substrate holder 28 and substrate P via the plurality of hole parts, using a vacuum suction force supplied from a vacuum device (not illustrated). Further, substrate holder 28 can separate the back surface of substrate P (levitate substrate P) from the upper surface of substrate holder 28, by exhausting (jetting) a pressurized gas (e.g. air) supplied from a pressurized gas supply device (not illustrated) to the back surface of substrate P via the hole parts described above. Furthermore, the abut state of substrate P can be optimized (e.g., to prevent air stagnation between the backs surface of substrate P and the upper surface of substrate holder 28 from being generated), by making the time rag in the timing of exhausting the pressurized gas at each of the plurality of hole parts formed on substrate holder 28, or exchanging as needed the location of the hole parts for performing vacuum suction and the hole parts for exhausting the pressurized gas, or varying as needed the air pressure between the suction and the exhaust.

At the end vicinity part on the +X side on the upper surface of substrate holder 28, for example, two cutouts 28a are formed separately in the Y-axis direction. Further, at the end vicinity part on the −X side on the upper surface of substrate holder 28, for example, two cutouts 28b are formed separately in the Y-axis direction.

More specifically, cutouts 28a are formed at a corner part between the +X side and the +Y side of substrate holder 28 and a corner part between the +X side and the −Y side of substrate holder 28, and cutouts 28a are open to the upper surface (the surface on the +Z side), the side surface on the +X side and the side surface on the +Y side (or the −Y side) of substrate holder 28. In contrast, cutouts 28b are open only to the upper surface and the side surface on the −X side of substrate holder 28.

Figure 2:
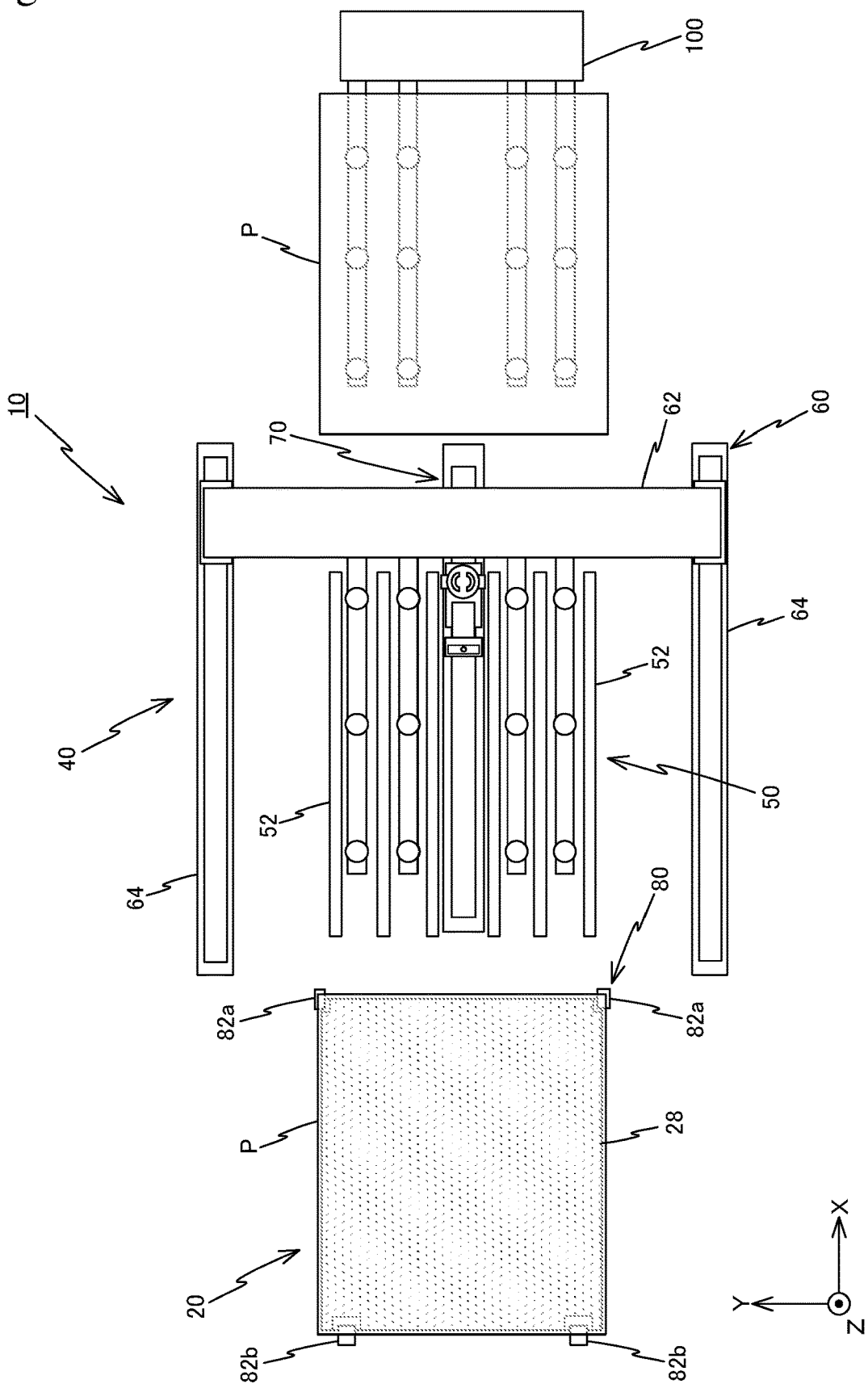
FIG. 2 is a plan view of a substrate stage device and a substrate exchange device that the liquid crystal exposure apparatus in FIG. 1 has.

As illustrated in FIG. 2, substrate exchange device 40 has a beam unit 50, a substrate carry-in device 60, a substrate carry-out device 70 and a substrate assist device 80. Beam unit 50, substrate carry-in device 60 and substrate carry-out device 70 are installed at predetermined positions on the +X side of substrate stage device 20. Hereinafter, the explanation is given, referring to the location where beam unit 50, substrate carry-in device 60 and substrate carry-out device 70 of substrate exchange device 40 are installed, as a port section. The delivery of substrate P between an external device (not illustrated) such as, for example, a coater/developer and liquid crystal exposure apparatus 10 is performed at the port section. Substrate carry-in device 60 is used to carry a new substrate P before exposure from the port section to substrate holder 28. In contrast, substrate carry-out device 70 is used to carry substrate P that has been exposed from substrate holder 28 to the port section.

Further, the delivery of substrate P between the external device (not illustrated) and liquid crystal exposure apparatus 10 is performed by an external carrier device 100 that is disposed outside a chamber (not illustrated) that accommodates illumination system 12, mask stage device 14, projection optical system 16, substrate stage device 20, substrate exchange device 40 and the like described above. External carrier device 100 has a robot hand having a fork shape, and can place substrate P on the robot hand to convey substrate P from the external device to the port section in liquid crystal exposure apparatus 10 and convey substrate P from the port section to the external device.

Figure 4A:
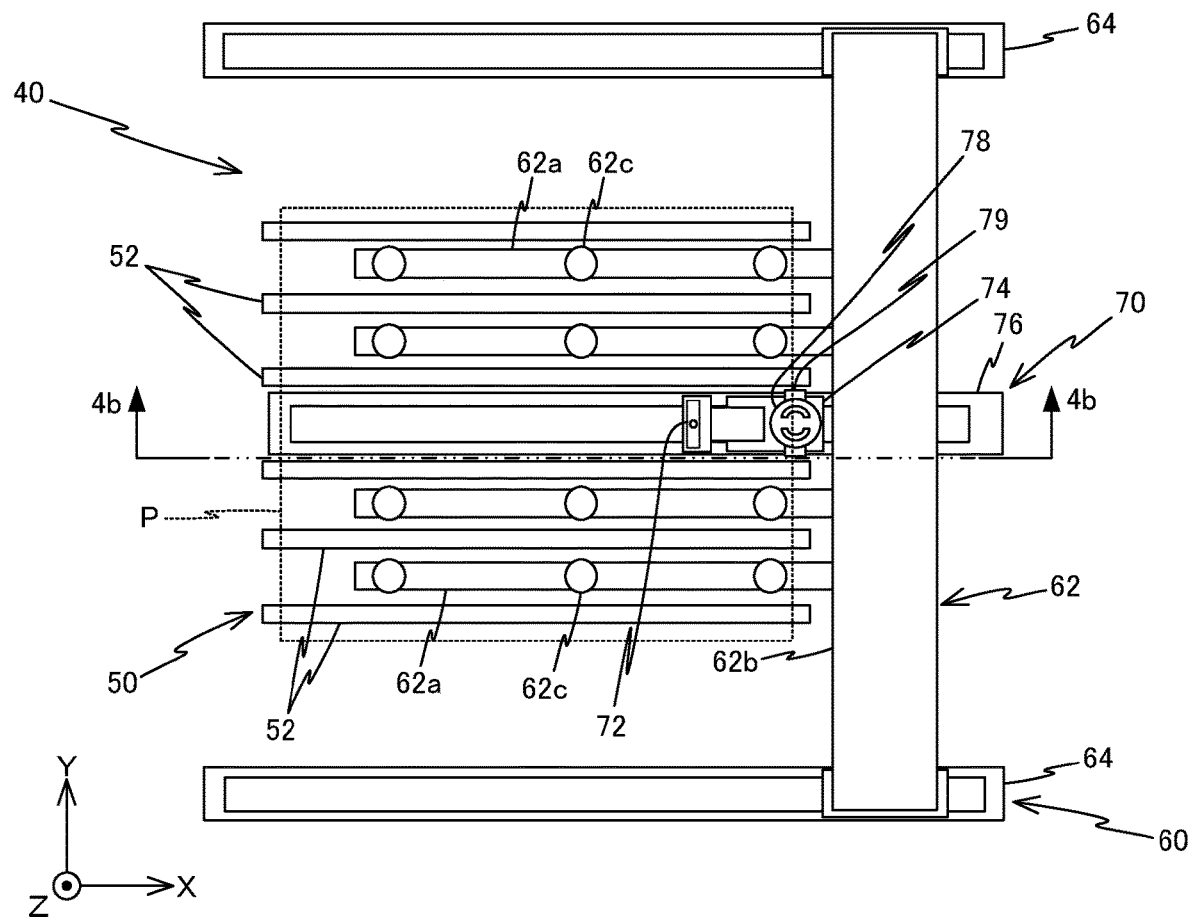
FIG. 4a is a plan view of the substrate exchange device.

As illustrated in in FIG. 4a, beam unit 50 has a plurality (e.g. six in the present embodiment) of balance beams 52 disposed at a predetermined distance in the Y-axis direction. Balance beams 52 include elongate air bearings extending parallel to the X-axis direction that serves as a carrying direction of substrate P at the time of substrate exchange. The distance between the plurality of balance beams 52 in the Y-axis direction is set, so that substrate P can be supported from below in good balance using the plurality of balance beams 52, and also, for example as illustrated in FIGS. 6a and 6b, when the fork hand of external carrier device 100 is placed above beam unit 50, the plurality of balance beams do not overlap a plurality of finger parts that the fork hand has in a vertical direction.

Referring back to FIG. 4a, the length of one balance beam 52 in the longitudinal direction (the X-axis direction) is set slightly longer than the length of substrate P in the longitudinal direction, and the length of one balance beam 52 in the width direction is set to, for example, around 1/50 of the length of substrate P in the width direction or around 10 to 50 times the thickness of substrate P.

Figure 4B:
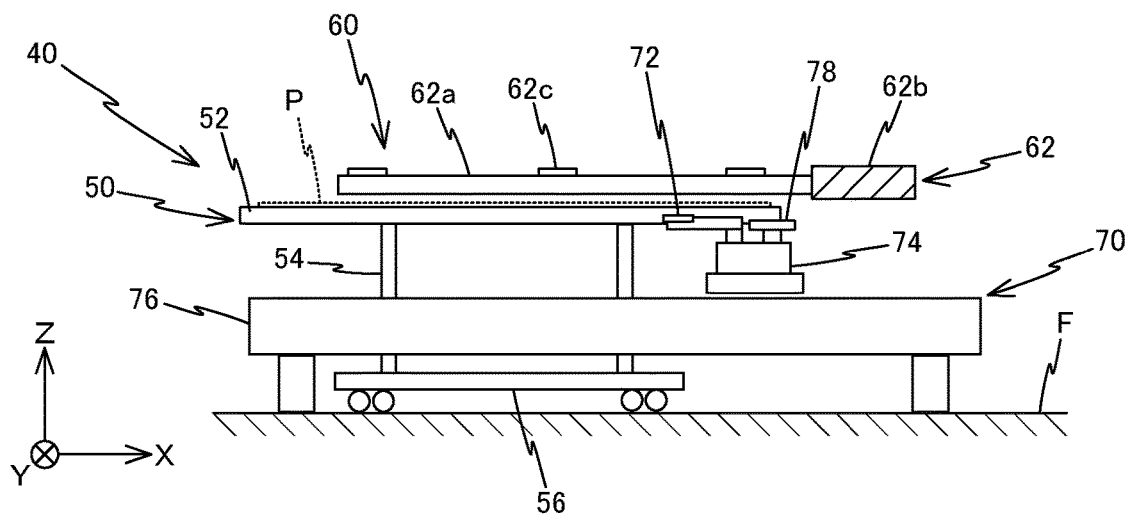

As illustrated in FIG. 4b, each of the plurality of balance beams 52 (which overlap each other in the depth direction of the page surface in FIG. 4b) is supported from below at the inner position than both end parts in the X-axis direction, by a plurality (e.g. two) of bar-like legs 54 extending in the Z-axis direction. The plurality of bar-like legs 54 that support each balance beam 52 have the lower end vicinity parts connected to each other by a base plate 56 (base plate 56 is not illustrated in FIG. 4a). In substrate exchange device 40, the plurality of balance beams 52 are integrally moved with a predetermined stroke in the X-axis direction, by driving base plate 56 with a predetermined stroke in the X-axis direction by an X actuator (not illustrated). Further, as illustrated in FIG. 1, the Z-position of the upper surfaces (the air bearing surfaces) of the plurality of balance beams are set to almost the same position (height) as the Z-position of the upper surface of substrate holder 28.

Referring back to FIG. 4a, substrate carry-in device 60 has a hand 62 having a fork shape (hereinafter, referred to as substrate carry-in hand 62) similarly to external carrier device 100 described above (see FIGS. 1 and 2). Substrate carry-in hand 62 has a plurality (e.g. four in the present embodiment) of finger parts 62a extending parallel to the X-axis direction that serves as the carrying direction of substrate P when substrate P is carried in from the port section to substrate holder 28. The plurality of finger parts 62a have the end vicinity parts on the +X side connected to each other by a connecting member 62b. On the other hand, the end parts on the −X side (the substrate holder 28 side (see the drawings such as FIG. 2)) of the plurality of finger parts 62a are free ends, and open to the substrate holder 28 side between the adjacent finger parts 62a.

Similarly to the robot hand of external carrier device 100 (see FIG. 2) described above, the disposition of finger parts 62a that substrate carry-in hand 62 has is set so that each finger part 62a does not overlap the plurality of balance beams 52 in position in the Y-axis direction in a planar view. Further, a plurality of support pads 62c for supporting the back surface of substrate P are attached to the upper surface of each finger part 62a. Connecting member 62b is made up of a thin hollow member having a rectangular shape in a planar view, and extends in the Y-axis direction that is a direction perpendicular to each finger part 62a (and balance beams 52 described above).

Both end vicinity parts of connecting member 62b in the Y-axis direction are each connected to an X-axis drive device for driving substrate carry-in hand 62 in the X-axis direction. Note that a pair of X-axis drive devices 64 may be each independently driven, or the pair of X-axis drive devices 64 may be mechanically connected by a gear or a belt and simultaneously driven by one drive motor. Further, although not illustrated, the pair of X-axis drive devices 64 are vertically movable by a Z-axis drive device. Therefore, substrate carry-in hand 62 is movable between a position (the +Z side) higher than the upper surfaces of balance beams 52 and a position (the −Z side) lower than balance beams 52. Note that if substrate carry-in hand 62 is structured capable of performing the vertical movement (±Z-axis direction) and the horizontal motion in a substrate carry-in direction (movement in ±X-axis direction), the disposition of X-axis drive devices 64 and the Z-axis drive device, for example, may be reversed disposition (the disposition of the Z-axis drive device over X-axis drive devices 64) to the foregoing disposition.

Substrate carry-out device 70 is disposed in a center part of the port section in the Y-axis direction. For example, of six balance beams 52 described above, three balance beams 52 are disposed on the +Y side of substrate carry-out device 70, and the other three balance beams 52 are disposed on the −Y side of substrate carry-out device 70. Further, for example, of four finger parts 62a of substrate carry-in hand 62 equipped in substrate carry-in device 60, two finger parts 62a are disposed on the +Y side of substrate carry-out device 70, and the other two finger parts 62a are disposed on the −Y side of substrate carry-out device 70. That is, substrate carry-out device 70, the plurality of finger parts 62a equipped in substrate carry-in hand 62, and the plurality of balance beams 52 are disposed so that their positions do not overlap one another in the Y-axis direction.

Substrate carry-out device 70 has, for example, one substrate carry-out hand 72. As illustrated in FIG. 4b, substrate carry-out hand 72 is attached to a Z-axis drive unit 74, and Z-axis drive unit 74 is mounted on an X-axis drive unit 76. Substrate carry-out hand 72 is capable of adsorbing and gripping (holding) substrate P using a vacuum suction force supplied from a vacuum device (not illustrated). Accordingly, substrate carry-out device 70 is capable of causing substrate carry-out hand 72 to adsorb and grip the lower surface of the end vicinity part on the +X side of substrate P from below and move substrate P in the X-axis direction. Referring back to FIG. 4a, the width (the size in the Y-axis direction) of substrate carry-out hand 72 is set slightly wider than the width (the size in the Y-axis direction) of one finger part 62a of substrate carry-in hand 62, and narrower than the distance between two balance beams 52 located in the center of, for example, six balance beams 52.

The drive stroke of substrate carry-out hand 72 by X-axis drive unit 76 is set longer than the length of substrate P in the X-axis direction, and equal to or slightly shorter than the length of balance beam 52 in the X-axis direction. As illustrated in FIG. 4b, X-axis drive unit 76 is installed at a position that is below the plurality of balance beams 52 and does not hinder movement of beam unit 50 (base plate 56) in the X-axis direction.

Further, substrate carry-out device 70 has an alignment pad 78 serving as an alignment device. Alignment pad 78 is attached to Z-axis drive unit 74 via a fine drive unit 79 (not illustrated in FIG. 4b). Substrate carry-out hand 72 and alignment pad 78 are integrally moved in the X-axis direction, while their drive controls in the Z-axis direction can be independently performed. Fine drive unit 79 finely drives alignment pad 78 in the Y-axis direction and the θz direction. Similarly to substrate carry-out hand 72 described above, alignment pad 78 is capable of adsorbing and gripping (holding) the lower surface of substrate P using a vacuum suction force supplied from a vacuum device (not illustrated). Accordingly, substrate carry-out device 70 is capable of causing alignment pad 78 to adsorb and grip the lower surface of the center part of substrate P from below and move substrate P with a long stroke (or a fine stroke) in the X-axis direction and finely move substrate P in the Y-axis direction and the θz direction.

Note that the configuration of substrate carry-out device 70 can be changed as needed. For example, a plurality of substrate carry-out hands 72 may be provided at a predetermined distance in the Y-axis direction. Further, substrate carry-out hand 72 and alignment pad 78 may be attached to X-axis drive units 76 that are independent. That is, for example, an X drive unit for alignment pad 78 may be disposed in the center part of the port section in the Y-axis direction, and another X drive unit for substrate carry-out hands 72 may be disposed on both sides in the Y-axis direction (the +Y side and the −Y side) of the X drive unit for alignment pad 78 so that the respective X drive units do not overlap the plurality of balance beams 52 in the Y-position. Further, the plurality of balance beams 52 that beam unit 50 has may be configured such that not only the movement in the X-axis direction but also the movement in the Z-axis direction can be performed. With this configuration, the height of balance beams 52 can be changed, to be matched with an operation at the time of delivering substrate P from/to external carrier device 100, or an operation at the time of delivering substrate P from/to substrate holder 28 (see FIG. 1).

Referring back to FIG. 1, substrate assist device 80 is a device that assists the operations of substrate carry-in device 60 and substrate carry-out device 70 on the substrate exchange. Further, substrate assist device 80 is also used to position substrate P when substrate P is placed on substrate holder 28.

As illustrated in FIGS. 3a and 3b, substrate stage device 20 has substrate assist device 80. Substrate assist device 80 is equipped with a pair of substrate carry-out bearer devices 82a and a pair of substrate carry-in bearer devices 82b. The pair of substrate carry-out bearer devices 82a assist (or help) the carry-out operation of substrate P by substrate carry-out device 70 (see the drawings such as FIG. 1) and the pair of substrate carry-in bearer devices 82b assist (or help) the carry-in operation of substrate P by substrate carry-in device 60 (see the drawings such as FIG. 1).

As illustrated in FIG. 3b, substrate carry-in bearer device 82b is equipped with a holding pad 84b, a Z actuator 86z and an X actuator 86x. As illustrated in FIG. 3a, a part of holding pad 84b of one substrate carry-in bearer device 82b (on the +Y side) is inserted in one cutout 28b (on the +Y side) of, for example, two cutouts 28b formed in substrate holder 28.

And, a part of holding pad 84b of the other substrate carry-in bearer device 82b (on the −Y side) is inserted in the other cutout 28b (on the −Y side).

Holding pad 84b is made up of a plate-like member having a rectangular shape in a planar view, and is capable of adsorbing and holding the lower surface of substrate P with a vacuum suction force supplied from a vacuum device (not illustrated).

As illustrated in FIG. 3b, holding pad 84b is drivable in the Z-axis direction by Z actuator 86z. Further, holding pad 84b and Z actuator 86z are drivable integrally in the X-axis direction by X actuator 86x attached to substrate table 24. Z actuator 86z includes a support column that supports holding pad 84b and the support column is disposed outside substrate holder 28. Holding pad 84b is movable between a position in contact with the lower surface of substrate P and a position separated from the lower surface of substrate P, by being driven in cutout 28b by Z actuator 86z. Further, holding pad 84b is drivable, by Z actuator 86z, with a long stroke between a position at which a part of holding pad 84b is accommodated in cutout 28b and a position higher than the upper surface of substrate holder 28. Further, holding pad 84b is movable in the X-axis direction by being driven integrally with Z actuator 86z by X actuator 86x.

The mechanical structure of substrate carry-out bearer device 82a is almost the same as that of substrate carry-in bearer device 82b described above. That is, as illustrated in FIG. 3b, substrate carry-out bearer device 82a is equipped with a holding pad 84a a part of which is inserted in cutout 28a, a Z actuator 86z for driving holding pad 84a in the Z-axis direction, and an X actuator 86x for driving holding pad 84a in the X-axis direction. Note that the movable amount in the X-axis direction of holding pad 84a of substrate carry-out bearer device 82a is set longer than the movable amount in the X-axis direction of holding pad 84b of substrate carry-in bearer device 82b. On the other hand, the movable amount in the Z-axis direction of holding pad 84a of substrate carry-out bearer device 82a may be shorter than the movable amount in the Z-axis direction of holding pad 84b of substrate carry-in bearer device 82b.

When substrate P (a substrate that has been exposed) is carried out from substrate holder 28, substrate assist device 80 assists as follows. First of all, the respective holding pads 84a of the pair of substrate carry-out bearer device 82a adsorb and hold, for example, two points of the end vicinity part on the +X side of substrate P on substrate holder 28. Next, in a state of maintaining the hold by adsorption of substrate P supported by levitation on substrate holder 28, substrate assist device 80 drives the pair of holding pads 84a only with a predetermined stroke (e.g. around 50 mm to 100 mm) in the X-axis direction (the +X direction). By this driving of holding pads 84a, substrate P is moved with a predetermined stroke relative to substrate holder 28 in the X-axis direction. With this operation, the pair of substrate carry-out bearer devices 82a assist the carry-out operation of substrate P by substrate carry-out device 70 described above (see the drawings such as FIG. 1).

Note that, although the details will be described later, substrate assist device 80 assists also when substrate P to be placed onto substrate holder 28 is carried in. The outline of this assist is described, referring to FIGS. 15 to 18 that will be described later. First of all, the respective holding pads 84b of the pair of substrate carry-in bearer device 82b adsorb and hold, for example, two points of the end vicinity part on the −X side of a substrate P₂ supported on substrate carry-in hand 62 (finger parts 62a) of substrate carry-in device 60 (FIG. 15). Next, when substrate carry-in hand 62 (finger parts 62a) is moved in the +X direction to go away from below substrate P₂, the pair of holding pads 84b, in a state of maintaining the a hold by adsorption of substrate P₂, moves only with a predetermined stroke in the Z-axis direction (the Z direction) (FIGS. 16 to 18). With this movement of holding pads 84b, substrate P₂ is placed onto substrate holder 28 (FIGS. 16 to 18). With this operation, the pair of substrate carry-in bearer devices 82b assist the carry-in operation of substrate P₂ by substrate carry-in device 60 described above (see the drawings such as FIG. 1).

Note that the configurations of substrate carry-out bearer devices 82a and substrate carry-in bearer devices 82b can be changed as needed. For example, although bearer devices 82a and 82b are each attached to substrate table 24 in the present embodiment, the member to which the bearer devices are attached is not limited thereto, and for example, bearer devices 82a and 82b may be attached to substrate holder 28, or to an XY stage device (not illustrated) for driving substrate table 24 in the XY plane. Further, the positions and the number of bearer devices 82a and 82b are not limited to those described above, and for example, bearer devices 82a and 82b may be attached to the side surface on the +Y side and the side surface on the −Y side of substrate table 24.

In liquid crystal exposure apparatus 10 (see FIG. 1) configured as described above, under the control of a main controller (not illustrated), mask M is loaded onto mask stage device 14 by a mask loader (not illustrated) and also substrate P is loaded onto substrate holder 28 by substrate exchange device 40. After that, the main controller implements alignment measurement using an alignment detection system (not illustrated), and after the alignment measurement has been completed, an exposure operation of a step-and-scan method is sequentially performed with respect to a plurality of shot areas set on substrate P. Since this exposure operation is similar to an exposure operation of a step-and-scan method that has conventionally been performed, the detailed explanation will be omitted here. Then, substrate P to which the exposure processing has been completed is carried out from substrate holder 28 by substrate exchange device 40, and another substrate P to be exposed next is carried to substrate holder 28, and thereby the exchange of substrate P on substrate holder 28 is performed, and the exposure operation and the like are continuously performed with respect to a plurality of substrates P.

The exchange operation of substrate P (for the sake of convenience, a plurality of substrates P are assumed to be a substrate P₁, substrate P₂ and a substrate P₃) on substrate holder 28 in liquid crystal exposure apparatus 10 will be described below, using FIGS. 5a to 21b. The substrate exchange operation as below is performed under the control of a main controller (not illustrated). Note that, in the respective side views (such as FIGS. 5b and 6b) for explaining the substrate exchange operation, the illustration of balance beams 52, finger parts 62a of substrate carry-in hand 62 and X-axis drive device 64 (see FIG. 4b for each of them) that are located on the further −Y side than (on the front side of) substrate carry-out device 70 is omitted, in order to facilitate the understanding of the operations of substrate carry-out device 70.

Further, in the description below, substrate P₁ that has been exposed is placed beforehand on substrate holder 28 of substrate stage device 20, and the operation of carrying out substrate P₁ that has been exposed and then placing a new substrate P₂ (different from substrate P₁) onto substrate holder 28 will be described. Further, before the substrate exchange operation, substrate carry-in hand 62 and beam unit 50 that substrate exchange device 40 has are assumed to be positioned so that the X-position of connecting member 62b and the X-positions of the plurality of balance beams 52 do not overlap each other, as illustrated in FIGS. 4a and 4b.

Figure 5A:
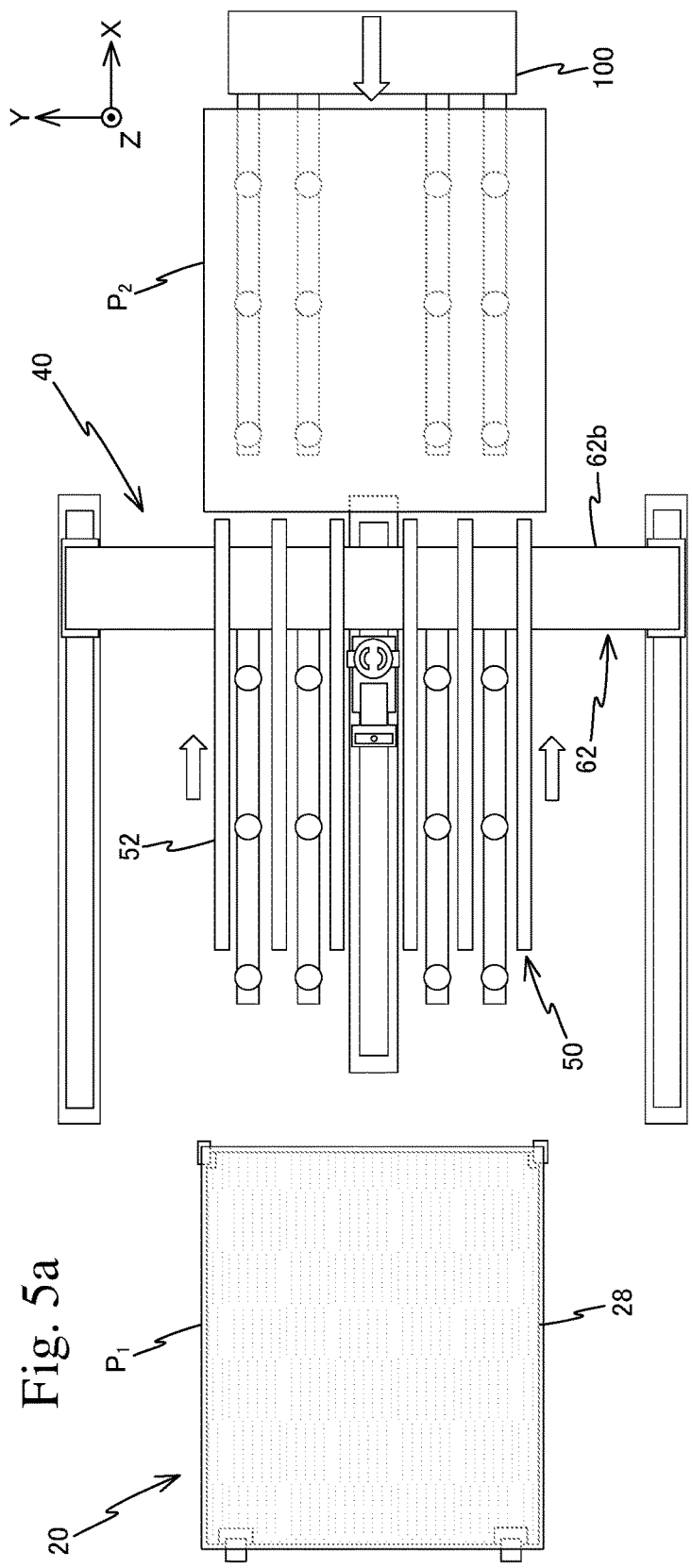
FIGS. 5a and 5b are a plan view and a side view of the liquid crystal exposure apparatus, respectively, for explaining a substrate exchange operation (No. 1).
Figure 5B:
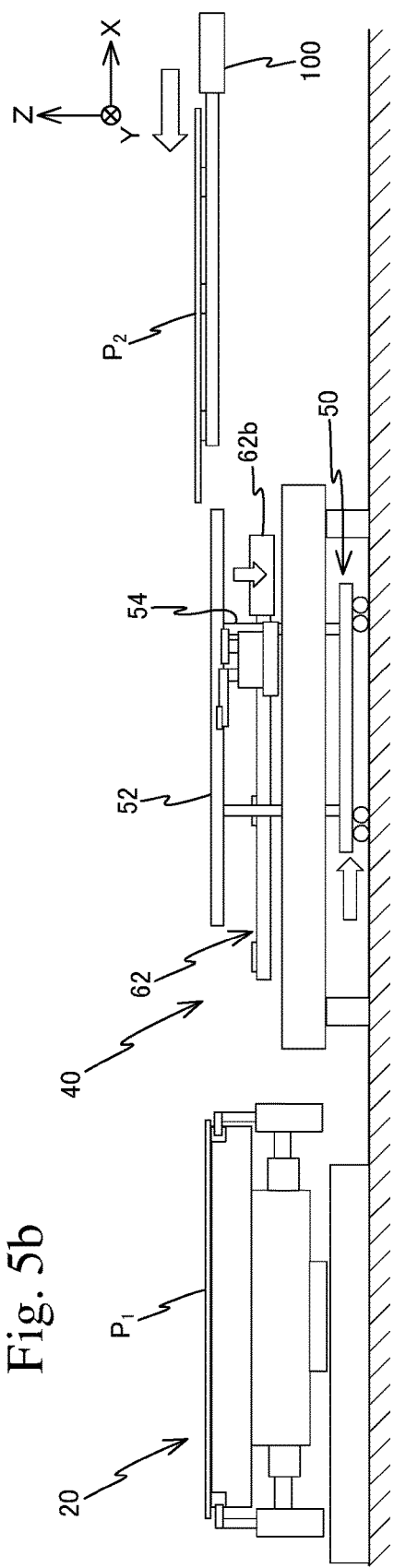

As illustrated in FIGS. 5a and 5b, when the new substrate P₂ is conveyed by external carrier device 100 to the port section (for the operations of the respective elements, see arrows in the respective drawings. The same is true for the other drawings referred to below), substrate exchange device 40 lowers (−Z-drives) the substrate carry-in hand and positions the upper surface of substrate carry-in hand 62 lower than the lower surface of the plurality of balance beams 52. On this operation, the Z-position of the highest part of substrate carry-in hand 62 including connecting member 62b (the part whose +Z position is highest, for example, the upper surface of connecting member 62b) is set so that a clearance, which allows for the insertion of the robot hand of external carrier device 100, is formed in the Z-axis direction between the lower surfaces of the plurality of balance beams 52 and the highest part of substrate carry-in hand 62.

Further, beam unit 50 is driven in the +X direction. On this operation, beam unit 50 is stopped at a position in which leg 54 on the +X side is not in contact with connecting member 62b of substrate carry-in hand 62. Accordingly, parts (the end vicinity parts on the +X side) of the plurality of balance beams 52 are located above (on the +Z side of) connecting member 62b of substrate carry-in hand 62. For beam unit 50, this position serves as a substrate delivery position with external carrier device 100.

Next, as illustrated in FIGS. 6a and 6b, the robot hand of external carrier device 100 on which substrate P₂ is placed is moved in the −X direction and positions substrate P₂ in a space above (on the +Z side of) the plurality of balance beams 52. On this operation, the Y-position of the robot hand of external carrier device 100 is set so that each finger part having a fork shape of the robot hand that external carrier device 100 has passes between (does not come into contact with) a pair of adjacent balance beams 52.

Further, as illustrated in FIGS. 7a and 7b, the robot hand of external carrier device 100 is lowered, thereby delivering substrate P₂ onto the plurality of balance beams 52. The Z-position of the robot hand of external carrier device 100 is controlled so that the robot hand does not come into contact with substrate carry-in hand 62 that stands-by below balance beams 52. On this operation, the end vicinity part on the +X side of substrate P₂ protrudes to the further +X side than the end parts on the +X side of the plurality of balance beams 52. After that, the robot hand of external carrier device 100 is driven in the +X direction, thereby leaving the port section (the inside of the liquid crystal exposure apparatus).

Further, in substrate exchange device 40, alignment pad 78 of substrate carry-out device 70 is driven in the −X direction below substrate P₂, and is positioned at a position facing the center part of substrate P₂. In this state, alignment pad 78 is driven upward (in the +Z direction), and adsorbs and grips the lower surface of substrate P₂ between a pair of balance beams 52 in the center.

After that, as illustrated in FIGS. 8a and 8b, the pressurized gas is supplied to each of the plurality of balance beams 52 of beam unit 50, and the pressurized gas is jetted from the upper surface of each of the plurality of balance beams 52 toward the lower surface of substrate P₂. Accordingly, substrate P₂ is levitated via a minute gap (e.g., of several tens micrometers to several hundreds micrometers) with respect to the plurality of balance beams 52.

Here, in substrate exchange device 40, a pre-alignment operation is performed on the plurality of balance beams 52. The pre-alignment operation is performed while the position of substrate $P_2$ is measured in a noncontact manner by substrate position measurement devices (not illustrated) that are disposed, for example, in a space above substrate $P_2$ and below substrate $P_2$, respectively. On the pre-alignment operation, alignment pad 78 that adsorbs and grips the center part of the lower surface of substrate $P_2$ is finely driven as needed in the X-axis direction, the Y-axis direction and the θz direction (directions in three degrees of freedom within the horizontal plane). Since substrate $P_2$ is supported in a noncontact manner by the plurality of balance beams 52, the position correction (fine positioning) of substrate $P_2$ in the directions of three degrees of freedom within the horizontal plane can be performed with low friction. Further, in parallel with this pre-alignment operation, alignment pad 78 is driven in the −X direction and substrate $P_2$ is moved to the center part of the substrate placing surface formed by the plurality of balance beams 52.

Figure 9A:
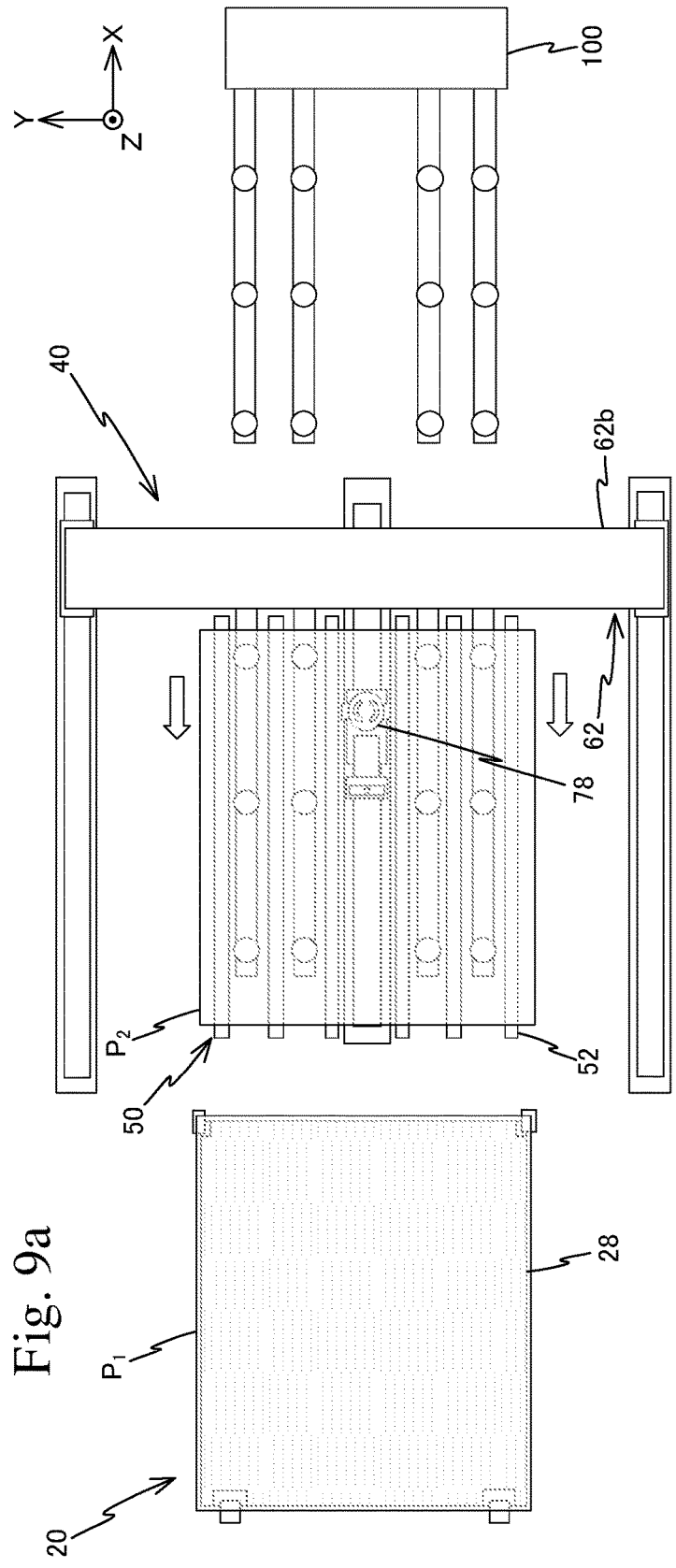
FIGS. 9a and 9b are a plan view and a side view of the liquid crystal exposure apparatus, respectively, for explaining a substrate exchange operation (No. 5).
Figure 9B:
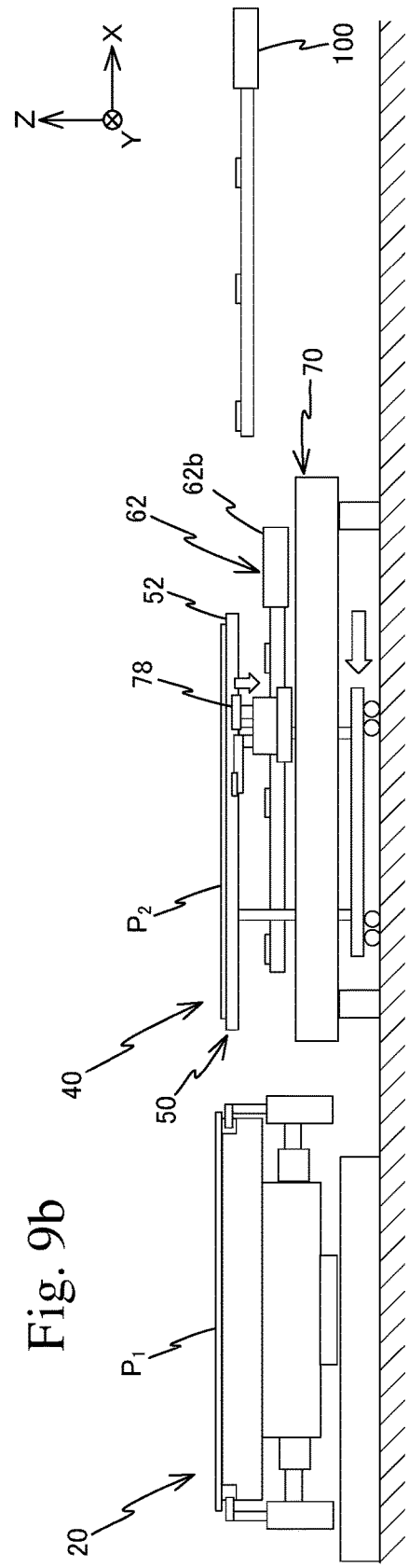

After that, as illustrated in FIGS. 9*a* and 9*b*, the supply of the pressurized gas to the plurality of balance beams 52 is stopped and also the supply of the vacuum suction force to alignment pad 78 is stopped. Further, alignment pad 78 is driven downward so that alignment pad 78 is separated from the lower surface of substrate $P_2$. With this operation, substrate $P_2$ is placed on the plurality of balance beams 52. In this state, beam unit 50 is driven in the −X direction (to the substrate stage device 20 side). On this operation, substrate $P_2$ and the plurality of balance beams are positioned so that the end parts on the +X side do not overlap in the X-axis direction (do not overlap in the vertical direction) connecting member 62*b* of substrate carry-in hand 62.

In this state, as illustrated in FIGS. 10*a* and 10*b*, substrate carry-in hand 62 is driven upward. Accordingly, substrate $P_2$ on the plurality of balance beams 52 is scooped out from below to above by substrate carry-in hand 62 (delivered to substrate carry-in hand 62).

Further, in parallel with the foregoing delivery operation of substrate $P_2$ from external carrier device 100 to substrate carry-in hand 62 via beam unit 50 (including the pre-alignment operation), substrate table 24 is drive in the +X direction so that substrate holder 28 on which substrate $P_1$ that has been exposed is located at the substrate exchange position (the substrate delivery position) in substrate stage device 20. In the present embodiment, the substrate exchange position is a position on the −X side of the port section. Note that, although substrate holder 28 is illustrated to be at the same position in FIGS. 5*a* to 9*b* in order to facilitate the understanding, actually the exposure operation with respect to substrate $P_1$ is performed in parallel with the foregoing delivery operation of substrate $P_2$ from external carrier device 100 to substrate carry-in hand 62, and substrate holder 28 is moved within the XY plane.

Further, in parallel with the movement operation of substrate holder 28 to the substrate exchange position, holding pad 84*a* of each of the pair of substrate carry-out bearer devices 82*a* disposed on the +X side of substrate holder 28 is driven upward. Holding pads 84*a* adsorb and grip, from the back surface, a part (a part placed on cutout 28*a* (see FIGS. 3*a* and 3*b*)) of substrate $P_1$ held by vacuum adsorption on the upper surface of substrate holder 28.

Figure 11A:
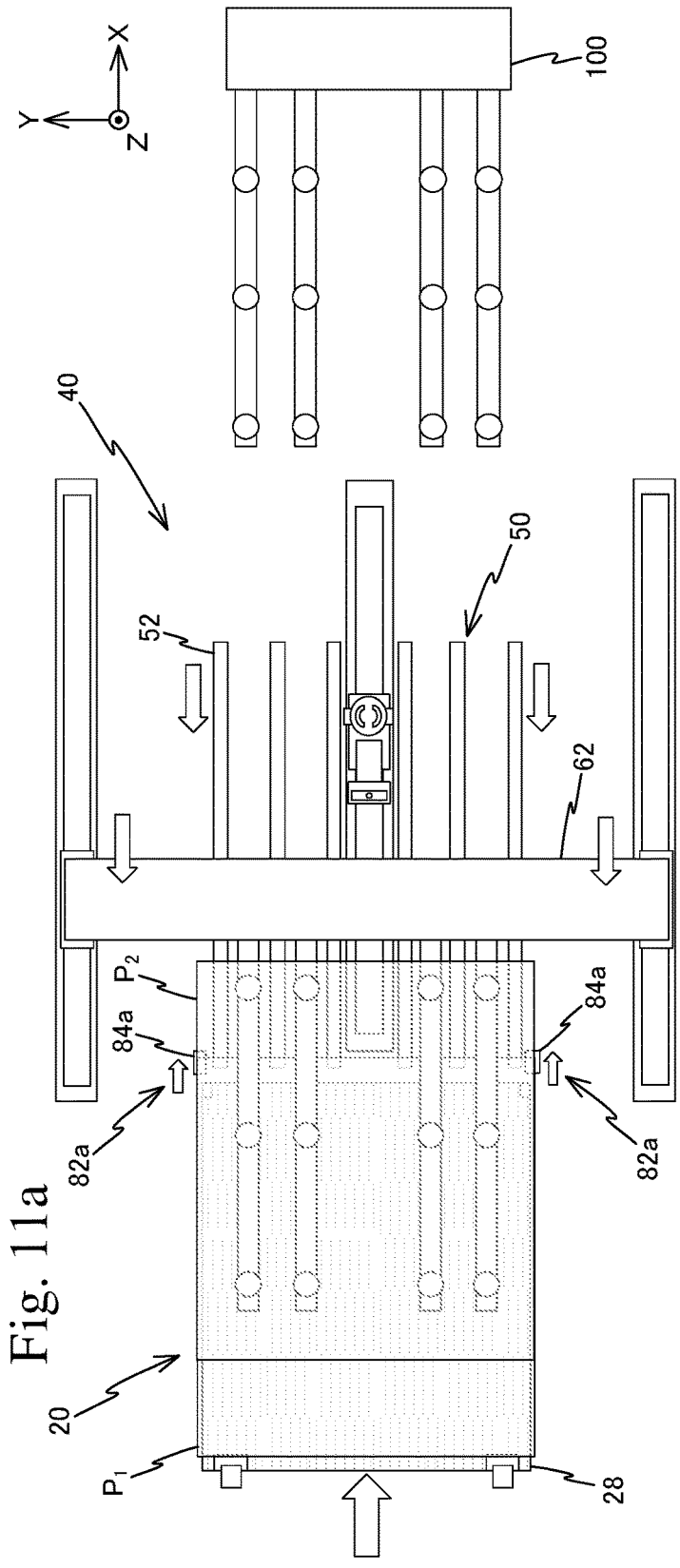
FIGS. 11a and 11b are a plan view and a side view of the liquid crystal exposure apparatus, respectively, for explaining a substrate exchange operation (No. 7).
Figure 11B:
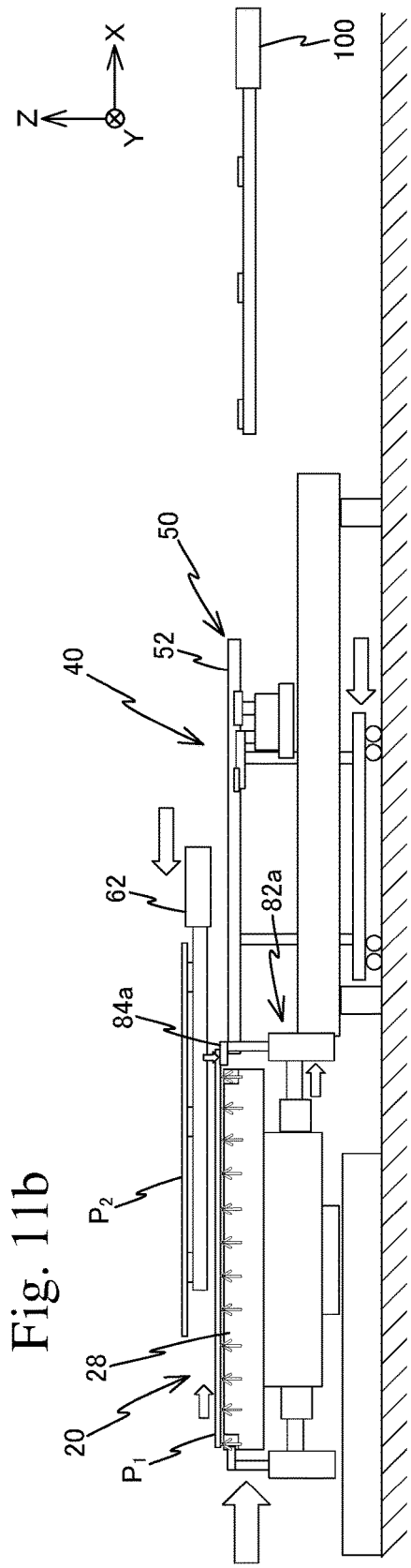

After that, as illustrated in FIGS. 11*a* and 11*b*, substrate carry-in hand 62 supporting substrate $P_2$ from below is driven in the −X direction. With this operation, substrate $P_2$ is carried toward a space above substrate holder 28 positioned at the substrate exchange position. Further, in substrate exchange device 40, beam unit 50 is driven in the −X direction (a direction for coming close to substrate holder 28). Beam unit 50 is stopped at a predetermined position so that the end part on the −X side of each of the plurality of balance beams 52 and substrate holder 28 do not come into contact with each other. As is described above, the Z-position of the upper surface of each of the plurality of balance beams 52 and the Z-position of the upper surface of substrate holder 28 are set to almost the same height. Note that these Z-positions may be adjusted to be almost the same height by driving substrate holder 28 in the Z-axis direction.

Further, in substrate stage device 20, the pressurized gas is jetted from the upper surface of substrate holder 28 to the lower surface of substrate $P_1$. Accordingly, substrate $P_1$ is levitated from the upper surface of substrate holder 28, and the friction between the lower surface of substrate $P_1$ and the upper surface of substrate holder 28 is reduced to the level that can be ignored (the lower friction state).

Moreover, in substrate stage device 20, holding pads 84*a* of substrate carry-out bear devices 82*a* are slightly driven upward in the +Z direction so as to follow the foregoing levitation operation of substrate $P_1$, and are also driven in the +X direction (to the port section side) with a predetermined stroke in a state of adsorbing and gripping the part of substrate $P_1$. Although the movement amount of holding pads 84*a* (i.e. substrate $P_1$) is different depending on the size of substrate $P_1$, the movement amount is set to, for example, around 50 mm to 100 mm. With this operation, the end vicinity part on the +X side of substrate $P_1$ protrudes (overhangs) from the end part on the +X side of substrate holder 28 to the +X direction (to the port section side). Here, the foregoing part of substrate $P_1$ protruding from substrate holder 28 is supported from below by the end vicinity parts on the −X side of the plurality of balance beams 52, and therefore it is favorable that the pressurized gas is jetted beforehand also from balance beams 52 when substrate $P_1$ is caused to overhang.

As illustrated in FIGS. 12*a* and 12*b*, substrate carry-in hand 62 supporting substrate $P_2$ from below is stopped at a predetermined position in a space above substrate holder 28. At this stop position, substrate $P_2$ is located almost directly above substrate holder 28 positioned at the substrate exchange position. Further, substrate stage device 20 performs the positioning of substrate holder 28 so that the Y-position of substrate $P_1$ and the Y-position of substrate $P_2$ almost coincide with each other. However, the X-position of substrate $P_1$ and the X-position of substrate $P_2$ are different at the stop position described above, by the quantity overhanging from substrate holder 28, of the end vicinity part on the +X side of substrate $P_1$, and the end part on the −X side of substrate $P_2$ protrudes to the −X side compared to the end part on the −X side of substrate $P_1$.

In parallel with the positioning of substrate carry-in hand 62, in substrate carry-out device 70, substrate carry-out hand 72 is driven in the −X direction and is positioned below the part of substrate $P_1$ overhanging from substrate holder 28 to the +X side. Furthermore, in substrate stage device 20, holding pad 84*b* of each of the pair of substrate carry-in bearer devices 82*b* is driven upward with a predetermined stroke (e.g. 50 mm to 100 mm).

As illustrated in FIGS. 13*a* and 13*b*, holding pads 84*b* of substrate carry-in bearer devices 82*b* come into contact with substrate $P_2$ on substrate carry-in hand 62, from below, that stands-by above substrate holder 28, and adsorb and hold the end vicinity part on the −X side of substrate $P_2$.

Further, in parallel with the adsorbing and holding operation of substrate $P_2$ by holding pads 84b, in substrate carry-out device 70, substrate carry-out hand 72 is driven upward, and grips by vacuum adsorption the part, overhanging from substrate holder 28 to the +X side, of substrate $P_1$ that has been exposed, from the back surface. Further, when substrate carry-out hand 72 adsorbs and grips substrate $P_1$, the supply of the vacuum suction force to holding pad 84a of each of the pair of substrate carry-out bearer devices 82a is stopped. Accordingly, the adsorbing and gripping of substrate $P_1$ by holding pads 84a is released. Holding pads 84a are driven and lowered so as to be separated from the back surface of substrate $P_1$.

Note that, in the present embodiment, in order for substrate carry-out hand 72 to adsorb and grip, from the back surface, the center part of the end vicinity part on the +X side of substrate $P_1$ that has been exposed, substrate $P_1$ is caused to overhang (offset) from substrate holder 28 using substrate carry-out bearer devices 82a, but this is not intended to be limiting, and a cutout that is open to the +Z side and the +X side may be formed at the end vicinity part on the +X side of the upper surface of substrate holder 28 and substrate carry-out hand 72 may be inserted in the cutout, and thereby substrate carry-out hand 72 may adsorb and grip substrate $P_1$ without offsetting substrate $P_1$.

After that, as illustrated in FIGS. 14a and 14b, substrate carry-out hand 72 is driven in the +X direction in a state of holding substrate $P_1$. With this operation, substrate $P_1$ is moved from substrate holder 28 onto beam unit 50 (the plurality of balance beams 52). On this operation, the pressurized gas is jetted from the upper surface of each of the plurality of balance beams 52. Accordingly, substrate $P_1$ is levitated and carried in a noncontact state (except for the part held by substrate carry-out hand 72) on substrate holder 28 and beam unit 50. Further, holding pads 84a of the pair of substrate carry-out bearer devices 82a are driven in the −X direction so that parts of holding pads 84a are accommodated in cutouts 28a (see FIGS. 3a and 3b) of substrate holder 28.

Further, in parallel with the foregoing carry-out operation of substrate $P_1$ from substrate holder 28 by substrate carry-out hand 72, in substrate carry-in device 60, support pads 62c of substrate carry-in hand 62 jet the pressurized gas to the lower surface of substrate $P_2$. Accordingly, substrate $P_2$ comes into a levitated (or semi-levitated) state on substrate carry-in hand 62.

FIGS. 15a and 15b show a state where substrate $P_1$ is completely carried out (delivered) from substrate holder 28 onto beam unit 50 by substrate carry-out hand 72. Here, even after substrate $P_1$ is carried out from substrate holder 28, substrate holder 28 continues to jet the pressurized gas.

In parallel with this carry-out operation of substrate $P_1$, in substrate carry-in device 60, substrate carry-in hand 62 is driven in the +X direction with a high velocity and a high acceleration (e.g. 1G or more) and is withdrawn from below substrate $P_2$. When substrate carry-in hand 62 is withdrawn from below substrate $P_2$, substrate $P_2$ is left above substrate holder 28 because the end vicinity part on the −X side of substrate $P_2$ is adsorbed and gripped by a pair of holding pads 84b.

Then, as illustrated in FIGS. 16a and 16b, when substrate carry-in hand 62 is completely withdrawn from below substrate $P_2$, substrate $P_2$ starts free fall due to the gravity (the self-weight) except for the part adsorbed and gripped by holding pads 84b. On this operation, sudden drop of substrate $P_2$ is hindered by air resistance between the back surface of substrate $P_2$ and the upper surface of substrate holder 28, and therefore, substrate $P_2$ falls on substrate holder 28 slowly (with an acceleration smaller than the gravitational acceleration). Further, in parallel with the fall operation of substrate $P_2$, the respective holding pads 84b of the pair of substrate carry-in bearer devices 82b are simultaneously lowered (moved in the −Z direction).

The means of lowering holding pads 84b is not particularly limited, and for example, position control in the Z-axis direction may be performed using a drive device such as a motor, or burden control in the Z-axis direction (e.g. control that causes a force of moving holding pads 84b upward against the gravity force (a force in the +Z direction) to be smaller than a downward direction due to the self-weight of substrate P (a force in the −Z direction)) may be performed using an air cylinder or the like. Further, holding pads 84b are caused to fall freely together with substrate $P_2$, by releasing (nulling) a force in the +Z direction acting on holding pads 84b of substrate carry-in bearer devices 82b, after adsorbing and gripping the back surface of substrate $P_2$.

In parallel with the foregoing carry-in operation of substrate $P_2$ using substrate carry-in bearer devices 82b, each of the plurality of balance beams 52 stops the jet of the pressurized gas. Further, substrate carry-out device 70 releases the hold by adsorption of substrate $P_1$ with substrate carry-out hand 72 (not illustrated in FIG. 16a), and also drives and lowers substrate carry-out hand 72 to be separated from the back surface of substrate $P_1$. With this operation, substrate $P_1$ is placed on the plurality of balance beams 52. Further, also after delivering substrate $P_2$ to substrate holder 28, substrate carry-in hand 62 is driven to the +X direction (the substrate carry-in hand may be decelerated after being withdrawn from below substrate $P_2$).

Figure 22:
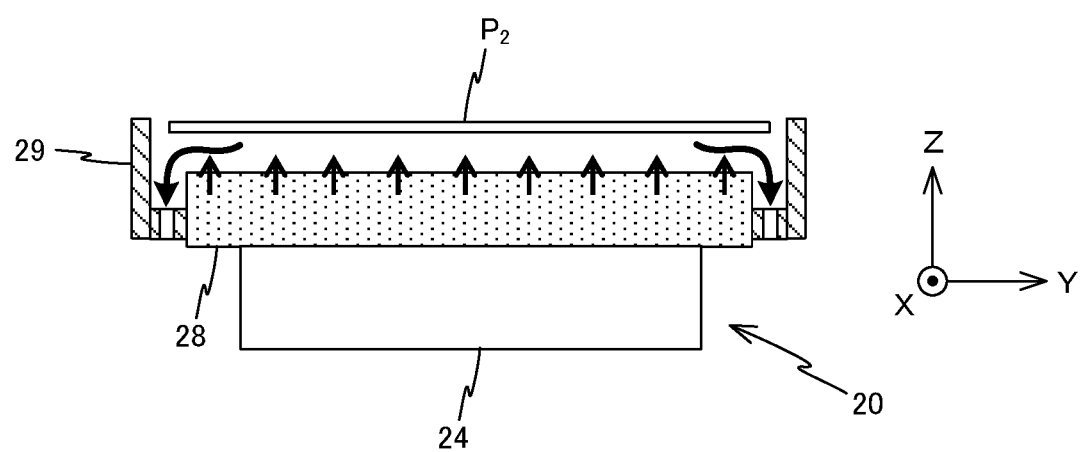
FIG. 22 is a view showing a modified example of the first embodiment.

Note that, on the foregoing carry-in operation (free fall) of substrate $P_2$ to substrate holder 28, as illustrated in FIG. 22, a frame-shaped member 29 (or a control wall) that surrounds the outer periphery of substrate holder 28 and has the height position (the position in the Z-axis direction) set higher than the upper surface of substrate holder 28 may be disposed, thereby preventing air between substrate $P_2$ and substrate holder 28 to escape and adjusting the falling velocity of substrate $P_2$.

FIGS. 17a and 17b show a state where the respective holding pads 84b of the pair of substrate carry-in bearer devices 82b are lowered, and the parts thereof are inserted in cutouts 28b (see FIG. 3a) of substrate holder 28. Here, substrate $P_2$ (except for the parts gripped by holding pads 84b) naturally falls due to the self-weight onto substrate holder 28, but the pressurized gas is jetted from the upper surface of substrate holder 28 and the back surface of substrate $P_2$ that has been lowered does not come into contact with the upper surface of substrate holder 28 by the static pressure of the pressurized gas. Accordingly, a state where substrate $P_2$ is levitated above substrate holder 28 via a minute gap.

In this state, the position of substrate $P_2$ relative to substrate stage device 20 (or substrate holder 28) is measured with a substrate position measurement device (not illustrated) provided at substrate stage device 20 (substrate holder 28 or substrate table 24) or provided external to substrate stage device 20. On the basis of the measurement result, the respective holding pads 84b of the pair of substrate carry-in bearer devices 82b are independently driven in the X-axis direction. With this operation, the position of substrate $P_2$ relative to substrate stage device 20 (or substrate holder 28) in the X-axis direction and the ez direction is corrected.

In parallel with the foregoing position correction operation (the fine alignment operation) of substrate $P_2$, in the port section, beam unit 50 on which substrate $P_1$ is placed is driven in the +X direction and also alignment pad 78 of substrate carry-out device 70 is driven in the −X direction to be positioned at a position facing the center of substrate $P_1$.

After that, as illustrated in FIGS. 18a and 18b, the jet of the pressurized gas from substrate holder 28 is stopped and substrate $P_2$ lands on (comes into contact with) the upper surface of substrate holder 28. In this manner, in the present embodiment, the accurate positioning (the fine alignment) of substrate $P_2$ is performed in a low friction (levitated) state immediately before landing substrate $P_2$ on substrate holder 28, and therefore, it is not necessary to take into account the falling (landing) position and/or the attitude of substrate $P_2$ when substrate $P_2$ falls, and in addition, there is no risk that it becomes necessary to perform the re-placement (re-loading) of substrate $P_2$ after the landing of substrate $P_2$.

Further, since the falling operation of substrate $P_2$ is tentatively stopped at a position in a space above substrate holder 28, with a minute gap (e.g. of several tens micrometers to several hundreds micrometers) formed between substrate $P_2$ and substrate holder 28, the local air stagnation is prevented from generating between substrate $P_2$ and substrate holder 28. Consequently, when causing substrate holder 28 to hold substrate $P_2$, the deformation of substrate $P_2$ can be suppressed. Note that, when substrate $P_2$ is placed onto substrate holder 28, the deformation of substrate $P_2$ may be suppressed by controlling the location or the time of stopping the jet of the pressurized gas from substrate holder 28, and further by using together the vacuum suction of substrate $P_2$ from substrate holder 28.

Note that, in substrate carry-in bearer devices 82b, holding pads 84b may be configured finely drivable in the Y-axis direction so that the positioning (the fine alignment) in the Y-axis direction of substrate $P_2$ to be carried in, relative to substrate holder 28 can be performed. Further, in the present embodiment, holding pads 84b are configured to be driven only in the X-direction within the horizontal plane, but actually holding pads 84b are capable of being finely displaced in the θz direction and the Y-axis direction relative to the support column of Z actuator 86z (see FIG. 3b) by an elastic deformation or the like so that substrate $P_2$ is finely rotatable in the θz direction, though not illustrated.

In substrate stage device 20, when substrate $P_2$ is placed onto substrate holder 28, substrate holder 28 adsorbs and holds substrate $P_2$ and moves to a predetermined exposure starting position. The description of an operation of substrate stage device 20 on the exposure operation with respect to substrate $P_2$ will be omitted.

Further, in parallel with the foregoing adsorbing and holding operation of substrate $P_2$ by substrate holder 28, in substrate carry-out device 70, alignment pad 78 is driven upward, and adsorbs and grips the center part of the back surface of substrate $P_1$ from below. Further, when alignment pad 78 adsorbs and grips substrate $P_1$, the pressurized gas is jetted from each of the plurality of balance beams 52, and accordingly substrate $P_1$ is levitated on the plurality of balance beams 52. After that, substrate $P_1$ is moved to the substrate exchange position with respect to external carrier device 100 by driving alignment pad 78 in the +X direction. On this operation, the position within the horizontal plane (the position in the X-axis direction and the Y-axis direction and the attitude in the θz direction) of substrate $P_1$ may be corrected by alignment pad 78, in a predetermined location.

FIGS. 19a and 19b show a state where substrate $P_1$ is positioned at the substrate exchange position with respect to external carrier device 100. At the substrate exchange position, alignment pad 78 of substrate carry-out device 70 releases the hold by adsorption of substrate $P_1$, and is driven downward to be separated from substrate $P_1$.

After that, the robot hand of external carrier device 100 is moved in the −X direction at the height position lower than the upper surfaces of the plurality of balance beams 52, and is raised to scoop out substrate $P_1$, on the plurality of balance beams 52, from below. The plurality of balance beams 52 stop the jet of the pressurized gas.

As illustrated in FIGS. 20a and 20b, the robot hand of external carrier device 100 holding substrate $P_1$ that has been exposed is moved in the +X direction to leave the port section. In the port section, in order to avoid the contact with substrate carry-in hand 62, beam unit 50 (the plurality of balance beams 52) is moved in the −X direction, and then substrate carry-in hand 62 is driven downward.

After substrate $P_1$ that has been exposed is delivered to, for example, an external device (not illustrated) such as, for example, a coater/developer, the robot hand of external carrier device 100 holds substrate $P_3$ to be exposed next to substrate $P_2$, and is moved toward the port section, as illustrated in FIGS. 21a and 21b. Further, in the port section, substrate carry-in hand 62 is moved to below the plurality of balance beams 52, and the plurality of balance beams 52 are moved in the +X direction and are positioned at the substrate receipt position for receiving substrate $P_3$ from the robot hand of external carrier device 100. Accordingly, the state returns to the initial state as illustrated in FIGS. 5a and 5b.

According to the present embodiment described so far, substrate P to be carried in is carried onto substrate stage device 20 by freely falling substrate P, and therefore the apparatus configuration is simple, compared to the case of using, for example, a device (e.g., a lift pin device or the like) for receiving substrate P from substrate carry-in device 60. Further, since the operations of movable members on the substrate delivery operation from substrate carry-in device 60 to substrate holder 28 are fewer, it becomes possible to swiftly perform the carry-in of substrate P. Further, since the dust generation can be suppressed, compared to the case of, for example, using the lift pin device or the like, the adhesion of dust to substrate P can be suppressed.

Further, in substrate stage device 20, a hole part (or a recessed part) for accommodating a device such as, for example, the lift pin device used to receive substrate P from substrate carry-in device 60, or a member (such as a so-called substrate tray) on which substrate P is placed on the carriage of substrate P does not have to be formed at substrate holder 28. Consequently, almost the entire surface of the upper surface of substrate holder 28 can be flattened except for minute hole parts for jetting gas and suctioning gas. Accordingly, the flatness correction of substrate P placed on substrate holder 28 can be reliably performed, and the exposure accuracy is improved. Further, since the hole part or the recessed part does not have to be formed on substrate holder 28, the change in reflectivity and in reflection quantity of exposure beams caused by the hole part or the recessed part can be suppressed. Consequently, uneven transfer of the mask pattern with respect to substrate P can be suppressed.

Further, when substrate P to be carried in is fallen freely, the position of substrate P within the horizontal plane is constrained by the pair of substrate carry-in bearer devices 82b provided separately from substrate carry-in device 60 that has supported substrate P on the substrate carry-in, and therefore, the positional shift of substrate P within the horizontal plane due to influence of the air resistance on the free fall can be suppressed. Consequently, substrate P can be fallen on substrate holder 28 without fail.

Further, before substrate P is placed onto substrate holder 28, the free fall of substrate P is stopped once, and therefore, the generation of the so-called air stagnation between substrate P and substrate holder 28 and the deformation of substrate P caused by the air stagnation can be suppressed when causing substrate holder 28 to adsorb and hold substrate P. Further, when causing substrate P to fall onto substrate holder 28, substrate holder 28 functions like an air bearing, the impact on the falling can be suppressed.

Further, before substrate P is placed onto substrate holder 28, the positioning of the substrate with respect to substrate holder 28 is performed by the pair of substrate carry-in bearer devices 82b, and therefore, the possibility can be reduced that it becomes necessary to perform the re-placement (re-loading) of substrate P once placed on substrate holder 28 (e.g. due to the shift of the placement position). Consequently, the carry-in operation velocity of substrate P is improved, and the overall throughput is improved.

Further, in recent years, the weight and the thickness of substrate P have tended to be reduced. Substrate P is made thinner and lighter in weight, which decreases a downward force in the gravity direction acting on substrate P, and therefore, the impact applied when substrate P is caused to freely fall by the self-weight and delivered to substrate holder 28 can be reduced. In this manner, substrate exchange device 40 in the present embodiment is particularly suitable for the exchange of a large size substrate P that is made thinner and lighter in weight. Note that, in the present embodiment, the sudden drop of substrate P is suppressed by air resistance acting on substrate P on the falling, and thus the impact applied when substrate P is placed onto substrate holder 28 is suppressed, and therefore it is preferable that the upper surface of substrate holder 28 has a lot of flat areas on which neither recessed parts nor hole parts are formed.

Note that the configuration of the first embodiment described above can be changed as needed. For example, in the first embodiment described above, as illustrated in FIG. 3a, cutouts 28a are formed on the +X side of substrate holder 28 and the parts of holding pads 84a of substrate carry-out bearer devices 82a are accommodated in cutouts 28a. However, the configuration is not limited thereto, and for example, substrate carry-out bearer devices 82a are omitted, and the pair of substrate carry-in bearer devices 82b disposed on the X side of substrate holder 28 may assist the substrate carry-out operation.

That is, in the exchange operation of substrate P on substrate holder 28 related to a present modified example, first of all, substrate carry-in bearer devices 82b grip substrate P and move substrate P in the +X direction in a noncontact manner on substrate holder 28, and causes substrate P to offset (overhang) from substrate holder 28 (see FIGS. 11a and 11b), then the jet of the pressurized gas from substrate holder 28 is stopped, and substrate P is placed onto substrate holder 28 again. Substrate carry-in bearer devices 82b release the adsorption of substrate P and are slightly lowered, and are moved in the −X direction again, and then are raised higher and adsorb and grip a new substrate P, from below, that stands-by in a space above substrate holder 28. In substrate carry-out device 70, substrate carry-out hand 72 adsorbs and grips the end vicinity part of substrate P placed offset on substrate holder 28 (see FIGS. 12a and 12b). After that, the pressurized gas is jetted from substrate holder 28 and balance beams 52, and substrate P except for the part gripped by substrate carry-out hand 72 is carried out to the port section in a noncontact state. In this manner, according to the present modified example, since substrate carry-out bearer devices 82a are omitted (the assist device for substrate carry-in and an assist device for substrate carry-out are commonalized), the structure becomes simple and the cost can be reduced.

Further, alignment pad 78 may be capable of rotating substrate P in the θz direction, for example, by a 90 degree angle. In this case, in the port section, the orientation of substrate P can be changed (the longitudinal direction can be parallel to the X-axis or the Y-axis) using alignment pad 78, and therefore, for example, substrate P that is carried from external carrier device 100, in a state where the longitudinal direction is parallel to the X-axis (the laterally long state), is rotated by, for example, a 90 degree angle in the port section, thereby causing substrate P to come into a state where the longitudinal direction is parallel to the Y-axis (a longitudinally long state). Consequently, when substrate P is carried into substrate stage device 20, carrying in substrate P in the laterally long state or carrying in substrate P in the longitudinally long state can be arbitrarily selected. Further, it is also possible that substrate P that is carried in the longitudinally long state to the port section by external carrier device 100 is rotated by, for example, a 90 degree angle to be in the laterally long state in the port section. In this case, the finger parts of the robot hand of external carrier device 100 can be shortened.

Second Embodiment

Next, a liquid crystal exposure apparatus related to the second embodiment will be described, using FIGS. 23 to 25. Since the configuration of the liquid crystal exposure apparatus related to the second embodiment is the same as that in the first embodiment described above, except that the configuration and the operation of a part of the substrate exchange device are different, only the different points will be described below, and with regard to elements that have the same configurations and functions as those in the first embodiment described above, the same reference signs as those in the first embodiment described above will be used and the description thereof will be omitted.

Figure 23:
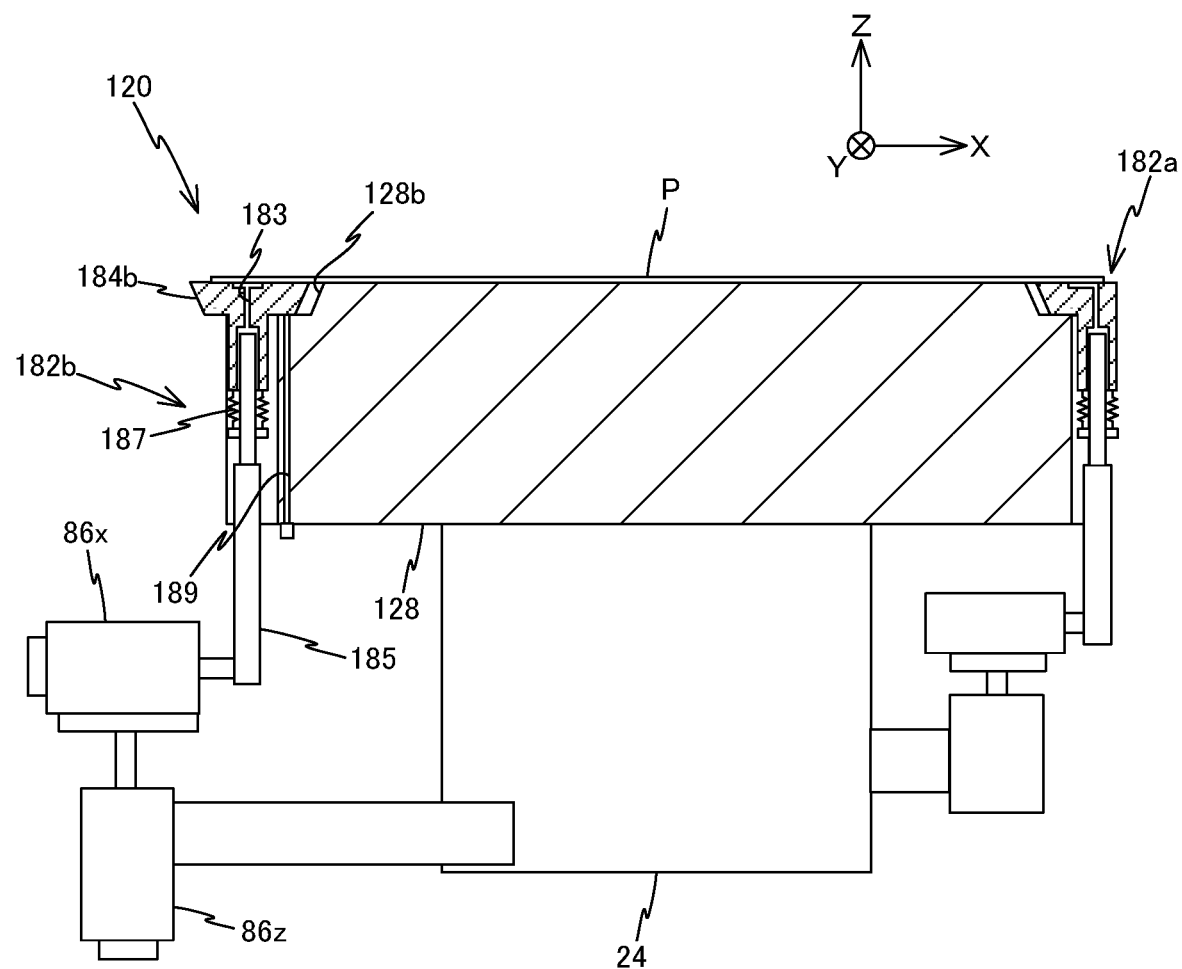
FIG. 23 is a view showing a configuration of a substrate carry-in bearer device that a substrate exchange device related to a second embodiment has.
Figure 24:
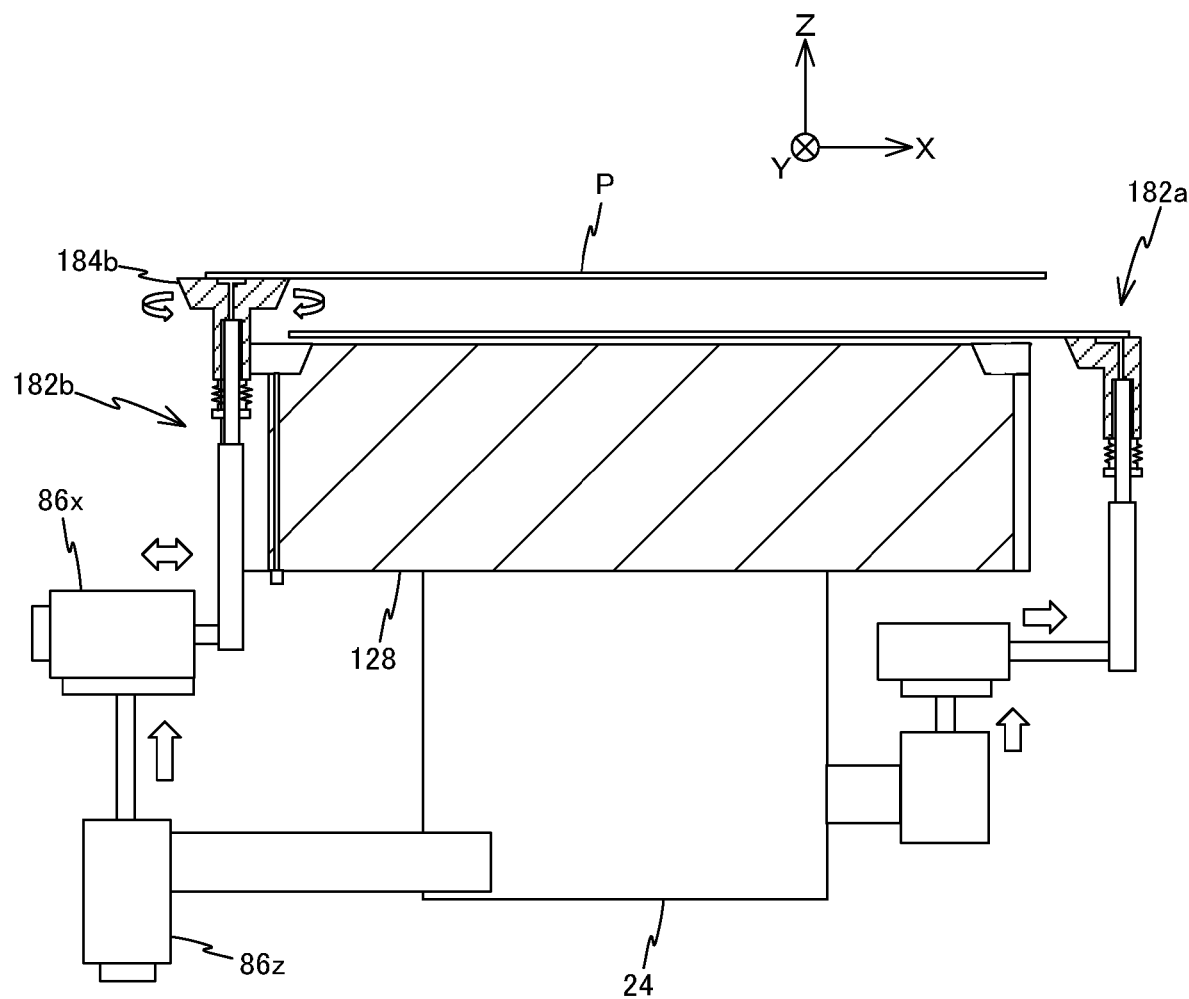
FIG. 24 is a view for explaining an operation of the substrate carry-in bearer device in FIG. 23.

In the first embodiment described above, as illustrated in FIGS. 3a and 3b, in substrate carry-in bearer device 82b, a part of holding pad 84b is accommodated in cutout 28b formed at substrate holder 28, and the support column member that vertically moves and supports holding pad 84b is disposed on an outer side (the −X side) of substrate holder 28, whereas in the second embodiment, as illustrated in FIG. 23, in a substrate carry-in bearer device 182b, a support column member 185 that supports a cap 184b serving as an adsorption pad and vertically moves is disposed (overlapping a substrate holder 128 in a planar view) inside a cutout (or a through-hole) formed at substrate holder 128 in a planar view, which is different from the first embodiment. Note that, although the position of X actuator 86x and the position of Z actuator 86z are reversed to those in the first embodiment described above, the operations of theses actuators are the same as those in the first embodiment described above.

In the present embodiment, support column member 185 has a cylindrical shape and the adsorption pad that is referred to as cap 184b for substrate adsorption is attached to the upper tip side of support column member 185. Cap 184b is formed to have a T-like XZ cross-sectional shape, and when substrate P is placed on substrate holder 128, the upper half part of cap 184b is accommodated in a recessed section 128b (a counterbore hole) having a tapered hole shape formed on the surface of substrate holder 128. The thickness of the upper half part of cap 184b is set so that the upper surface of cap 184b and the upper surface of substrate holder 128 are at the same height position in a state where the upper half part is accommodated in recessed section 128b.

Further, a recessed part is formed at the lower half part of cap 184b, and support column member 185 is inserted in the recessed part. Cap 184b and support column member 185 are mechanically separated, and a gap of a degree, which allows for the rotation of cap 184b in the θz direction around support column member 185 serving as an axis, is formed between cap 184b and support column member 185. At support column member 185, a duct line (not illustrated) is formed. At the upper half part of cap 184b, a throttle hole 183 that communicates with the duct line is formed. In substrate carry-in bearer device 182b, a vacuum suction force is supplied to cap 184b via the duct line of support column member 185 described above and throttle hole 183. On the surface of cap 184b, a shallow adsorption groove (or a small adsorption hole) for vacuum adsorption is formed, and when substrate P is placed on substrate holder 128, cap 184b can suppress the bending and the lift of substrate P and maintain the flatness.

Furthermore, a duct line 189 having one end that is open to recessed section 128b is formed at substrate holder 128. Substrate holder 128 holds cap 184b in recessed section 128b by vacuum adsorption via duct line 189, and can reliably position cap 184b in recessed section 128b. Note that duct line 189 may be branched and the branched ducts may be passed through the inside of cap 184b and may be open to the surface of cap 184b. In this case, it is possible to cause substrate P to follow the upper surface of cap 184b by vacuum suction of substrate P placed on substrate holder 128.

Further, for example, a tension coil spring 187 is disposed between cap 184b and support column member 185, and cap 184b is positioned by pressing cap 184b against recessed section 128b of substrate holder 128 with a strong force generated by forces attracting mutually.

Also in the present second embodiment, on the carry-in of substrate P, substrate carry-in bearer devices 182b adsorbs and grips the end part on the −X side of substrate P in a space above substrate holder 128, which is similar to the first embodiment described above. As illustrated in FIG. 24, in substrate carry-in bearer device 182b, when support column member 185 is driven upward by Z actuator 86z, cap 184b is raised integrally with support column member 185 and adsorbs and grips the lower surface of substrate P that stands-by in the space above substrate holder 128. Cap 184 moving in the −Z direction due to the free fall of substrate P when substrate P is placed onto substrate holder 128, and fine alignment of substrate P being performed using substrate carry-in bearer device 182b before substrate holder 128 adsorbs and holds substrate P are the same as the first embodiment described above. Since cap 184b is rotatable in the θz direction with respect to support column member 185, there is no risk that the hold by adsorption of substrate P by cap 184b is canceled on the fine alignment operation described above. Note that the fine displacement in the Y-direction of cap 184b occurring when substrate P is moved in the θz direction can be addressed by fitting backlash between cap 184b and support column member 185, or by deformation of support column member 185.

Figure 25:
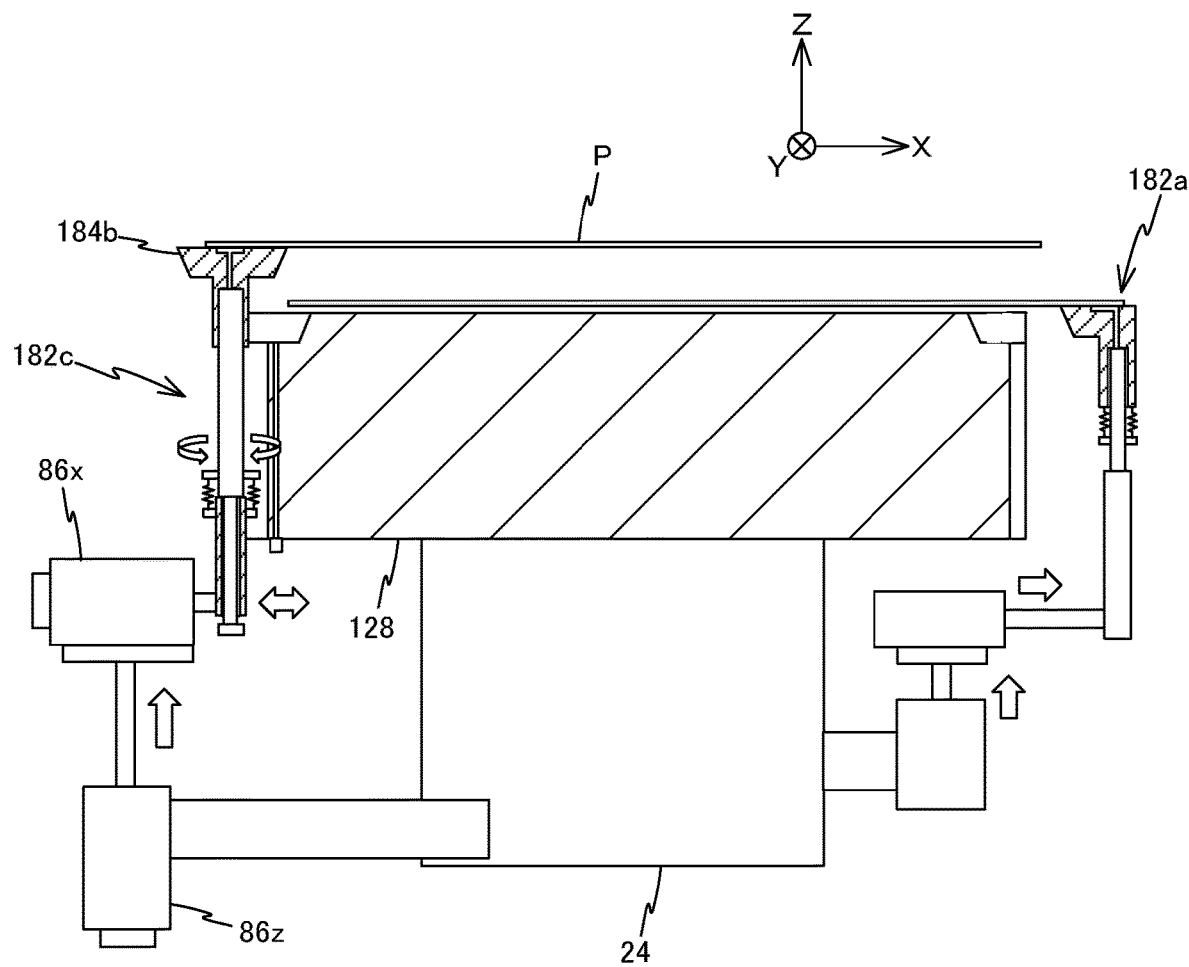
FIG. 25 is a view showing a modified example of the substrate carry-in bearer device in FIG. 23.

Note that, like a substrate carry-in bearer device 182c related to a modified example as illustrated in FIG. 25, when substrate P is rotated together with cap 184b in the ez direction by the X-driving of support column member 185, the rotation location may be the midsection of support column member 185 that has a double-duct structure beforehand and is configured rotatable. With this configuration, substrate P and cap 184b can be rotated with a small frictional force without being affected by the adsorption force.

Here, in the present second embodiment, cap 184b and support column member 185 are mechanically separated, in order to accurately position the Z-position of cap 184b regardless of the Z positioning accuracy of Z actuator 86z when substrate P is placed on substrate holder 128. In substrate carry-in bearer device 182c as illustrated in FIG. 25, cap 184b and support column member 185 may be integrally structured, and an axis may be made longer than an outer cylinder to have a gap in between at the double-duct section in the lower part, and the Z-position positioning operation described previously may be performed.

As is described above, in the present second embodiment, substrate carry-in bearer device 182b is separated into cap 184b and support column member 185, and cap 184b is embedded to be at the same height as the surface of substrate holder 128, and therefore, deterioration in the flatness of substrate holder 128 can be suppressed in spite that recessed section 128b is formed on the upper surface of substrate holder 128. Further, the pair of substrate carry-in bearer devices 182b are driven in opposite directions in the X-axis direction, and thereby the θz rotation of substrate P can be performed easily.

Further, there is a risk that by the gap, necessary for performing alignment of substrate P by X-driving substrate carry-in bearer device 182b, between the outer diameter of cap 184b and the outer diameter of recessed section 128b of substrate holder 128, the difference in reflection quantity of the exposure beam reflection may be produced, which may result in generating uneven transfer. However, since recessed section 128b is formed into a tapered hole shape, the exposure beam perpendicularly entering the surface of substrate holder 128 does not reach the bottom part of recessed section 128b. Consequently, the change of the reflection quantity (absorption of the beam) can be suppressed.

Note that although only substrate carry-in bearer device 182b is described, the configuration of a substrate carry-out bearer device 182a is similar to that of substrate carry-in bearer device 182b, except that a cap 184a is configured non-rotatable in the θZ direction because it is not necessary to rotate substrate P in the θZ direction on the substrate carry-in, and therefore, the description of substrate carry-out bearer device 182a will be omitted.

Third Embodiment

Next, a liquid crystal exposure apparatus related to the third embodiment will be described using FIGS. 26 to 29b. Since the configuration of the liquid crystal exposure apparatus related to the third embodiment is the same as that in the first embodiment described above, except that the configuration and the operation of a part of the substrate exchange device are different, only the different points will be described below, and with regard to elements that have the same configurations and functions as those in the first embodiment described above, the same reference signs as those in the first embodiment described above will be used and the description thereof will be omitted.

Substrate exchange device 40 of the first embodiment described above (see the drawings such as FIGS. 1 and 2) slightly levitates substrate P on substrate holder 28 and slides and carries out substrate P, and almost simultaneously, causes substrate carry-in hand 62 supporting a new substrate P that is standing-by in a space above substrate holder 28 to leave, and immediately causes the new substrate P to fall freely to be placed onto substrate holder 28, and therefore the period of time in which the surface of substrate holder 28 is empty and exposed to the atmosphere is extremely short. Further, a device (e.g. a lift pin device or the like) for receiving substrate P from substrate carry-in device 60, or a member (a so-called a substrate tray) on which substrate P is placed when carrying substrate P is not used, and therefore the possibility of dust generation and adhesion of dust on substrate holder 28 caused by the dust generation is also low. However, it is also predictable that substrate P is carried into substrate holder 28 in a state where dust adheres on the back surface of substrate P. A substrate exchange device 240 related to the present third embodiment removes dust on the back surface of substrate P before carrying in substrate P to substrate holder 28, which is different from the first embodiment described above.

Figure 26:
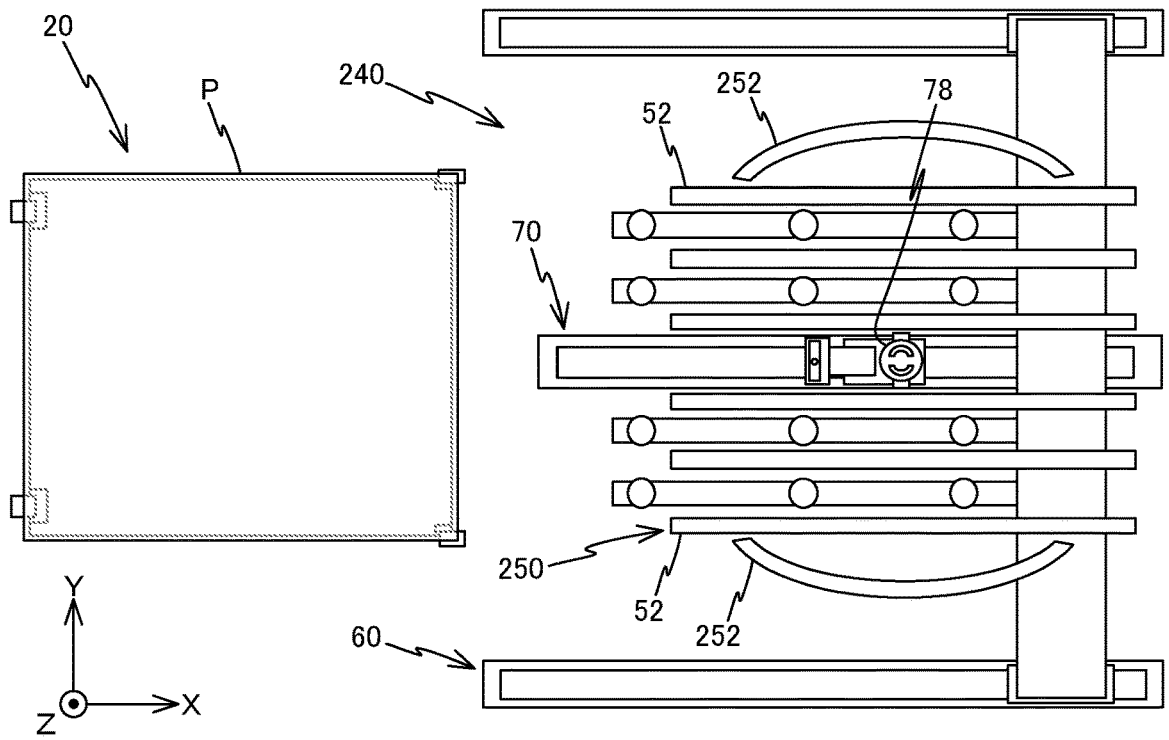
FIG. 26 is a plan view of a substrate exchange device related to a third embodiment.

As illustrated in FIG. 26, in substrate exchange device 240 of the third embodiment, on each of the +Y side and the −Y side of the plurality of balance beams 52, an air bearing 252 having a circular arc shape in a planar view (hereinafter, referred to as an R guide 252) is disposed. The width of R guide 252 is equal to that of balance beam 52. R guide 252 is made, for example, by bending a bar-like hollow member into a circular arc shape by the bending processing and then by forming a plurality of minute holes thereon. The height position of the upper surface of R guide 252 is set slightly lower than the height position of the upper surfaces of the plurality of balance beams 52. A pair of R guides 252 are capable of moving in the X-axis direction integrally with the plurality of balance beams 52. Further, as shown by broken lines in FIG. 27, in a state where substrate P is placed on the plurality of balance beams 52, the end vicinity part on the +Y side of substrate P is supported by the end vicinity part of R guide 252 on the +Y side, while the end vicinity part on the −Y side of substrate P is supported by the end vicinity part of R guide 252 on the −Y side.

Figure 27:
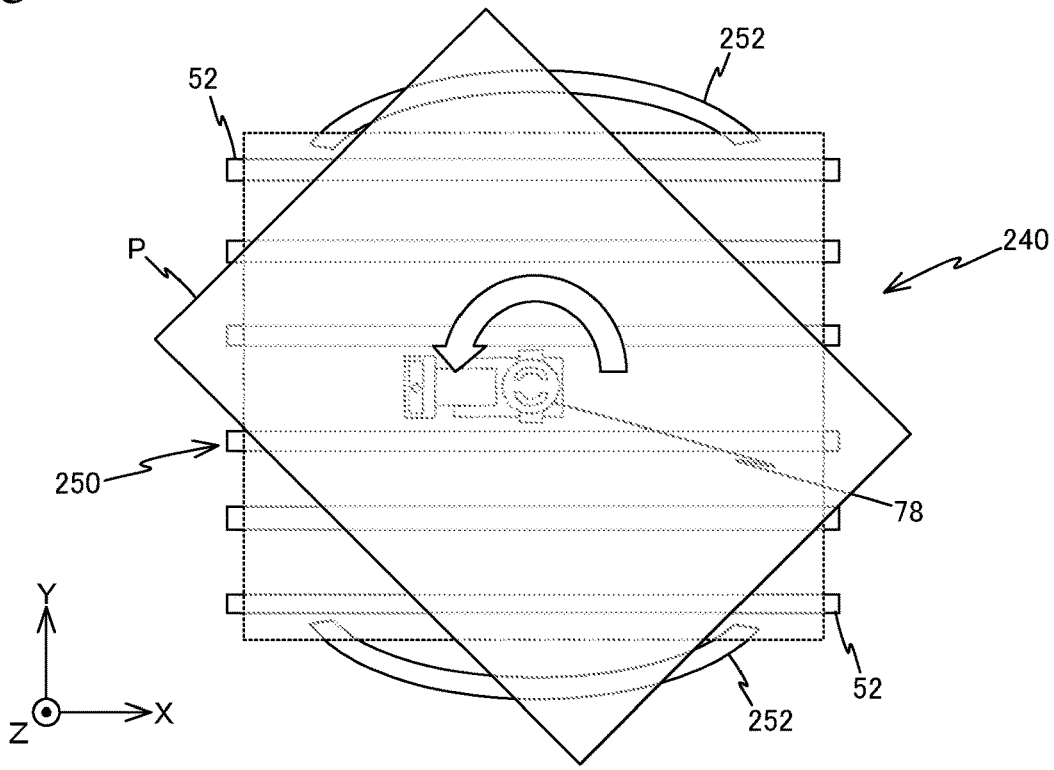
FIG. 27 is a view for explaining an operation of a substrate in the substrate exchange device in FIG. 26.

In substrate exchange device 240, as illustrated in FIG. 27, while substrate P is levitated by exhausting the pressurized gas from the plurality of balance beams 52 and the pair of R guides 252, substrate P is rotated by alignment pad 78, and thereby allowing substrate P to be rotated by, for example, a 90 degree angle or more in the θZ direction with low friction without the four corners hanging down due to the self-weight, by the noncontact support of the pair of R guides 252.

On this operation, the pressurized gas is blown from balance beams 52 to the entire area of the back surface of substrate P thoroughly, except for the center part adsorbed and held by alignment pad 78. Accordingly, dust adhering on the back surface of substrate P can be blown off.

Figure 28:
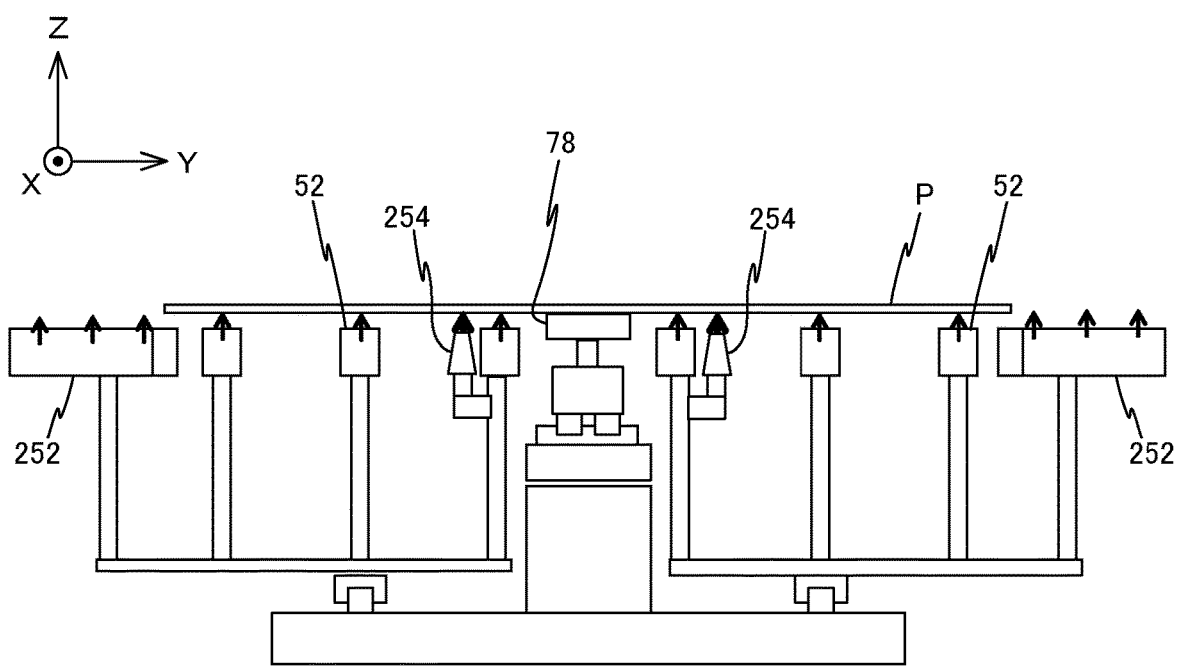
FIG. 28 is a view showing a modified example of the substrate exchange device in FIG. 26.
Figure 29A:
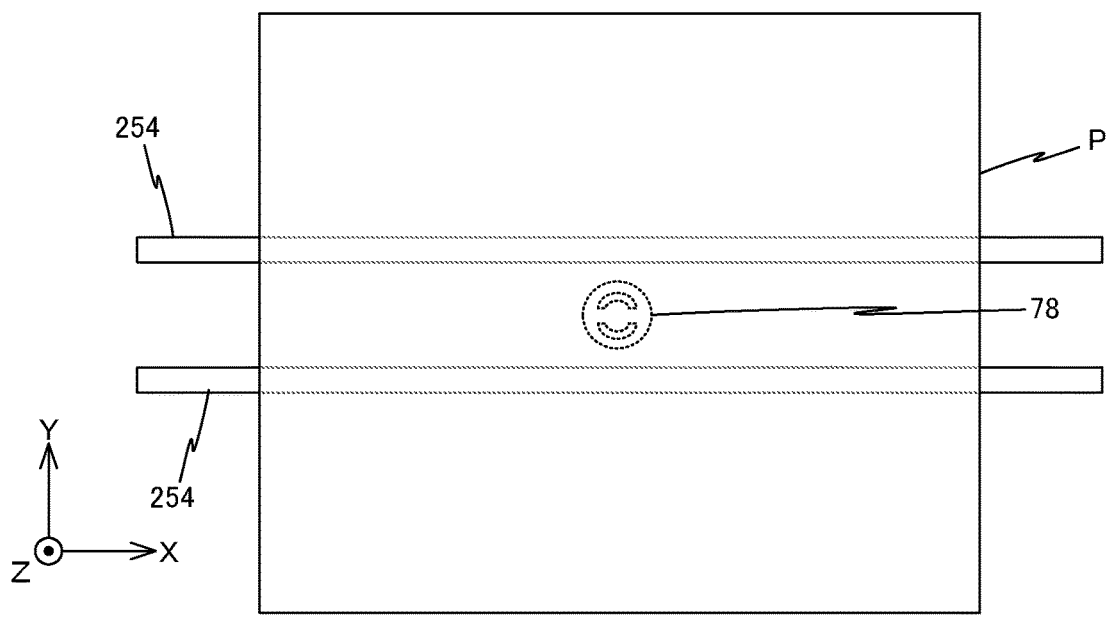
FIGS. 29a and 29b are views (No. 1 and No. 2) for explaining operations of the substrate exchange device in the third embodiment.
Figure 29B:
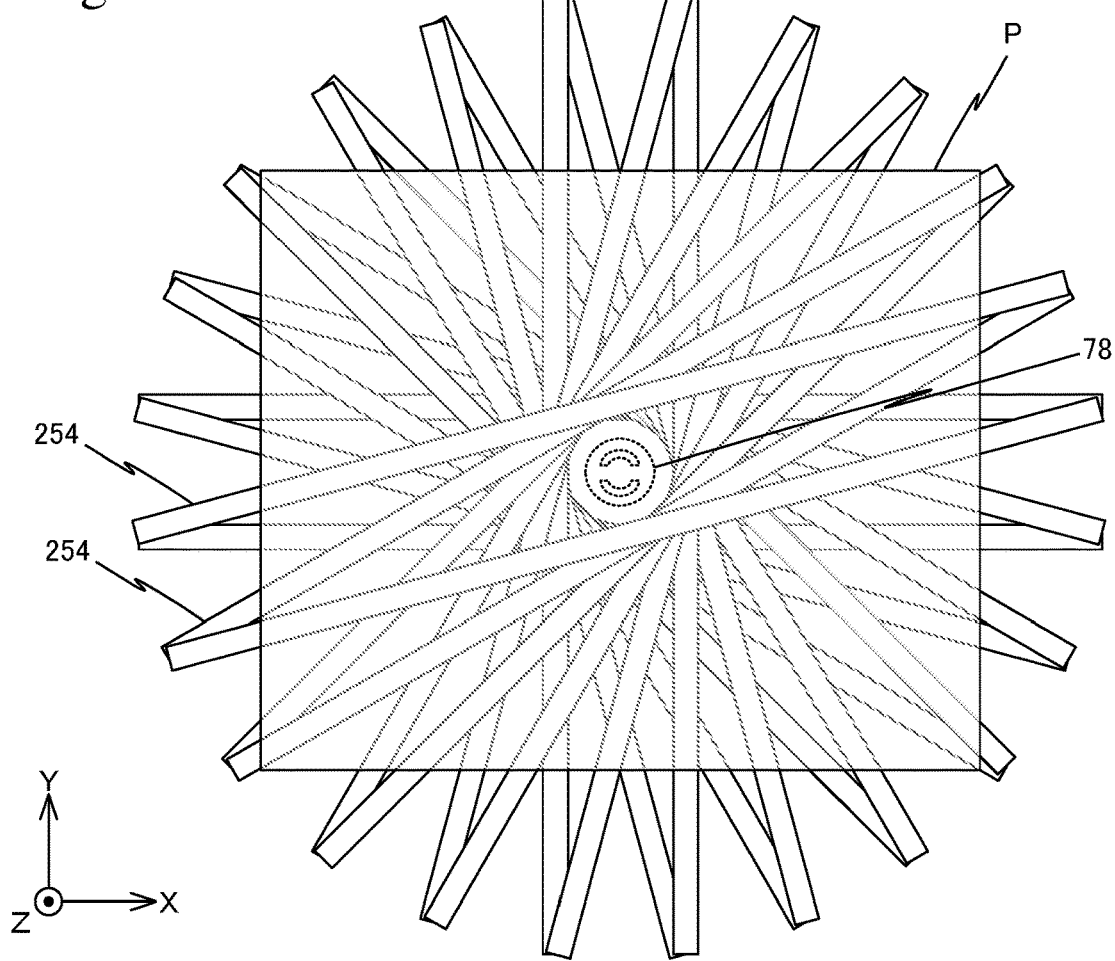

Note that, as the cleaning of the back surface of substrate P by the pressurized gas, a pair of linear nozzles 254 that blow the strong jet exclusive for the cleaning may be prepared, as illustrated in FIG. 28, separately from the air exhaust of a fewer flowing rate and flowing velocity from the plurality of balance beams 52, or for example, a pair of linear brushes (not illustrated) may be prepared, and the back surface of substrate P may be directly swept away. FIGS. 29a and 29b typically illustrate the situation in which substrate P is rotated in the θZ direction by, for example, a 180 degree angle, while cleaning the back surface of substrate P with linear high pressure air or brushes. Note that a reference sign 254 in FIGS. 29a and 29b shows the range in which the pressurized air is jetted from the pair of nozzles 254 (see FIG. 28) or the pair of brushes (not illustrated).

FIG. 29a shows an initial state, and FIG. 29b shows a trajectory of the cleaning when substrate P is rotated by, for example, a 180 degree angle. Note that, in order to facilitate the understanding, FIG. 29b shows a figure that the pair of nozzles 254 (see FIG. 28) or the pair of brushes are rotated by every 15 degree angle, instead of substrate P being rotated. However, actually the rotation of the pair of nozzles 254 or the pair of brushes is continuously performed, which shows that the almost entire surface of substrate P can be cleaned except for the center part adsorbed by alignment pad 78.

Further, in the present third embodiment, since the air can be blown to the entire back surface of substrate P by rotating substrate P by, for example, a 90 degree angle or more on the plurality of balance beams 52, the temperature of substrate P can be adjusted to a predetermined uniform temperature by finely controlling the temperature of exhausted air from the air bearings of balance beams 52 and linear nozzles 254. As a result, it becomes possible to suppress the thermal shrinkage of substrate P during the stand-by in the port section and perform the highly accurate exposure.

Note that the configuration in each of the first to the third embodiments (and the modified examples thereof) described so far can be changed as needed. For example, although in each of the embodiments described above, the two points separated in the Y-axis direction of substrate P are held using the respective holding pads 84b of the pair of substrate carry-in bearer devices 82b disposed separated in the Y-axis direction, the held points of substrate P are not limited thereto, and one point of substrate P may be held by one holding pad 84b. In this case, in order to secure the contact area between holding pad 84b and substrate P, the holding surface of holding pad 84b should be formed into a shape extending in the Y-axis direction.

Further, although in each of the embodiments described above, substrate carry-in bearer device 82b is configured to constrain (hold) the −X direction side end part of substrate P, the constrained (held) part is not limited thereto. For example, substrate carry-in bearer device 82b may be configured to constrain (hold) the +Y direction side end part or the −Y direction side end part of substrate P, or the corner part between the −X direction side end part and the +Y direction side end part, or the corner part between the −X direction side end part and the −Y direction side end part. The part (the location) of substrate P constrained by substrate carry-in bearer device 82b may be any one of the end parts described above or the corner parts described above, or any combination thereof, as far as the part (the location) can be set not to obstruct the operations of substrate carry-out bearer devices 82a, substrate carry-out device 70 and substrate carry-in device 60.

Further, although in each of the embodiments described above, the respective holding pads 84b of the pair of substrate carry-in bearer devices 82b are accommodated in the corresponding cutouts 28b, this is not intended to be limiting, and for example, a part, sticking out from the end vicinity part of substrate holder 28, of substrate P may be adsorbed and held beforehand. In this case, cutouts 28b need not be formed in substrate holder 28. Note that, since an area of the sticking-out part is small, the holding surface of holding pad 84b should be formed into a shape extending in the Y-axis direction in order to secure the contact area between holding pad 84b and substrate P. Further, when substrate P is placed onto the upper surface of substrate holder 28, holding pad 84b may be inserted between the back surface of substrate P and the upper surface of substrate holder 28, and then holding pad 84b may pulled out. In this case as well, cutouts 28b need not be formed in substrate holder 28. On this operation, it is favorable that a part of substrate P is adsorbed and held to prevent substrate P from being moved when holding pad 84b is pulled out.

Further, although in each of the embodiments described above, substrate P to be carried out is made into an offset state (a state where a part of substrate P protrudes from substrate holder 28) by substrate carry-out bearer devices 82a, this is not intended to be limiting, and substrate holder 28 may be tilted around the Y-axis to incline the upper surface of substrate holder 28, and substrate P may be made into the offset state by the self-weight. Further, while substrate carry-out device 70 holds the end vicinity part that is offset of substrate P and carries out substrate P, substrate carry-out device 70 may adsorb and hold the part sticking out from the end vicinity part of substrate holder 28 beforehand. Further, the operation of making substrate P into the offset state by substrate carry-out bearer devices 82a may be performed in the midst of substrate holder 28 moving to the substrate exchange position (in parallel with the movement of substrate holder 28).

Further, although in each of the embodiments described above, substrate carry-in device 60 carries substrate P using substrate carry-in hand 62 that supports substrate P from below in the gravity direction, the configuration of a carrier device for carry-in is not limited thereto as far as the free fall of substrate P can be prevented on the carriage, and substrate P may be carried while being supported in a suspended manner from above in the gravity direction, for example, using a Bernoulli chuck known to public or the like. In this case, by releasing the support in a suspended manner of substrate P by the Bernoulli chuck, substrate P is made to fall due to the self-weight.

Note that, also in the case of using this Bernoulli chuck method, a certain carrier assist mechanism is needed that takes place of substrate carry-in bearer devices 82b in each of the embodiments described above, in order to constrain the position of substrate P within the XY plane in a space above substrate holder 28. As this carrier assist mechanism, for example, a wall member for physically limiting the side surface of substrate P may be configured on the periphery of the Bernoulli chuck. Or, a mechanism that blows air for position constraint within the XY plane against the side surface of substrate P may be provided at the Bernoulli chuck.

Further, in the operation sequence on the substrate exchange in each of the embodiments described above, as illustrated in FIGS. 14 to 16, the description has been made assuming that the driving of substrate carry-out hand 72 in the +X direction (a carry-out operation of substrate $P_1$ from substrate holder 28 by substrate carry-out hand 72, which is referred to as a "pulling-out operation" of substrate carry-out hand 72) is started, and then the driving of substrate carry-in hand 62 in the +X direction (a withdrawal operation from below substrate $P_2$ of substrate carry-in hand 62, in other words, a carry-in operation of substrate $P_2$ to substrate holder 28 by substrate carry-in hand 62, which is referred to as "pulling-out operation" of substrate carry-in hand 62) is started. However, the timing for these pulling-out operations is not limited thereto. As far as the operation timing is controlled so that substrate $P_2$ that falls due to the self-weight entailed by the pulling-out operation of substrate carry-in hand 62 does not come into contact with both hands 62 and 72 and substrate $P_1$, the puling-out operations of both hands 62 and 72 may be started in any order or the puling-out operations may be started simultaneously.

Further, although in each of the embodiments described above, substrate holder 28 is configured to adsorb and hold substrate P, the configuration is not limited thereto, and for example, substrate P may be held in a noncontact state.

Further, although in each of the embodiments described above, substrate carry-in bearer devices 82b for constraining the position of substrate P within the XY plane in a space above substrate holder 28 are equipped in substrate holder 28 (substrate stage device 20), this is not intended to be limiting, and for example, substrate carry-in device 60 may have substrate carry-in bearer devices 82b. Or, above the substrate exchange position, for example, substrate carry-in bearer devices 82b may be supported in a suspended manner by a frame member that configures a chamber for accommodating substrate stage device 20 and the like.

Further, although in each of the embodiments described above, after the robot hand of external carrier device 100 delivers substrate P to be carried in, to the port section, substrate carry-in device 60 carries substrate P to a space above substrate holder 28. However, this is not intended to be limiting, and the robot hand of external carrier device 100 carries substrate P to be carried in, to a space above substrate holder 28 and delivers substrate P directly to substrate carry-in bearer devices 82b.

Further, a light source used in illumination system 12 and the wavelength of illumination light IL irradiated from the light source are not particularly limited, and for example, may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm).

Further, although in each of the embodiments described above, an unmagnification system is used as projection optical system 16, the projection optical system is not limited thereto, and a reduction system or a magnifying system may be used.

Further, the use of the exposure apparatus is not limited to the exposure apparatus used for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as a wafer, a ceramic substrate, a film member, or a mask blank.

Further in the case when the exposure target object is a substrate for flat-panel display, the thickness of the substrate is not particularly limited, and for example, a film-like member (a sheet-like member that is flexible) is also included. Note that the exposure apparatus of the present embodiments is especially effective in the case when a substrate having a side or a diagonal line with a length of 500 mm or greater is the exposure target object.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in each of the embodiments described above and a device pattern is formed on the glass substrate, and therefore, the devices with a high integration degree can be manufactured with high productivity.

INDUSTRIAL APPLICABILITY

As is described so far, the object carrying method and the object carrier device of the present invention are suitable for carrying objects. Further, the exposure apparatus of the present invention is suitable for exposing objects. Further, the manufacturing method of flat-panel display is suitable for manufacturing flat-panel displays. Further, the device manufacturing method of the present invention is suitable for manufacturing microdevices.

REFERENCE SIGNS LIST

10 . . . liquid crystal exposure apparatus,
20 . . . substrate stage device,
40 . . . substrate exchange device,
50 . . . beam unit,
60 . . . substrate carry-in device,
70 . . . substrate carry-out device,
80 . . . substrate assist device,
82a . . . substrate carry-out bearer devices,
82b . . . substrate carry-in bearer devices,
P . . . substrate.

The invention claimed is:

1. An object carrier device that carries an object to a support section having a support surface, the device comprising:
a first holding section that holds a part of the object located above the support surface;
a second holding section that is located above the support surface and holds an other part of the object held by the first holding section;
a third holding section that holds a part of another object on the support surface;
a carry-out device that carries out the another object held by the third holding section from the support surface; and
a controller that controls and drives the first holding section and the second holding section so that the object is supported on the support surface from which the another object has been carried out, wherein
the first holding section and the second holding section hold the object above the support surface supporting the another object, and
when the another object held by the third holding section is carried out from the support surface by the carry-out device, the controller moves one of the first holding section and the second holding section relative to the other of the first holding section and the second holding section so that the second holding section that has released the hold of the other part of the object is withdrawn from above the support surface and below the object, and moves downward the first holding section holding the object.

2. The object carrier device according to claim 1, wherein the controller controls and drives downward the first holding section on the basis of a fall of the other part of the object.

3. The object carrier device according to claim 1, wherein the second holding section holds the other part of the object so that the other part can be held by levitation, and
the controller drives the second holding section so that the second holding section is withdrawn from the other part of the object in a state in which the other part of the object is held by levitation.

4. The object carrier device according to claim 1, wherein the controller drives the first holding section to prevent the object from deforming due to a gas interposing between the object and the support surface.

5. The object carrier device according to claim 4, wherein the support section has a supply hole that supplies a gas from the support surface to the object, and a suction hole that suctions the gas between the support surface and the object, and
a quantity of the gas between the object supported by the support section and the support surface is changed.

6. The object carrier device according to claim 1, further comprising:
a drive device that drives the support section, wherein
the drive device is movable along a plane parallel to the support surface, and
the first holding section is movable along the plane in a predetermined positional relationship with the support section.

7. The object carrier device according to claim 6, wherein the controller drives the first holding section when the support section is driven by the drive device.

8. The object carrier device according to claim 7, wherein the first holding section is provided at the support section.

9. The object carrier device according to claim 6, wherein the drive device drives the support section from one of a position where the object supported on the support surface is processed and another position where the object is supported on the support surface to the other of the position and the another position.

10. The object carrier device according to claim 1, wherein
the first holding section moves downward together with the object in a state of constraining a position of the object in a direction parallel to a two-dimensional plane that intersects a vertical direction.

11. The object carrier device according to claim 10, wherein
the first holding section performs position adjustment of the object with respect to the support surface in the direction parallel to the two-dimensional plane that intersects the vertical direction.

12. The object carrier device according to claim 11, wherein in the position adjustment, the support section supports the object in a noncontact manner by interposing a gas between the support surface and the object.

13. The object carrier device according to claim 11, wherein
the first holding section causes the support surface to support the object after performing the position adjustment.

14. The object carrier device according to claim 1, further comprising:
a carrier device that carries the second holding section to above the support surface.

15. The object carrier device according to claim 14, wherein
the controller performs control so that the carrier device causes the second holding section to withdraw from below the object, at least partially in parallel with an operation of the carry-out device carrying out the another object.

16. The object carrier device according to claim 15, wherein
the controller drives downward the first holding section holding the part of the object, at least partially in parallel with the operation of the carry-out device carrying out the another object.

17. The object carrier device according to claim 1, wherein
the support section has an accommodation section that accommodates the first holding section.

18. The object carrier device according to claim 1, wherein
the first holding section adsorbs and holds the part of the object.

19. The object carrier device according to claim 1, wherein
the first holding section holds one end side of an outer peripheral end part of the object.

20. The object carrier device according to claim 1, wherein
the controller controls and drives the first holding section downward, on the basis of a velocity of a fall of the other part of the object that moves downward due to a self-weight of the object.

21. An exposure apparatus, comprising:
the object carrier device according to claim 1; and
a pattern forming device that forms a predetermined pattern on the object supported on the support surface, using an energy beam.

22. The exposure apparatus according to claim 21, wherein
the object is a substrate used for a flat-panel display.

23. The exposure apparatus according to claim 22, wherein
the substrate has at least a side or a diagonal line with a length of 500 mm or greater.

24. A manufacturing method of a flat-panel display, comprising:
exposing the substrate using the exposure apparatus according to claim 22; and
developing the substrate that has been exposed.

25. A device manufacturing method, comprising:
exposing the object using the exposure apparatus according to claim 21; and
developing the object that has been exposed.

26. An object carrying method of carrying an object to a support section having a support surface, the method comprising:

holding a part of the object located above the support surface, with a first holding section;
holding an other part of the object held by the first holding section, with a second holding section located above the support surface;
holding a part of another object on the support surface, with a third holding section;
carrying out the another object held by the third holding section from the support surface, with a carry-out device; and
controlling and driving the first holding section and the second holding section so that the object is supported on the support surface from which the another object has been carried out, wherein
the object is held by the first holding section and the second holding section, above the support surface supporting the another object, and
when the another object held by the third holding section is carried out from the support surface by the carry-out device, one of the first holding section and the second holding section is moved relative to the other of the first holding section and the second holding section so that the second holding section that has released the hold of the other part of the object is withdrawn from above the support surface and below the object, and the first holding section holding the object is moved downward.

27. The object carrying method according to claim 26, wherein
in the controlling and driving, the first holding section is controlled and driven downward, on the basis of a fall of the other part of the object.

28. The object carrying method according to claim 26, wherein
the second holding section holds the other part of the object so that the other part can be held by levitation, and
in the controlling and driving, the second holding section is driven to be withdrawn from the other part of the object in a state where the other part of the object is held by levitation.

29. The object carrying method according to claim 26, wherein
in the controlling and driving, the first holding section is driven to prevent the object from deforming due to a gas interposing between the object and the support surface.

30. The object carrying method according to claim 29, wherein
the support section has a supply hole that supplies a gas from the support surface to the object, and a suction hole that suctions the gas between the support surface and the object, and
a quantity of the gas between the object supported by the support section and the support surface is changed.

31. The object carrying method according to claim 26, further comprising:
driving the support section using a drive device, wherein
the drive device is movable along a plane parallel to the support surface, and
the first holding section is movable along the plane in a predetermined positional relationship with the support section.

32. The object carrying method according to claim 31, wherein
in the controlling and driving, the first holding section is driven when the support section is driven by the drive device.

33. The object carrying method according to claim 32, wherein
the first holding section is provided at the support section.

34. The object carrying method according to claim 31, wherein
in the driving, the support section is driven from one of a position where the object supported on the support surface is processed and another position where the object is supported on the support surface to the other of the position and the another position.

35. The object carrying method according to claim 26, wherein
the first holding section moves downward together with the object in a state of constraining a position of the object in a direction parallel to a two-dimensional plane that intersects a vertical direction.

36. The object carrying method according to claim 35, wherein
the first holding section performs position adjustment of the object with respect to the support surface in the direction parallel to the two-dimensional plane that intersects the vertical direction.

37. The object carrying method according to claim 36, wherein
in the position adjustment, the support section supports the object in a noncontact manner by interposing a gas between the support surface and the object.

38. The object carrying method according to claim 36, wherein
the first holding section causes the support surface to support the object after performing the position adjustment.

39. The object carrying method according to claim 26, further comprising:
carrying the second holding section to above the support surface, using a carrier device.

40. The object carrying method according to claim 39, wherein
in the carrying out, the carrier device causes the second holding section to withdraw from below the object, at least partially in parallel with an operation of the carry-out device carrying out the another object.

41. The object carrying method according to claim 40, wherein
in the carrying out, the first holding section holding the part of the object is driven downward, at least partially in parallel with the operation of the carry-out device carrying out the another object.

42. The object carrying method according to claim 26, wherein
the support section has an accommodation section that accommodates the first holding section.

43. The object carrying method according to claim 26, wherein
the first holding section adsorbs and holds the part of the object.

44. The object carrying method according to claim 26, wherein
the first holding section holds one end side of an outer peripheral end part of the object.

45. The object carrying method according to claim 26, wherein
in the controlling and driving, the first holding section is controlled and driven downward on the basis of a velocity of a fall of the other part of the object that moves downward due to a self-weight of the object.

46. An exposure method, comprising:
carrying an object using the object carrying method according to claim 26; and
forming a predetermined pattern on the object supported on the support surface, using an energy beam.

47. The exposure method according to claim 46, wherein the object is a substrate used for a flat-panel display.

48. The exposure method according to claim 47, wherein the substrate has at least a side or a diagonal line with a length of 500 mm or greater.

49. A manufacturing method of a flat-panel display, comprising:
exposing the substrate using the exposure method according to claim 47; and
developing the substrate that has been exposed.

50. A device manufacturing method, comprising:
exposing the object using the exposure method according to claim 46; and
developing the object that has been exposed.

* * * * *